US012660154B2

(12) United States Patent
Lee

(10) Patent No.: US 12,660,154 B2
(45) Date of Patent: Jun. 16, 2026

(54) MICROELECTRONIC DEVICES, AND RELATED METHODS OF FORMING MICROELECTRONIC DEVICES

(71) Applicant: Micron Technology, Inc., Boise, ID (US)

(72) Inventor: Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 531 days.

(21) Appl. No.: 18/054,316

(22) Filed: Nov. 10, 2022

(65) Prior Publication Data

US 2023/0397402 A1      Dec. 7, 2023

Related U.S. Application Data

(60) Provisional application No. 63/365,765, filed on Jun. 2, 2022.

(51) Int. Cl.
*H10B 12/00* (2023.01)
*H10W 20/20* (2026.01)
*H10W 90/20* (2026.01)

(52) U.S. Cl.
CPC ............. *H10B 12/30* (2023.02); *H10B 12/03* (2023.02); *H10B 12/05* (2023.02); *H10B 12/482* (2023.02); *H10B 12/50* (2023.02); *H10W 20/20* (2026.01); *H10W 90/297* (2026.01)

(58) Field of Classification Search
CPC . H10B 12/30–488; H01L 2225/06541–06544; H01L 23/481; H10W 90/297; H10W 20/20–233
See application file for complete search history.

(56) References Cited

U.S. PATENT DOCUMENTS

| | | | | |
|---|---|---|---|---|
| 5,230,079 A | * | 7/1993 | Grondalski | ......... G06F 15/8023 712/18 |
| 5,901,099 A | | 5/1999 | Gilliam et al. | |
| 6,778,452 B2 | | 8/2004 | Beigel et al. | |
| 8,067,286 B2 | | 11/2011 | Parekh et al. | |
| 8,153,499 B2 | | 4/2012 | Or-Bach et al. | |
| 8,184,471 B2 | | 5/2012 | Woo et al. | |

(Continued)

OTHER PUBLICATIONS

Simsek-Ege et al., "Microelectronic Devices, Related Electronic Systems, and Methods of Forming Microelectronic Devices", filed May 26, 2022, U.S. Appl. No. 17/804,234, 77 pages.

(Continued)

*Primary Examiner* — Amar Movva
(74) *Attorney, Agent, or Firm* — TraskBritt

(57) ABSTRACT

A microelectronic device comprises vertical stacks of memory cells, each of the vertical stacks of memory cells comprising a vertical stack of access devices, a vertical stack of capacitors horizontally neighboring the vertical stack of access devices, and a conductive pillar structure in contact with the vertical stack of access devices. The microelectronic device further comprises transistor structures vertically overlying the vertical stacks of memory cells and comprising semiconductive material, and a protective liner material horizontally intervening between the semiconductive material and the conductive pillar structure of each of the vertical stacks of memory cells. Related methods are also described.

15 Claims, 36 Drawing Sheets

(56) References Cited

U.S. PATENT DOCUMENTS

| | | | |
|---|---|---|---|
| 8,546,188 B2 | 10/2013 | Liu et al. | |
| 8,716,116 B2 | 5/2014 | Parekh et al. | |
| 9,543,433 B2 | 1/2017 | Anathan et al. | |
| 10,366,740 B1 | 7/2019 | Kim et al. | |
| 11,848,309 B2 | 12/2023 | Simsek-Ege | |
| 2004/0092095 A1* | 5/2004 | Nguyen | H01L 21/76831 |
| | | | 257/E21.576 |
| 2011/0205802 A1* | 8/2011 | Choe | G11C 11/5642 |
| | | | 365/185.18 |
| 2012/0181602 A1* | 7/2012 | Fukuzumi | H10B 43/27 |
| | | | 257/326 |
| 2014/0347945 A1 | 11/2014 | Venkata et al. | |
| 2019/0074277 A1* | 3/2019 | Ramaswamy | H10D 88/00 |
| 2019/0244933 A1 | 8/2019 | Or-Bach et al. | |
| 2020/0066730 A1 | 2/2020 | Guo et al. | |
| 2021/0217460 A1 | 7/2021 | Montierth et al. | |
| 2022/0399308 A1 | 12/2022 | Simsek-Ege et al. | |
| 2023/0018127 A1 | 1/2023 | Gandhi et al. | |
| 2023/0207505 A1 | 6/2023 | Simsek-Ege et al. | |

OTHER PUBLICATIONS

Simsek-Ege, "Microelectronic Devices, Related Electronic Systems, and Methods of Forming Microelectronic Devices", filed May 26, 2022, U.S. Appl. No. 17/804,247, 89 pages.

Simsek-Ege, "Microelectronic Devices, Related Electronic Systems, and Methods of Forming Microelectronic Devices", filed May 26, 2022, U.S. Appl. No. 17/804,258, 98 pages.

Simsek-Ege, "Microelectronic Devices, Related Electronic Systems, and Methods of Forming Microelectronic Devices", filed May 26, 2022, U.S. Appl. No. 17/804,270, 119 pages.

* cited by examiner

MICROELECTRONIC DEVICES, AND RELATED METHODS OF FORMING MICROELECTRONIC DEVICES

CROSS-REFERENCE TO RELATED APPLICATION

This application claims the benefit under 35 U.S.C. § 119(e) of U.S. Provisional Patent Application Ser. No. 63/365,765, filed Jun. 2, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
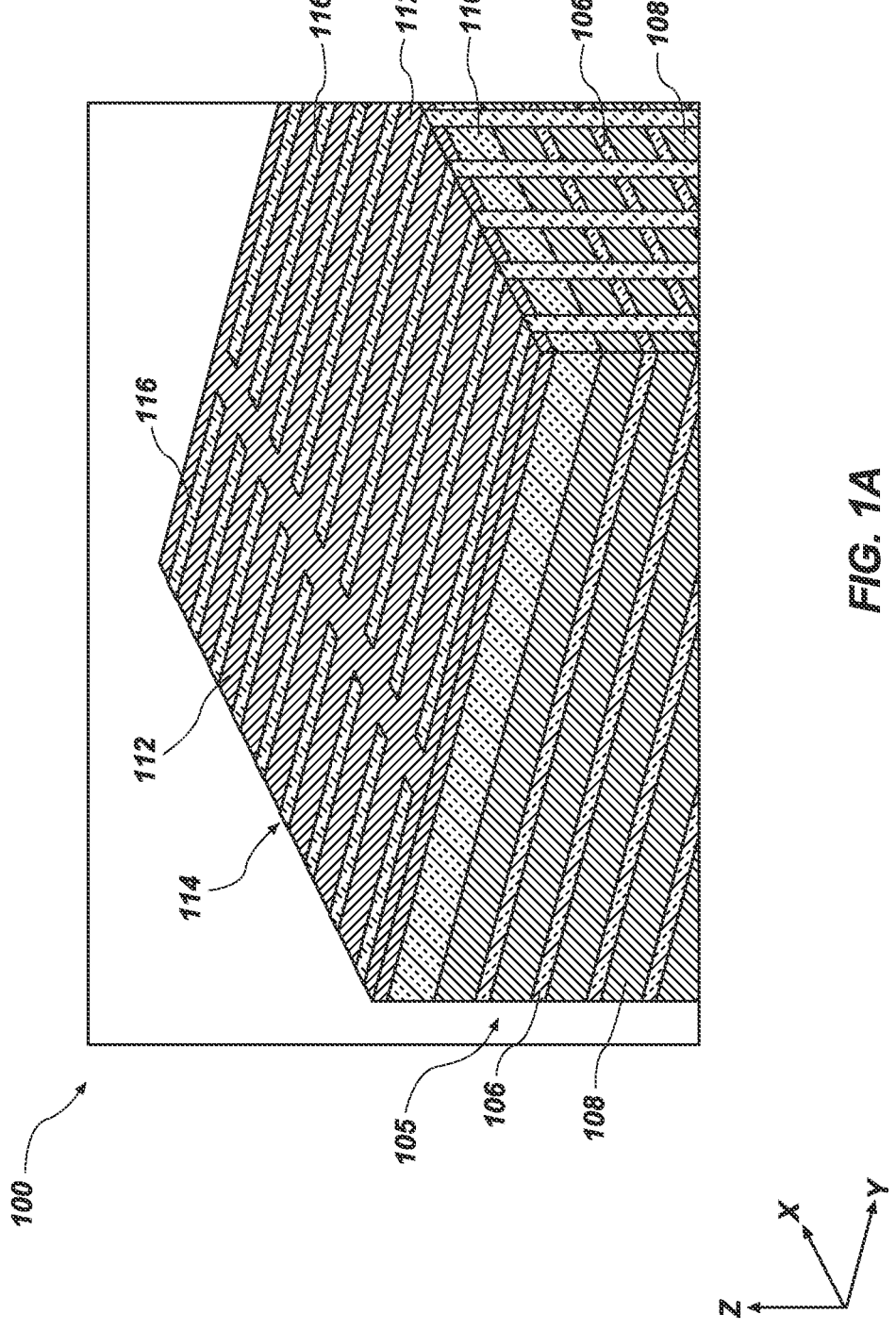
FIG. 1A through FIG. 1Y are simplified partial perspective views (FIG. 1A, FIG. 1B, FIG. 1E, FIG. 1G, FIG. 1J, FIG. 1O, FIG. 1Q, FIG. 1S, FIG. 1U, and FIG. 1W) and simplified partial cross-sectional views (FIG. 1C, FIG. 1D, FIG. 1F, FIG. 1H, FIG. 1I, FIG. 1K through FIG. 1N, FIG. 1P, FIG. 1R, FIG. 1T, FIG. 1V, FIG. 1X, and FIG. 1Y) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yInZn_zO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "in electrical communication" when used with reference to a first component or structure with respect to a second component or structure means and includes that in use and operation, the first component or structure is configured to be electrically connected to the second component. By way of non-limiting example, when a first component is in electrical communication with a second component, in use and operation electrons flow between the first component and the second component, such as responsive to receipt of an input voltage (e.g., to the first component). A first component may be in electrical communication with a second component without directly contacting the second component; or may be in electrical communication with the second component by directly contacting the second component.

According to embodiments described herein, a microelectronic device includes vertical stacks of memory cells, each vertical stack of memory cells comprising a vertical stack of access devices in contact with (e.g., and in electrical communication with, such as during use and operation) a vertical stack of storage devices. Each vertical stack of access devices is individually in contact with (e.g., in electrical communication with, such as during use and operation) with a conductive pillar structure (e.g., a local digit line) that is, in turn, in contact with (e.g., in electrical communication with, such as during use and operation) a global digit lines (such as by means of digit line contact structures and transistor structure) vertically overlying the vertical stacks of memory cells. Transistor structures (e.g., multiplexers) comprising a semiconductive material vertically overlie the vertical stacks of memory cells. A protective liner material horizontally intervenes between the semiconductive material and the conductive pillar structure. The vertical stack of storage devices are in contact with (e.g., and in electrical communication with, such as during use and operation) a conductive plate structure. An additional protective liner material horizontally intervenes between the conductive plate structure and the semiconductive material. The protective liner material and the additional protective liner material facilitate protection of the semiconductive material of the transistor structures during formation of the microelectronic device, such as during formation of the vertical stacks of access devices and the vertical stacks of storage devices. By way of non-limiting example, the protective liner material and the additional protective liner material substantially protect the semiconductive material from damage during various etching acts performing during formation of the microelectronic device. In addition, the semiconductive material may be formed on vertically uppermost portions of the microelectronic device prior to formation of the vertical stacks of memory cells. Forming the transistor structures vertically over the vertical stacks of memory cells facilitates improved electrical connection of the global digit lines to the transistor structures. Further, since the transistor structures are directly vertically over the vertical stacks of memory cells, the transistor structures may be configured to be electrically connected to the conductive pillar structures to individually electrically connect the conductive pillar structures to the global digit line during use and operation of the vertical stacks of memory cells. In some embodiments, the horizontal area of the transistor structures is at least about the same as (e.g., the same as, greater than) the horizontal area of the vertical stacks of memory cells. Since the transistor structures vertically overlie the vertical stacks of memory cells, they do not consume additional area of the microelectronic device.

Figure 1B:
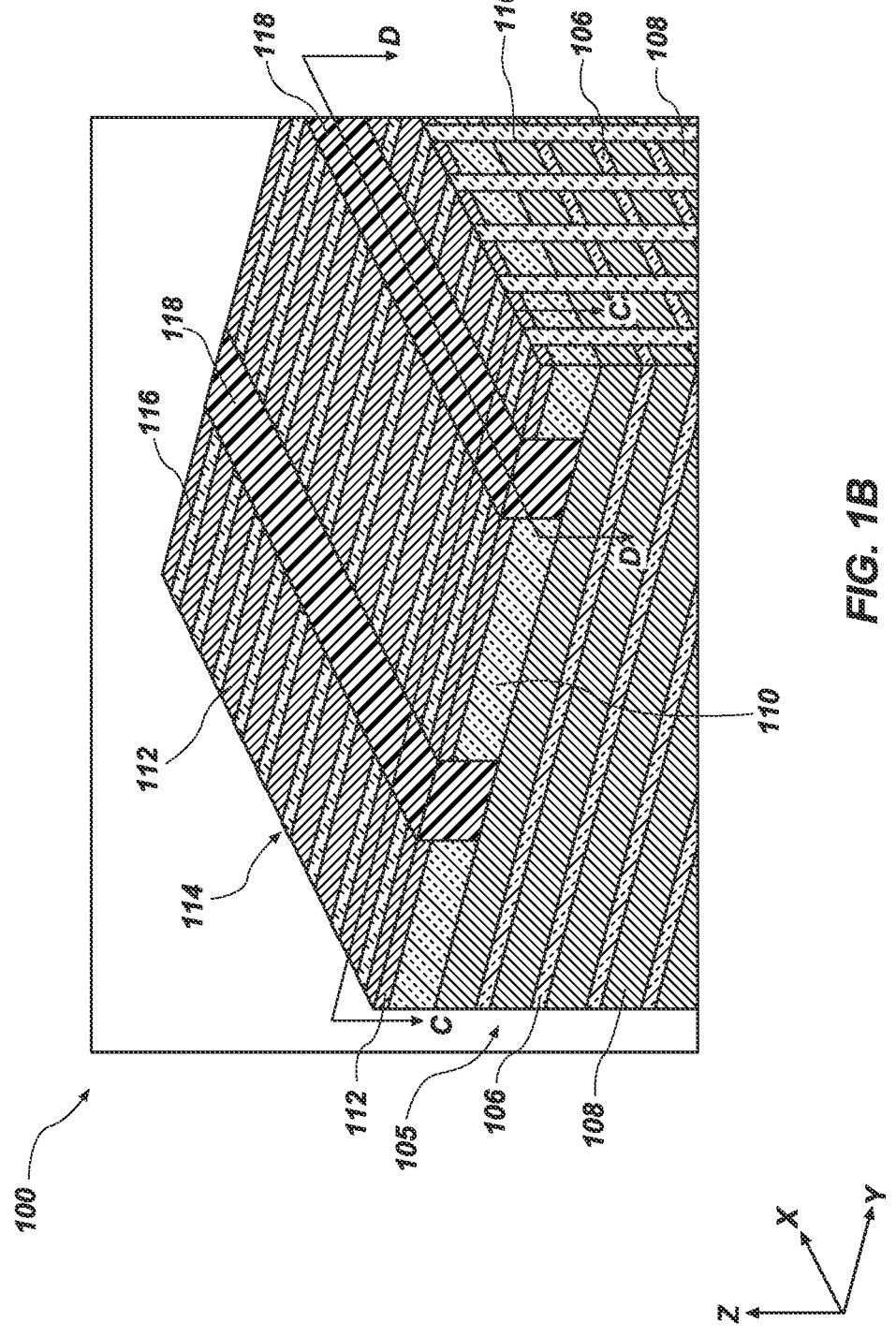
Figure 1C:
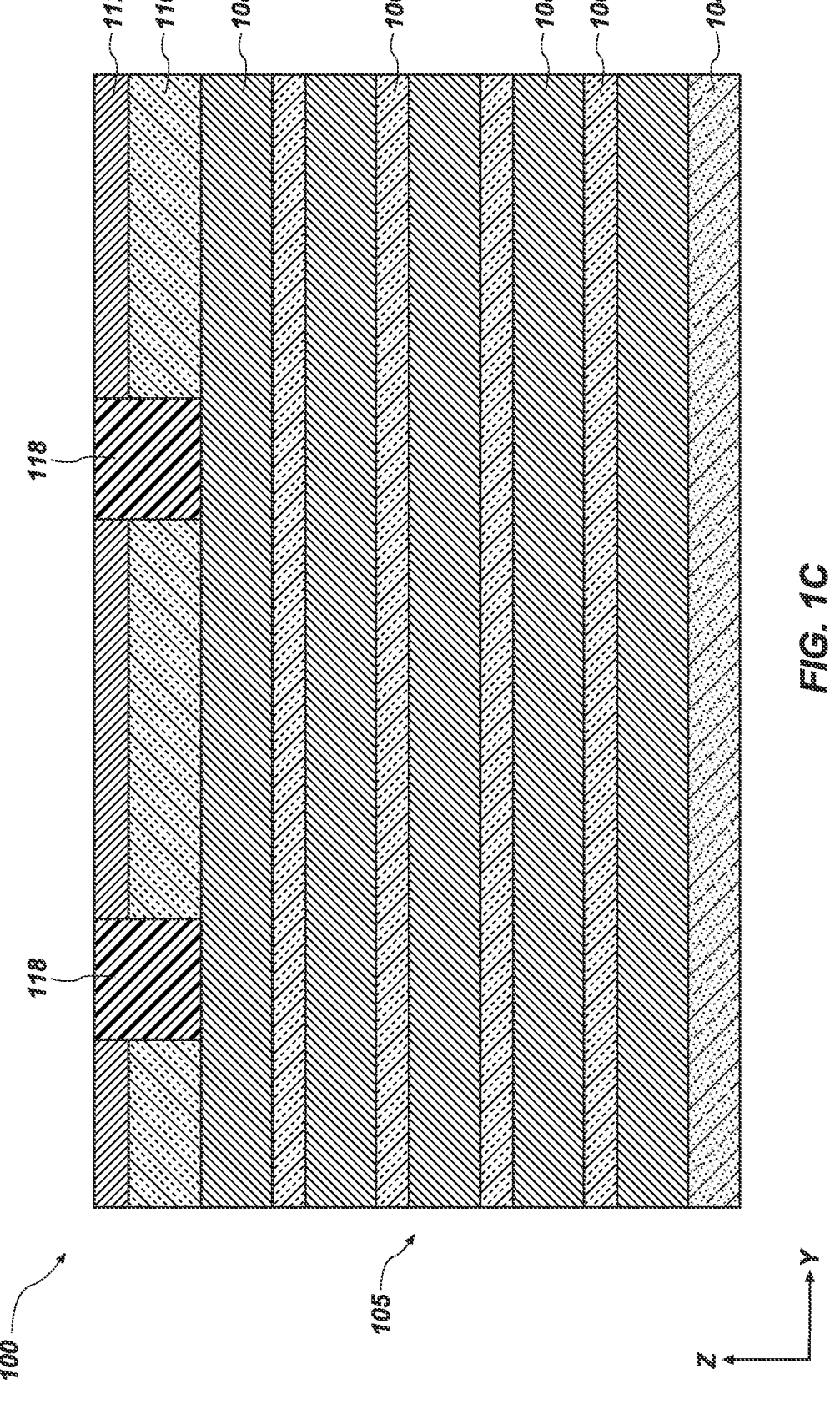
Figure 1D:
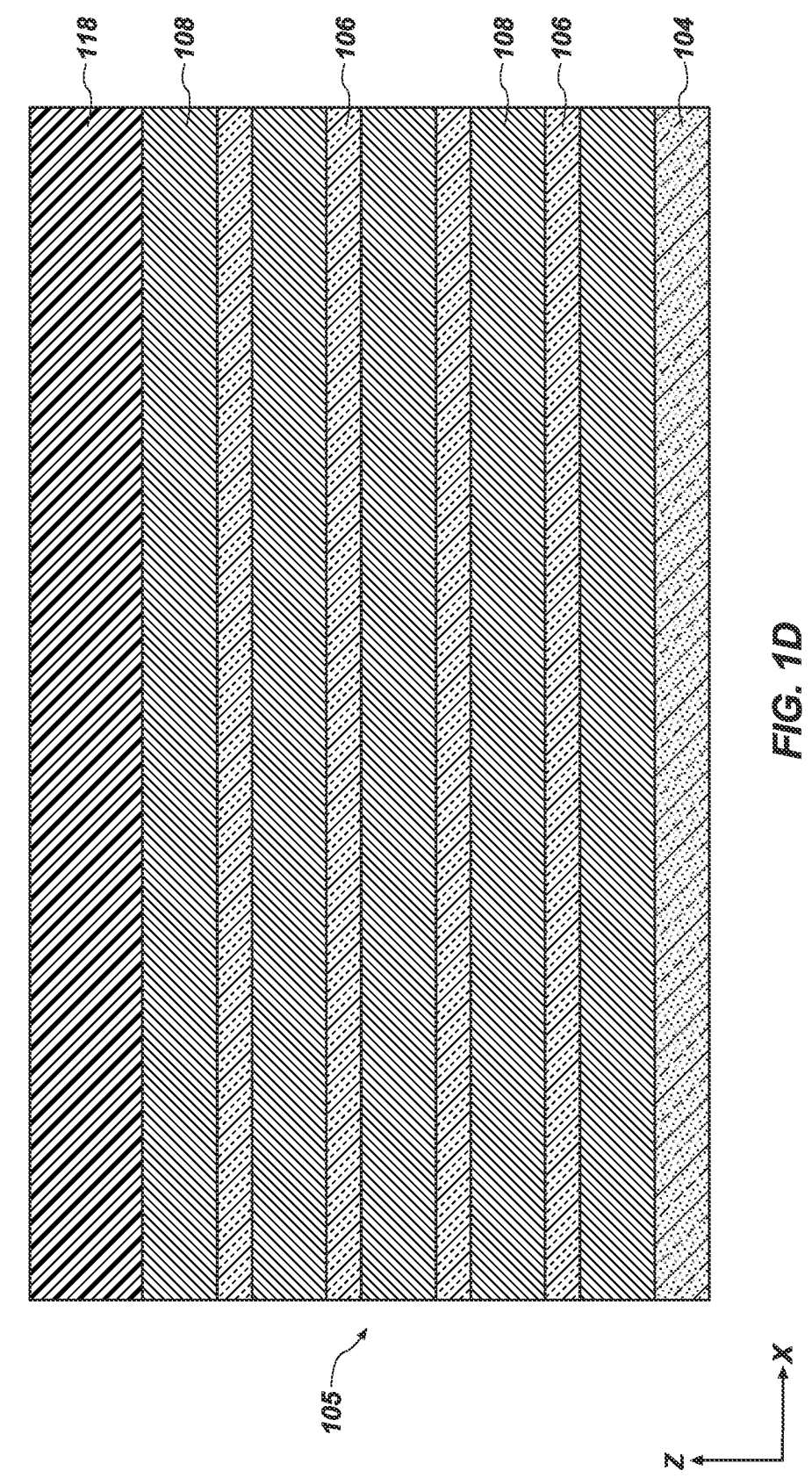
Figure 1E:
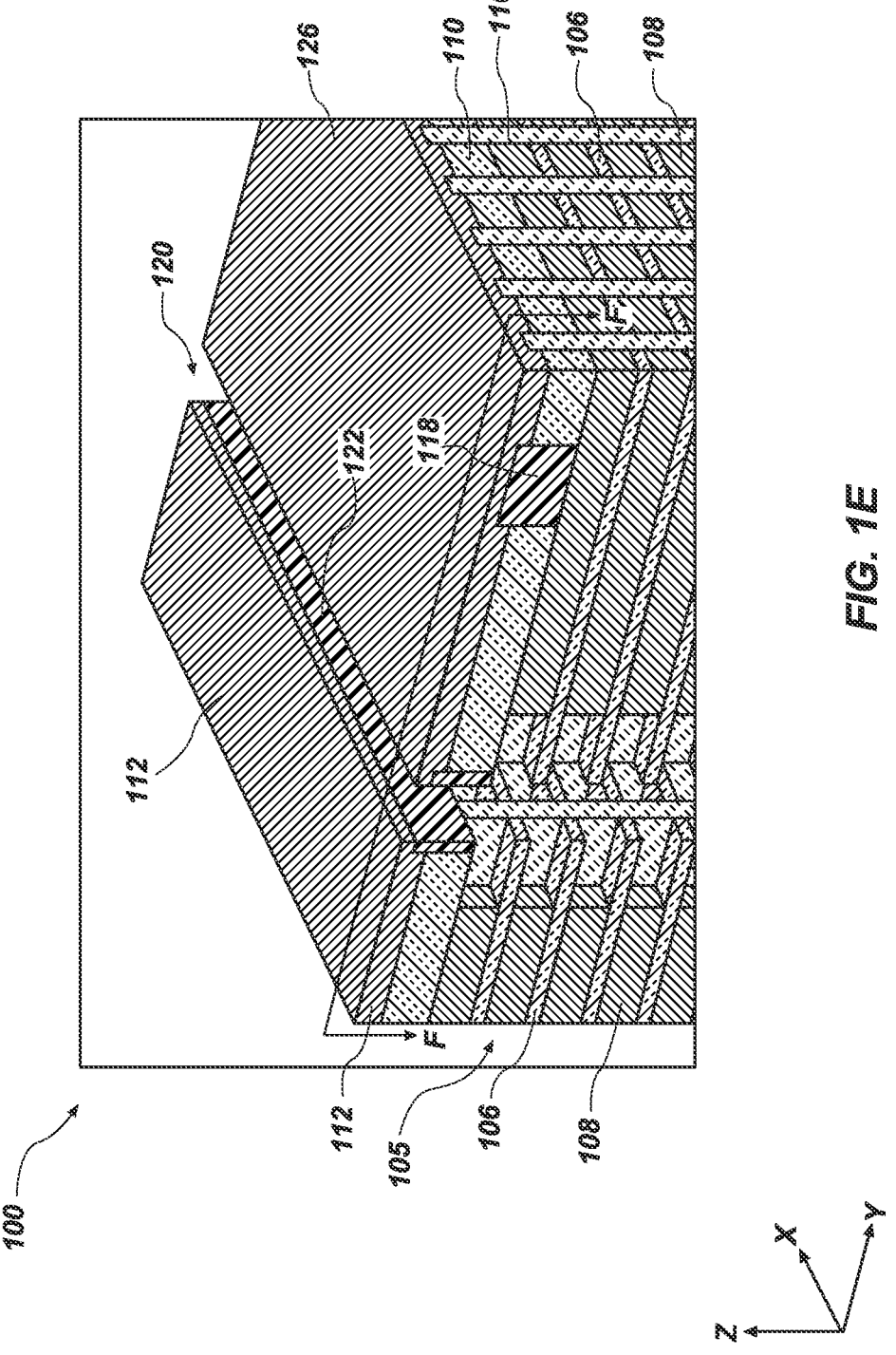
Figure 1F:
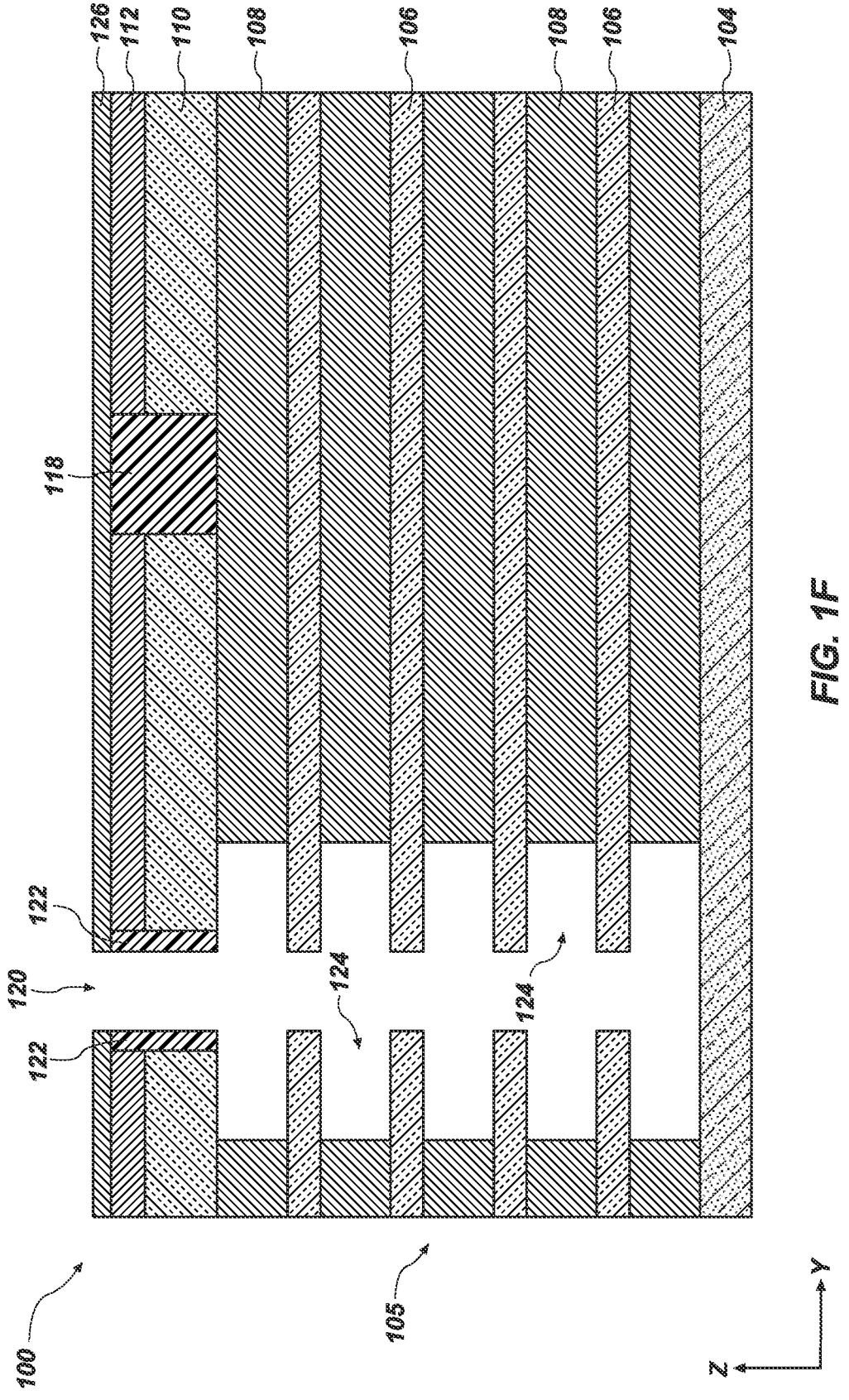
Figure 1G:
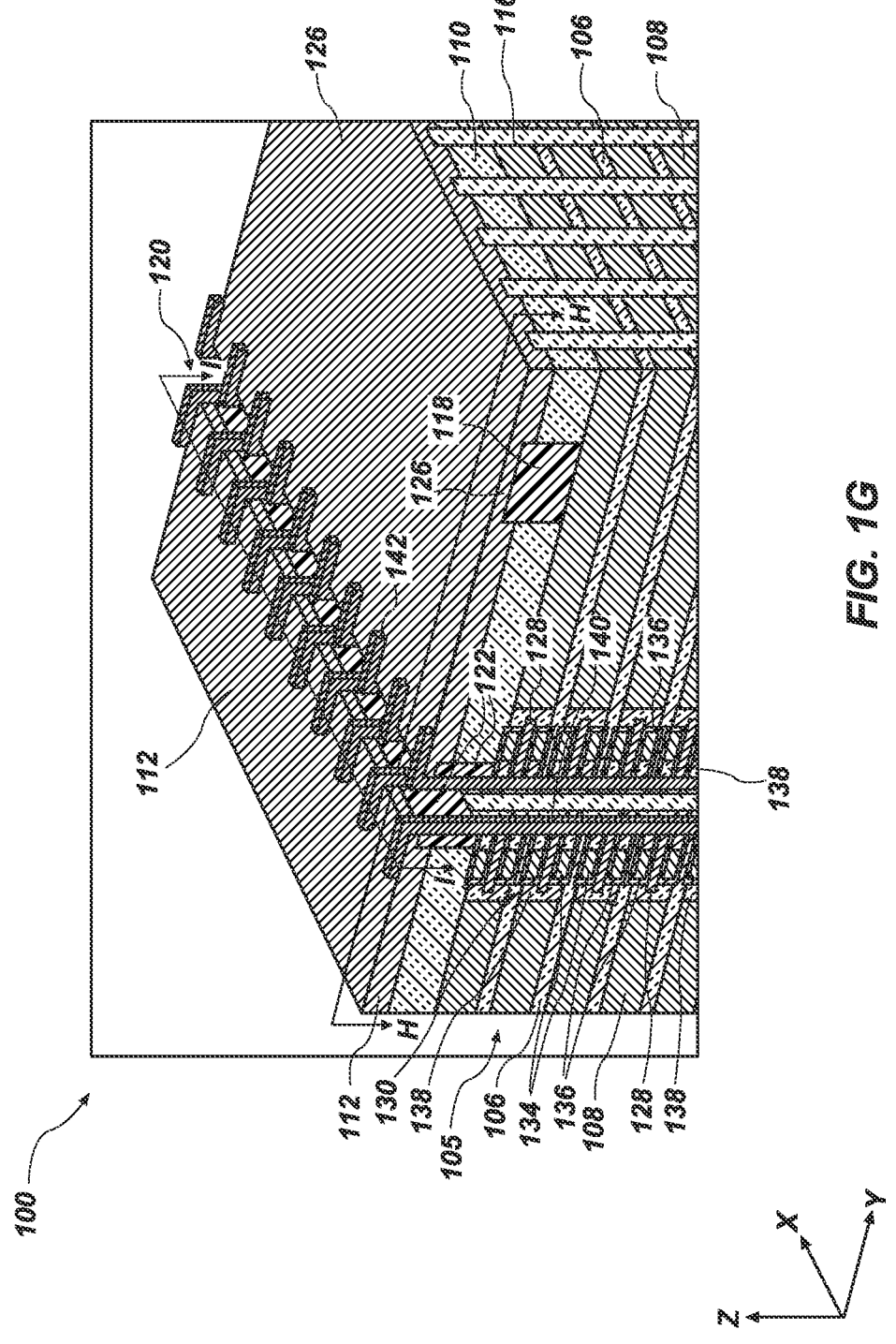
Figure 1H:
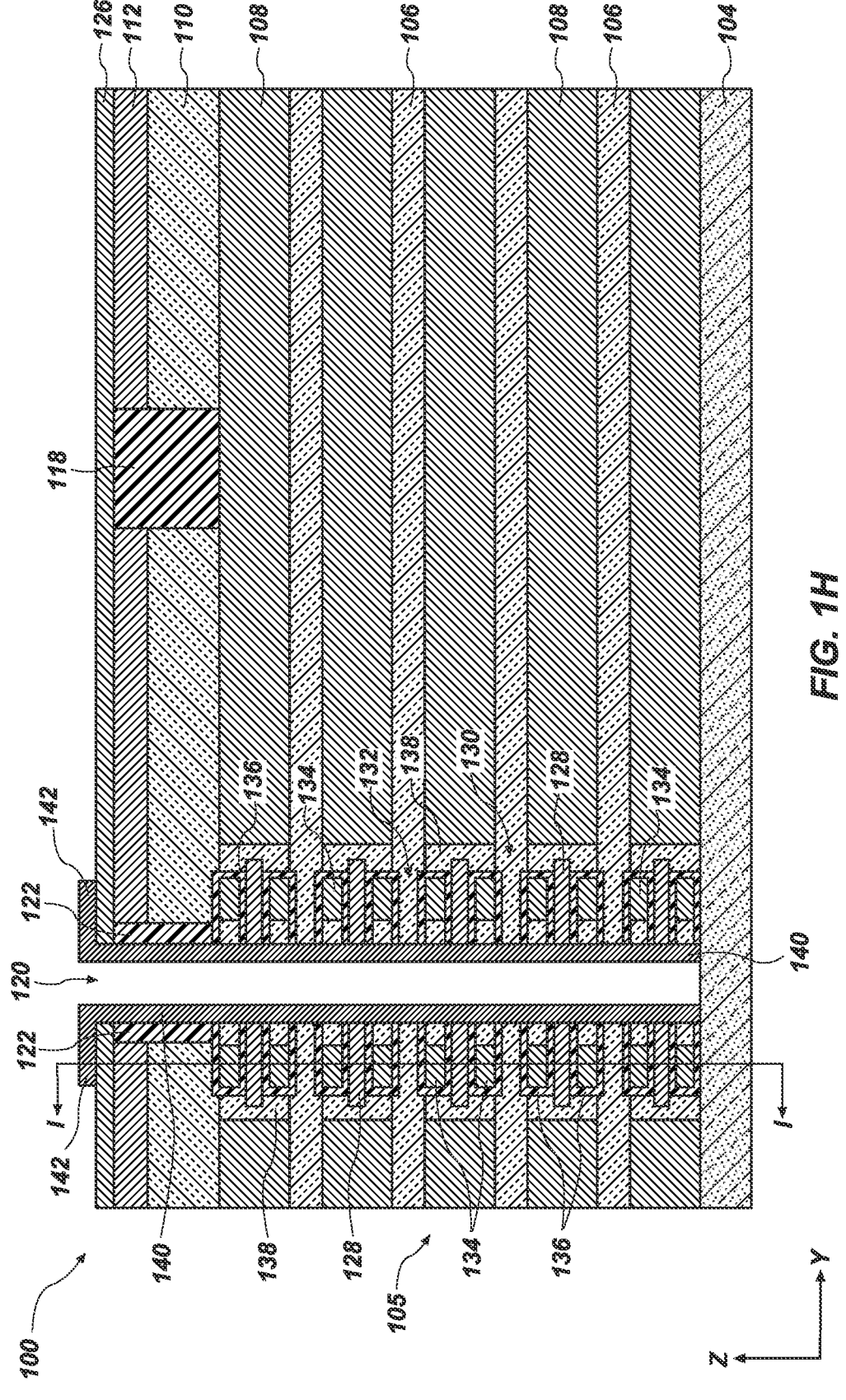
Figure 1I:
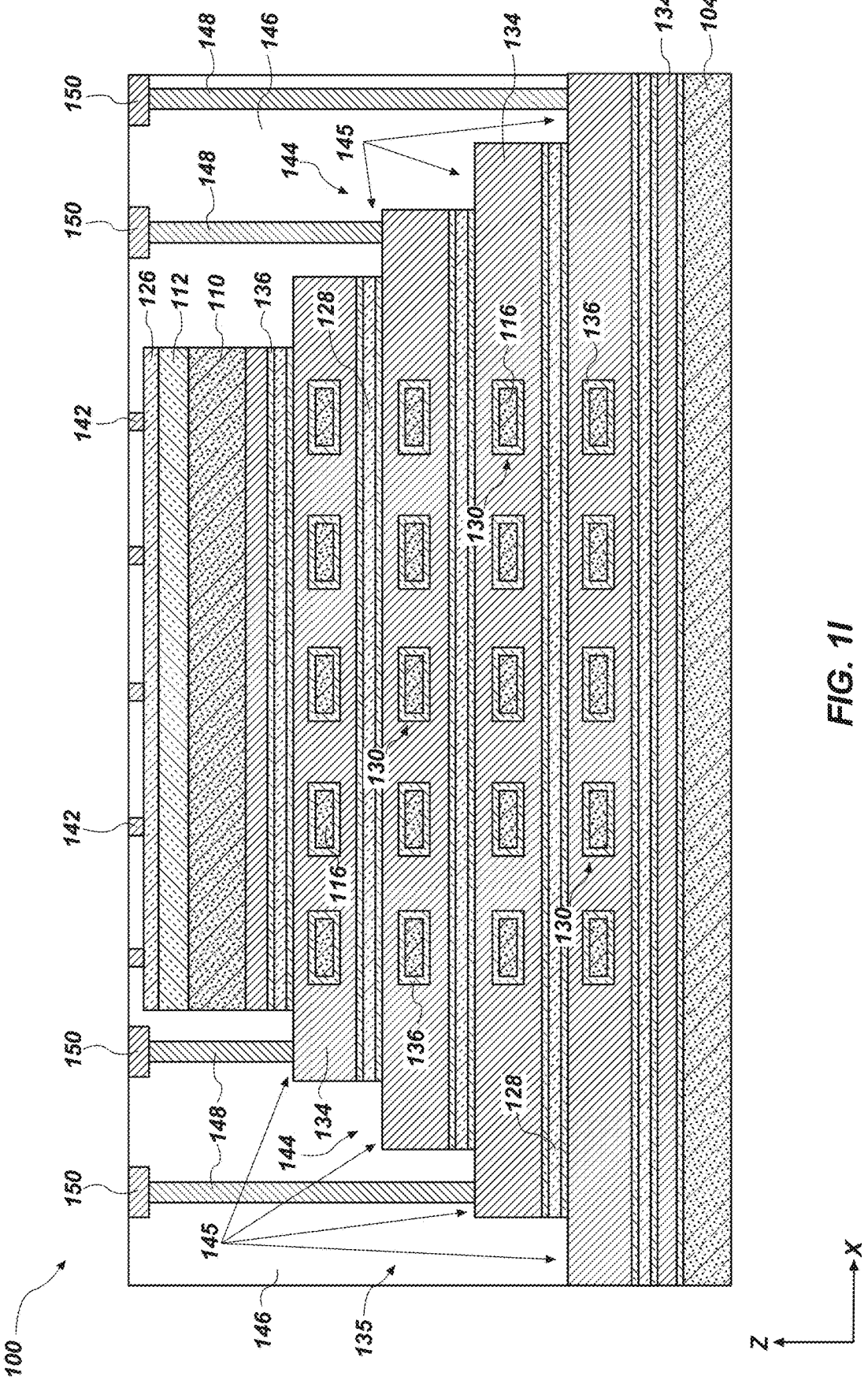
Figure 1J:
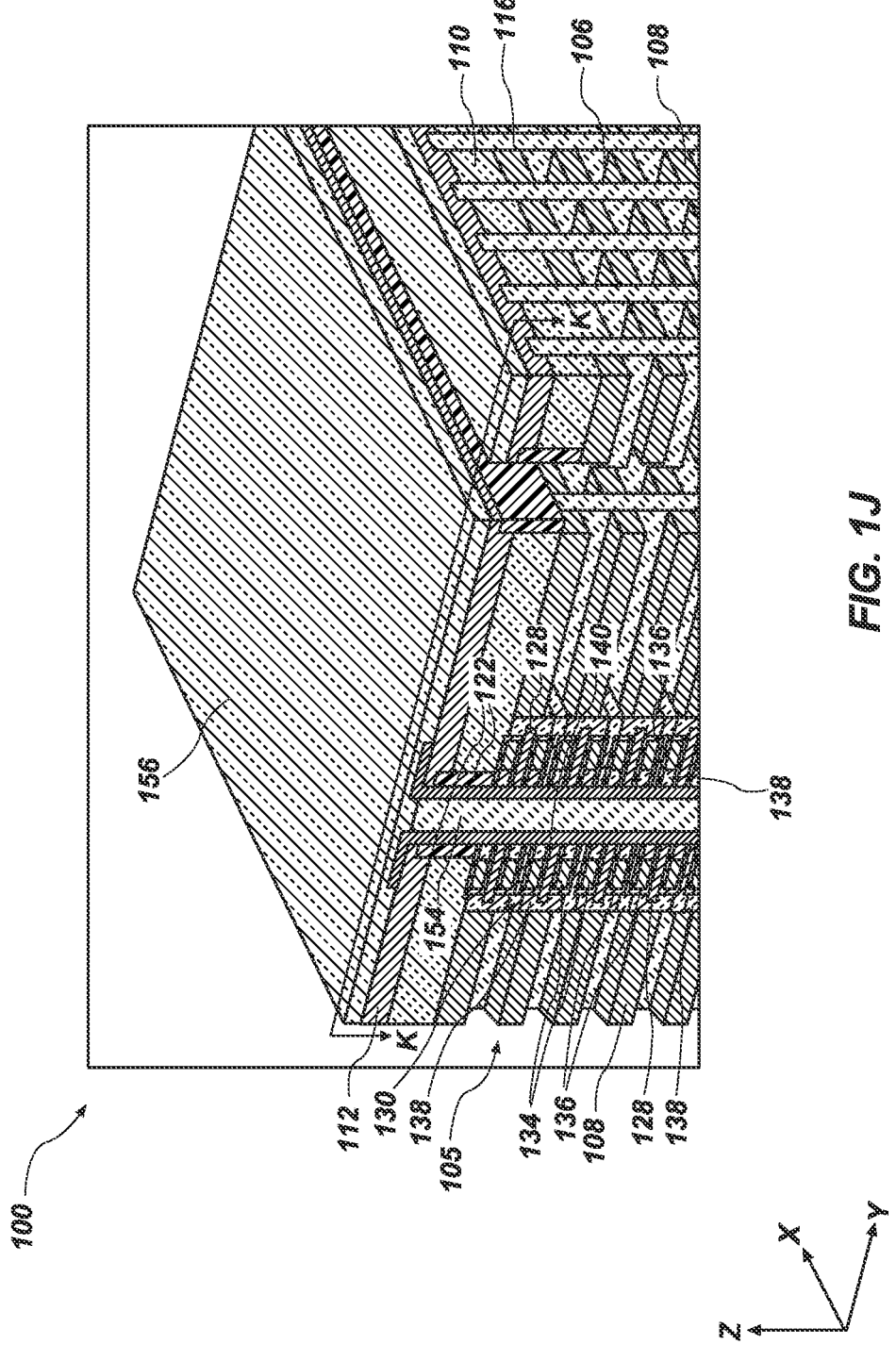
Figure 1K:
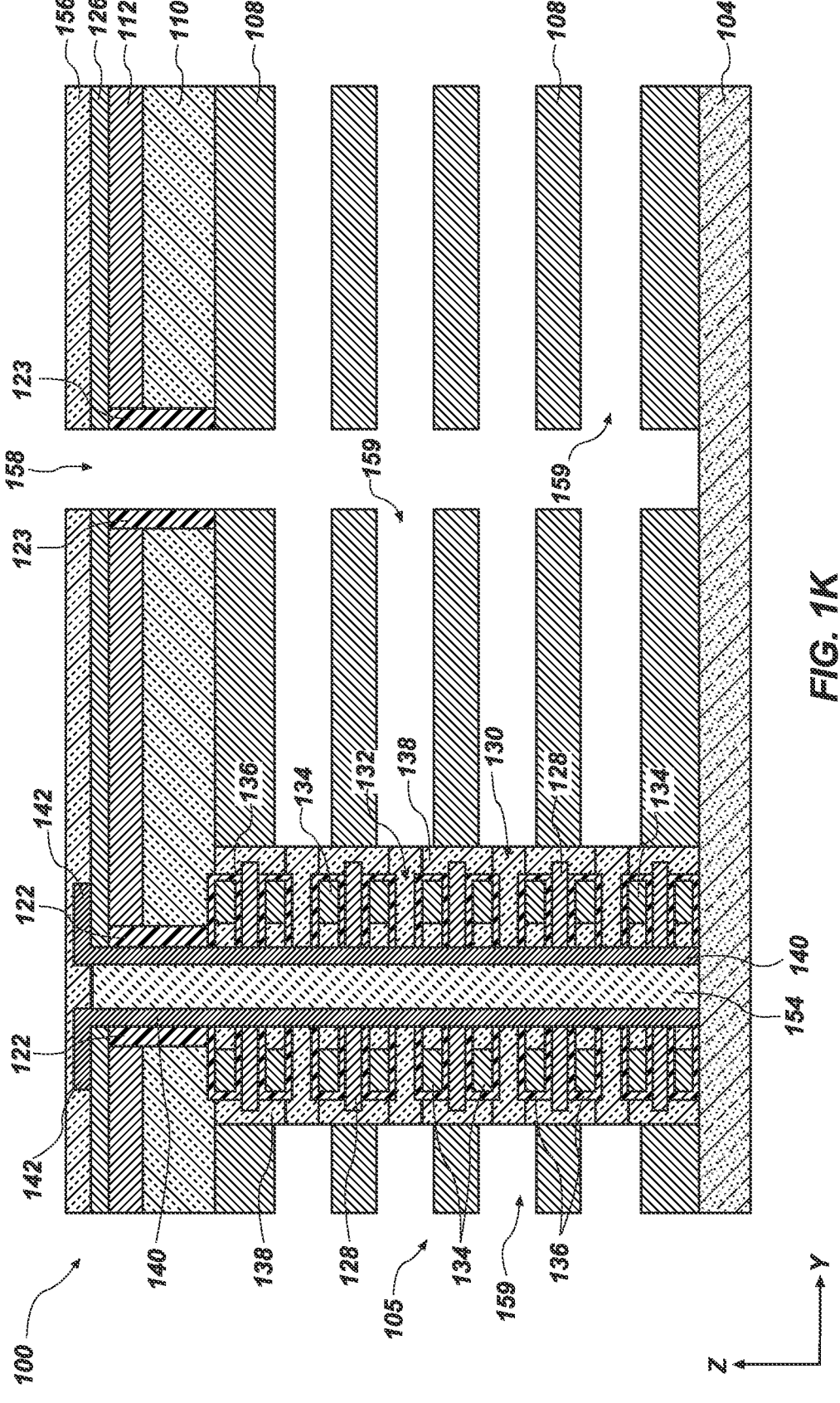
Figure 1L:
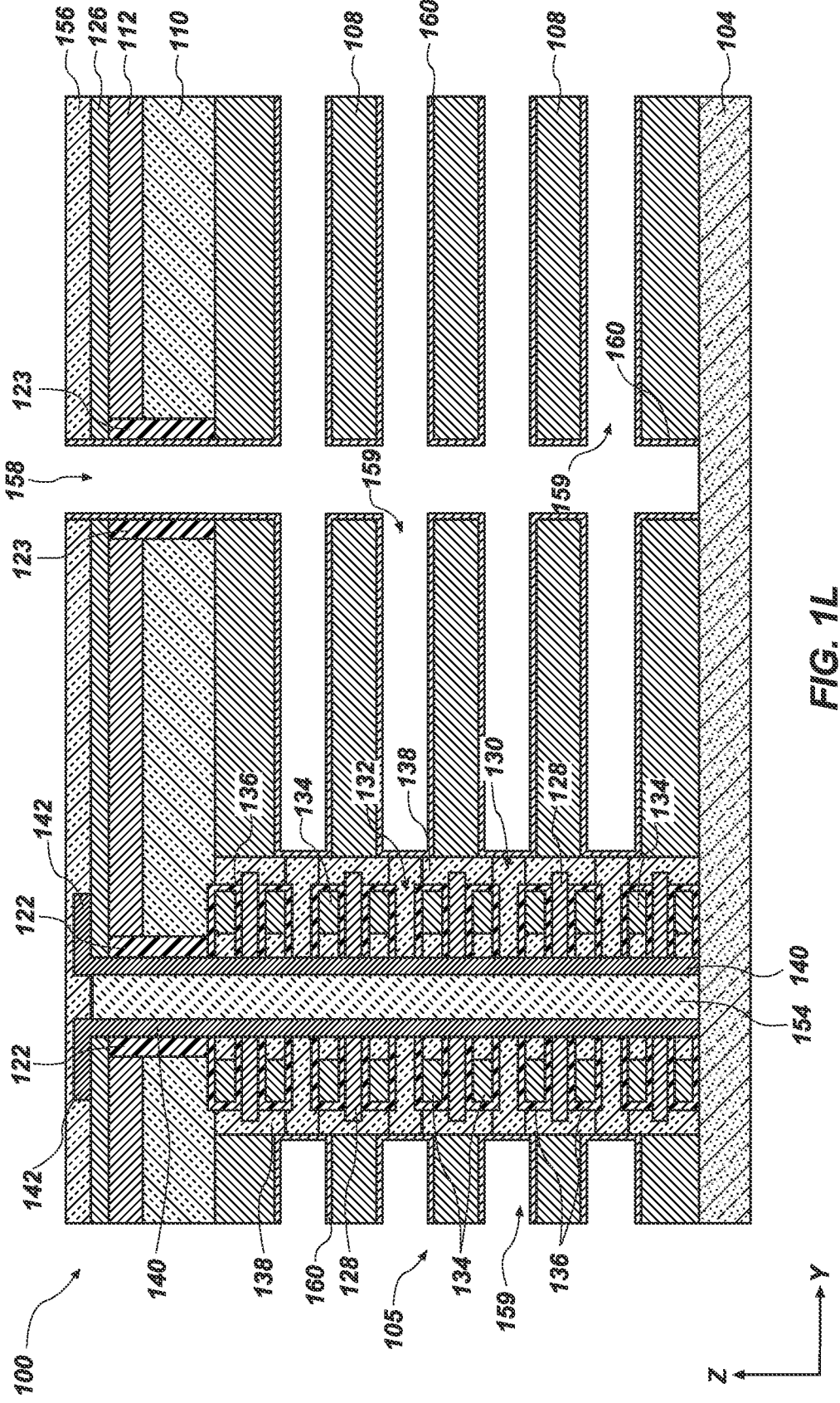
Figure 1M:
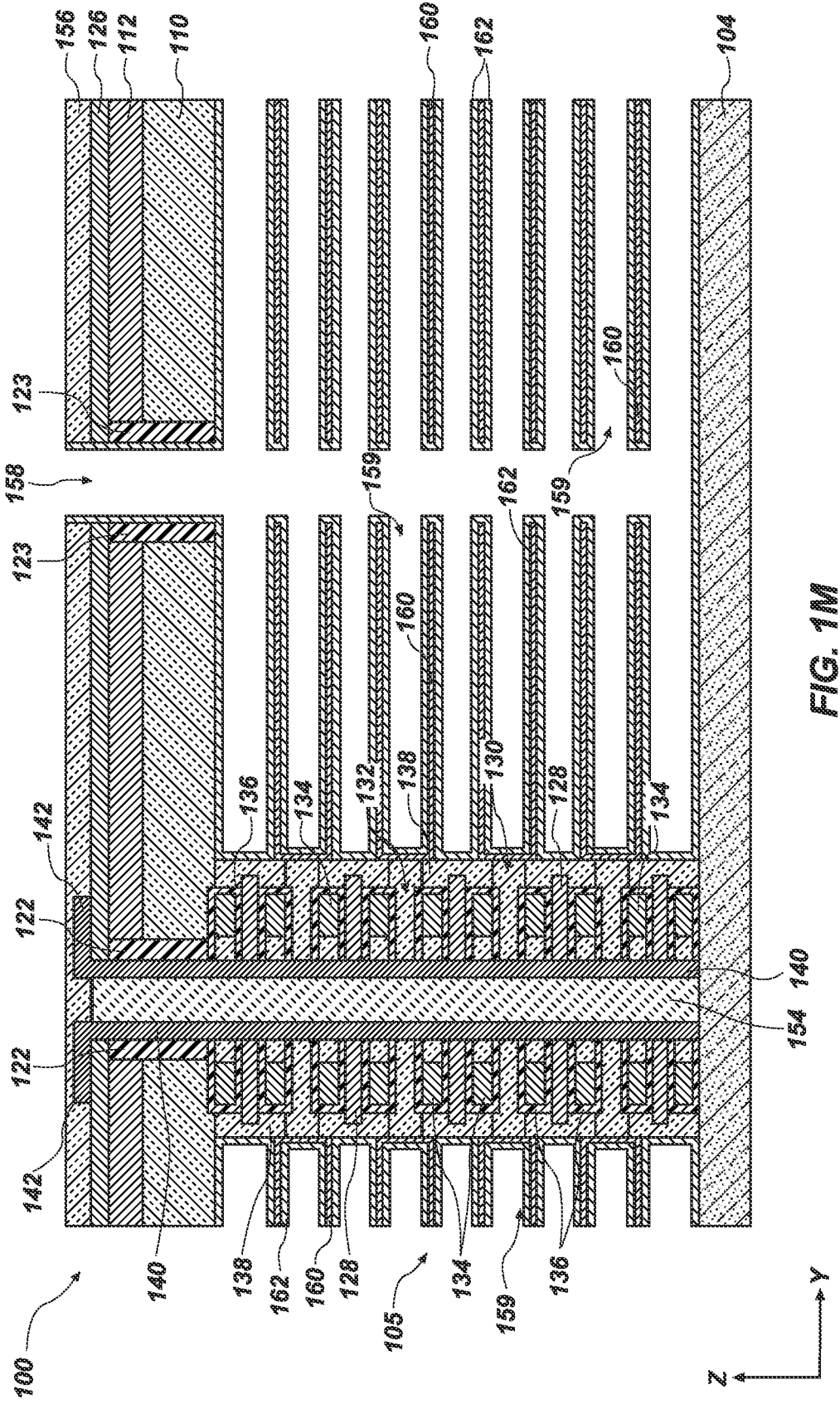
Figure 1N:
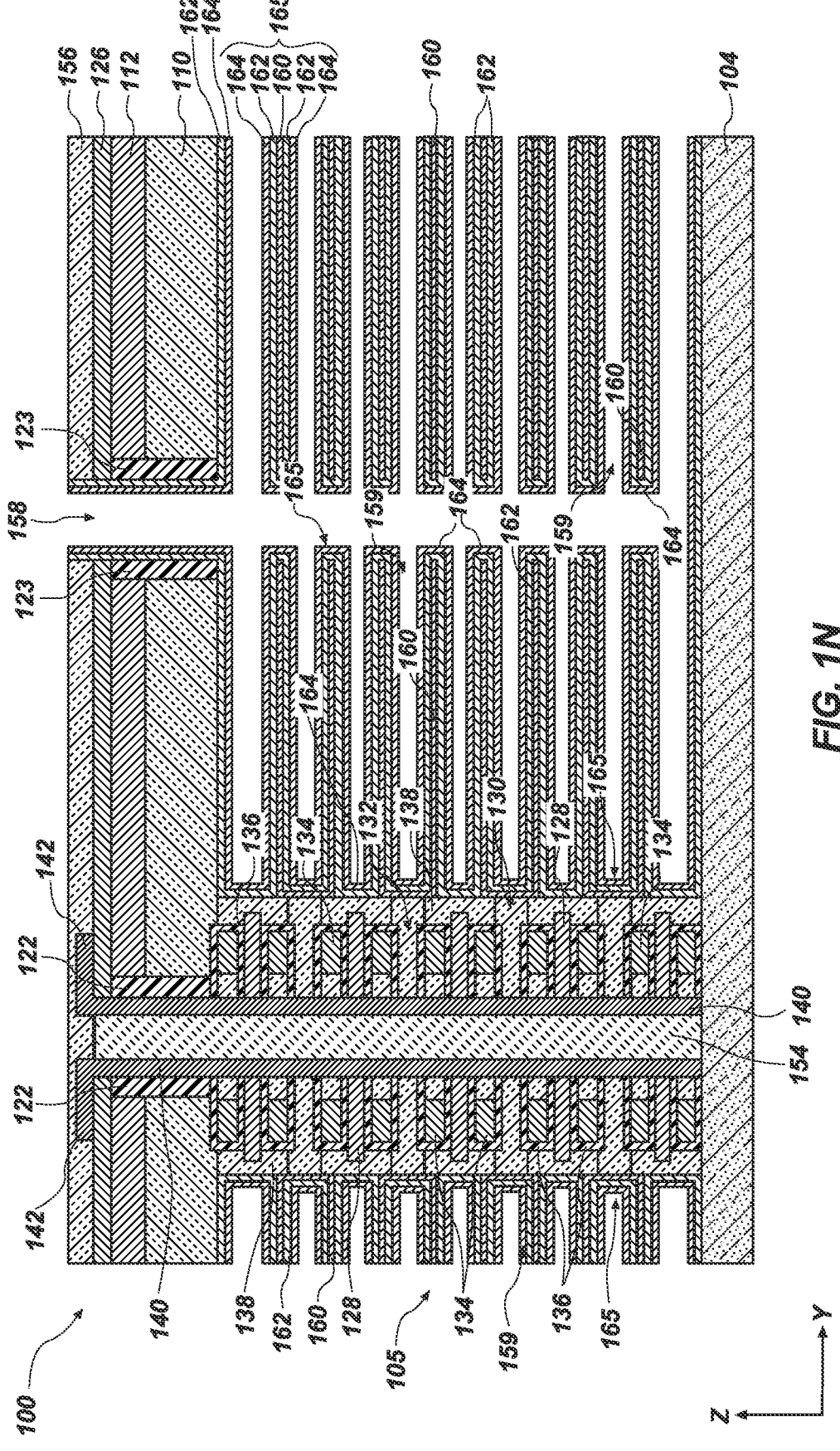
Figure 10:
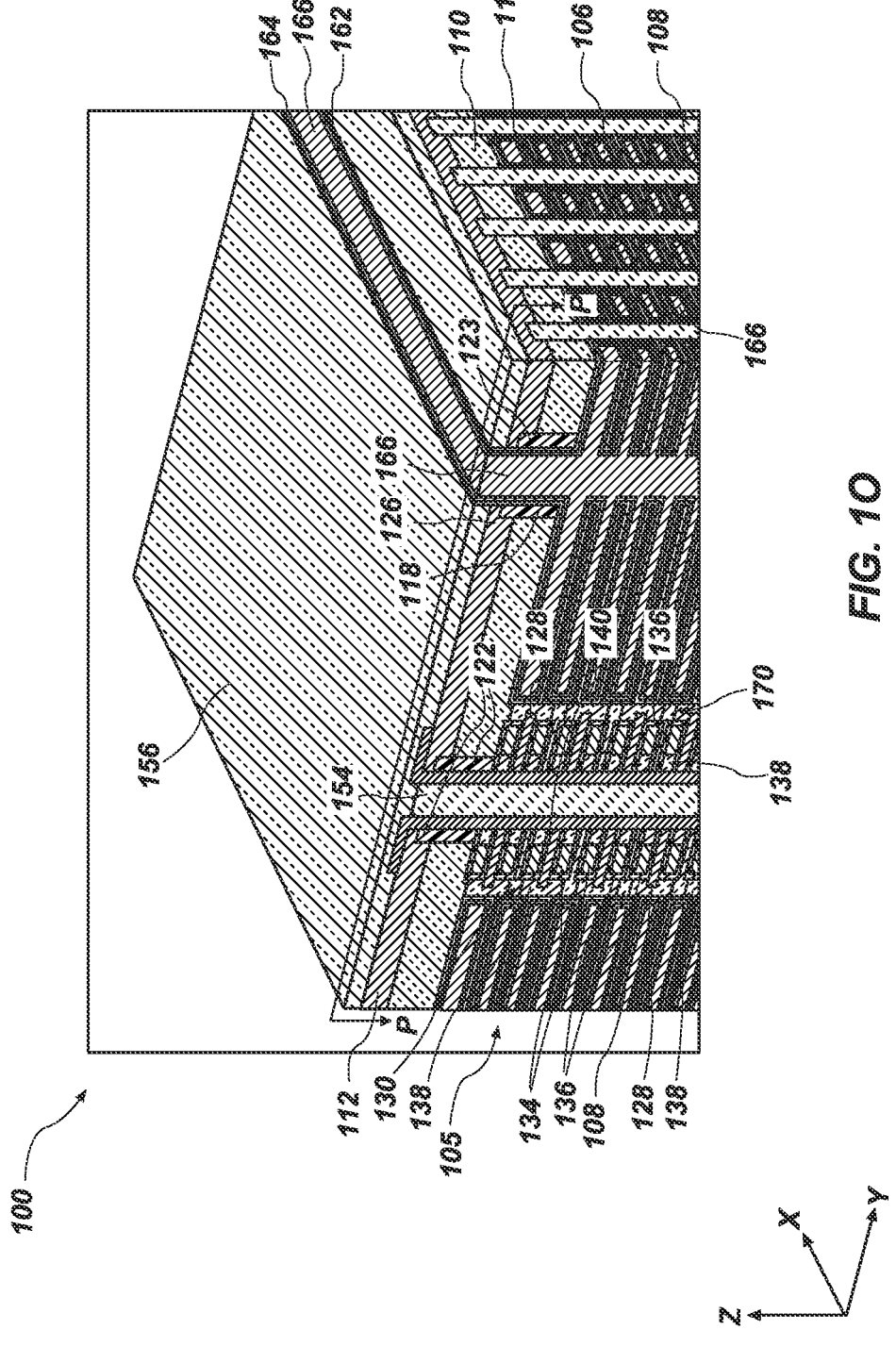
Figure 1P:
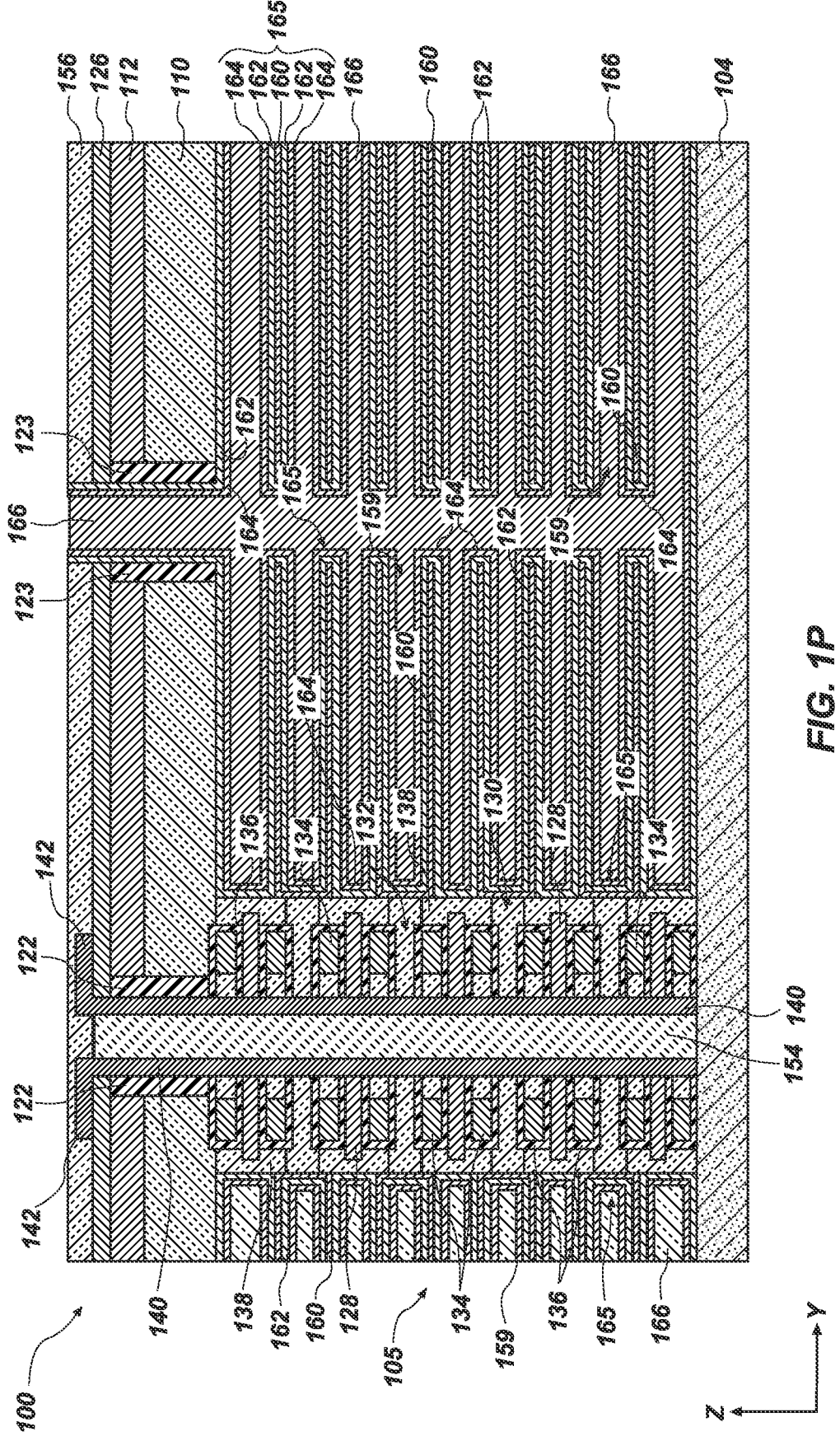
Figure 1Q:
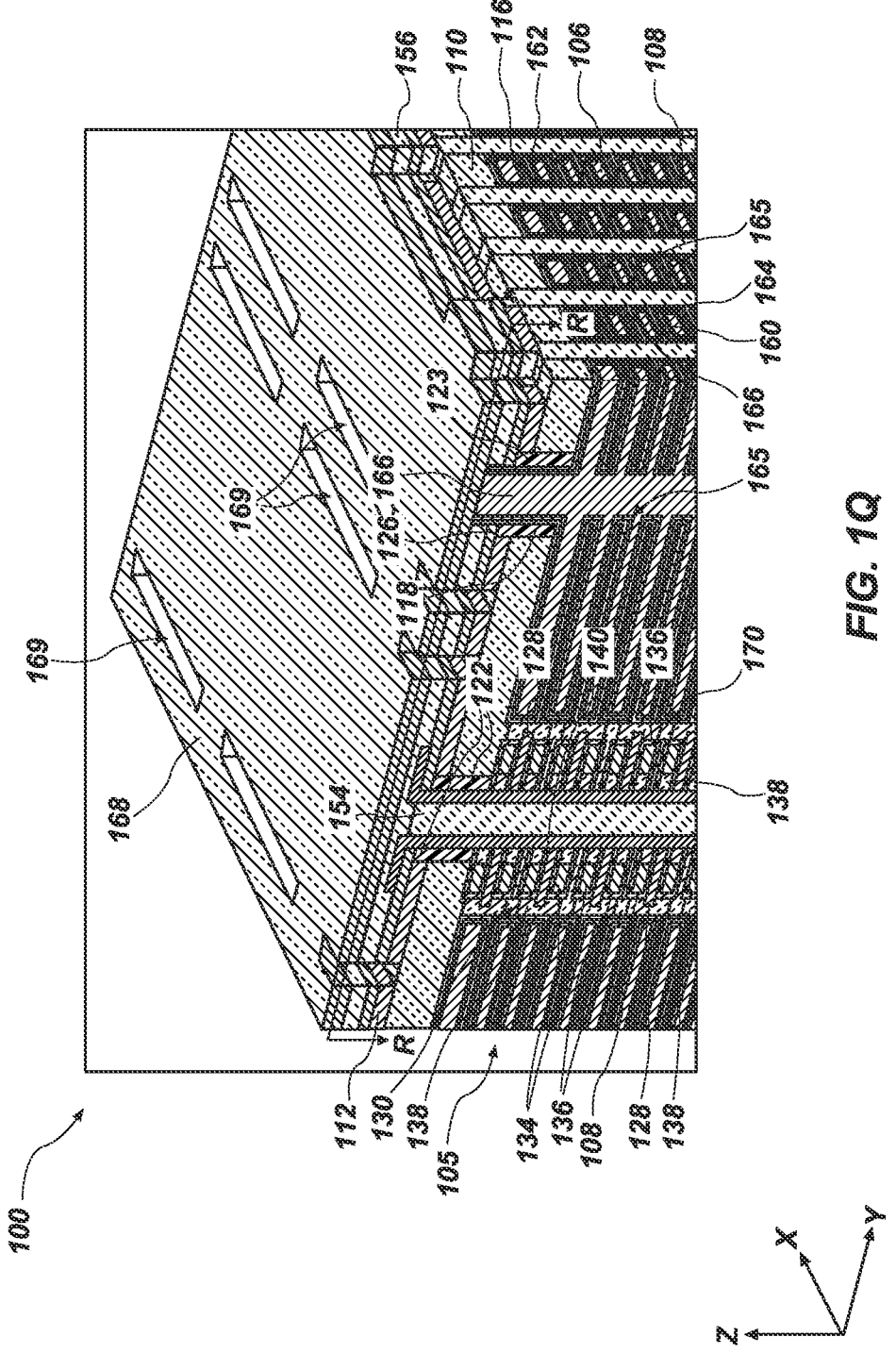
Figure 1R:
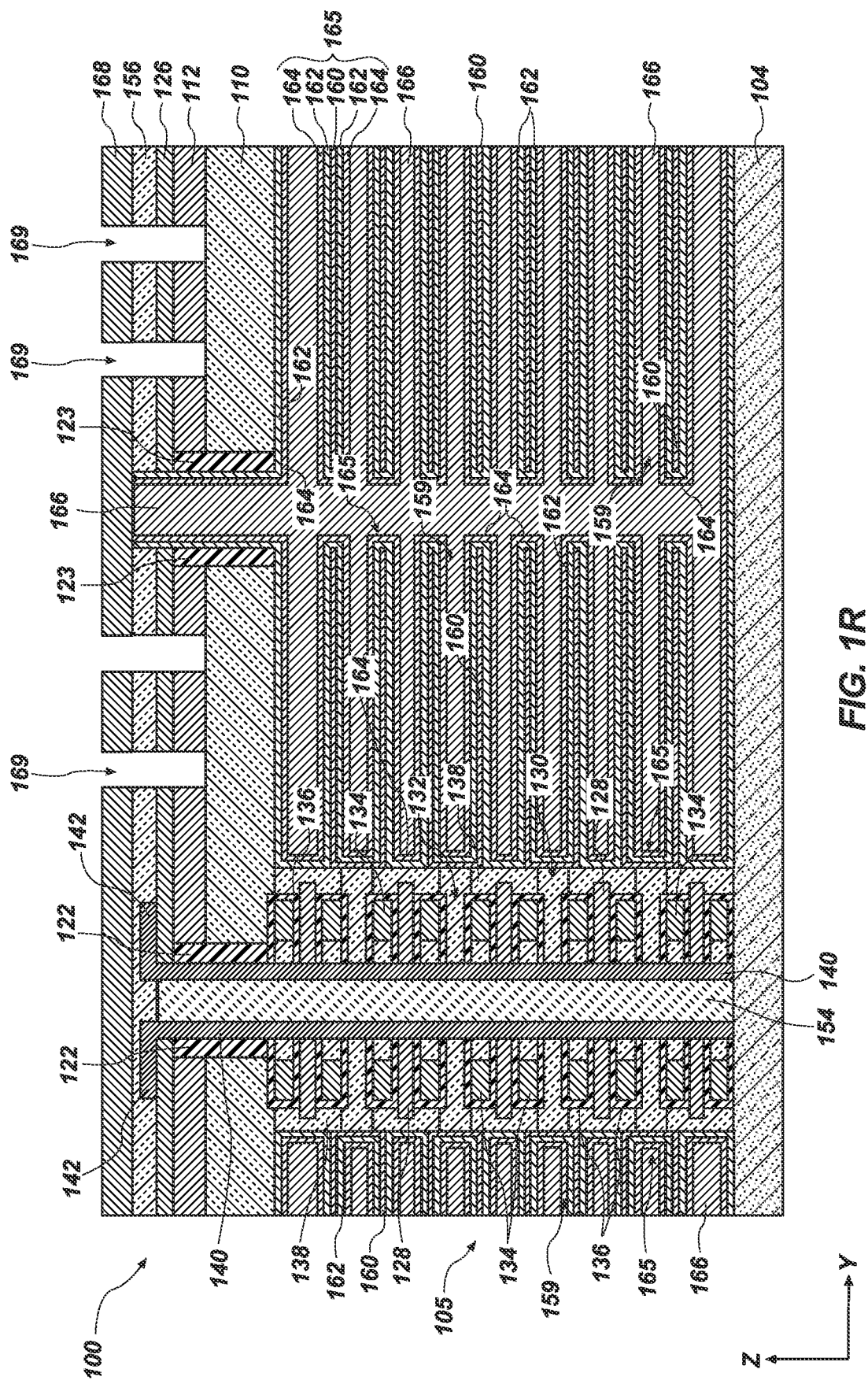
Figure 1S:
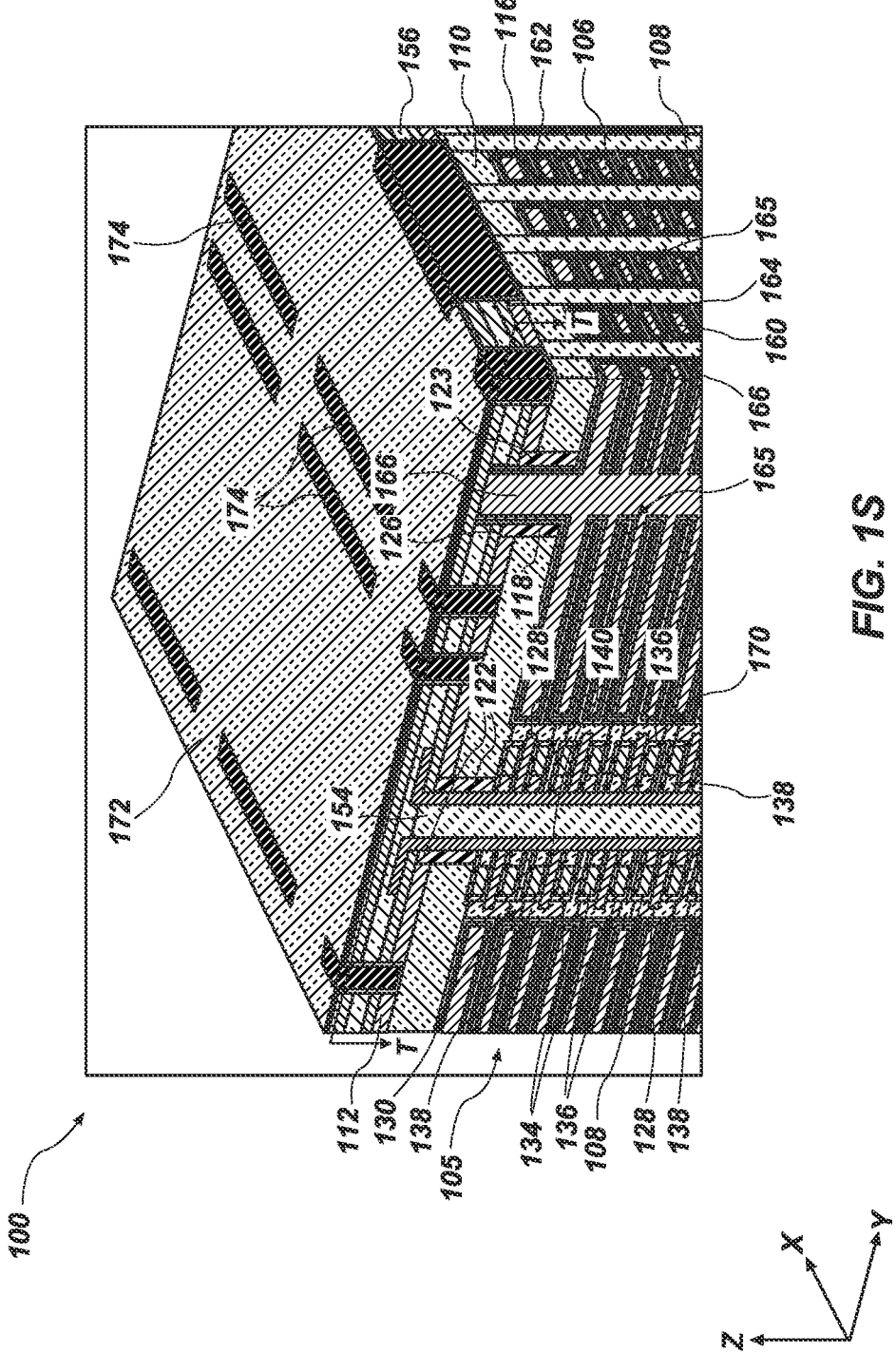
Figure 1T:
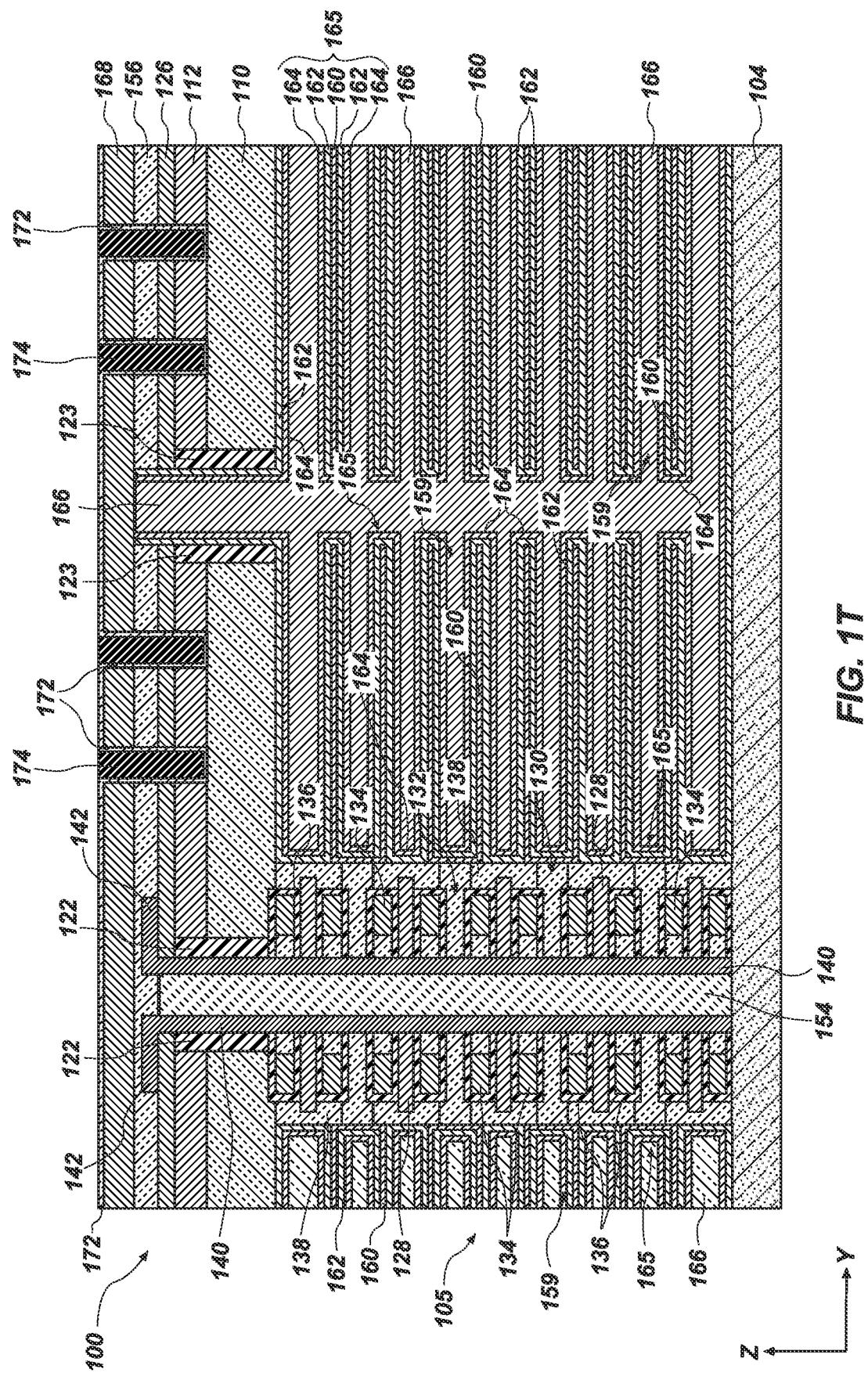
Figure 1U:
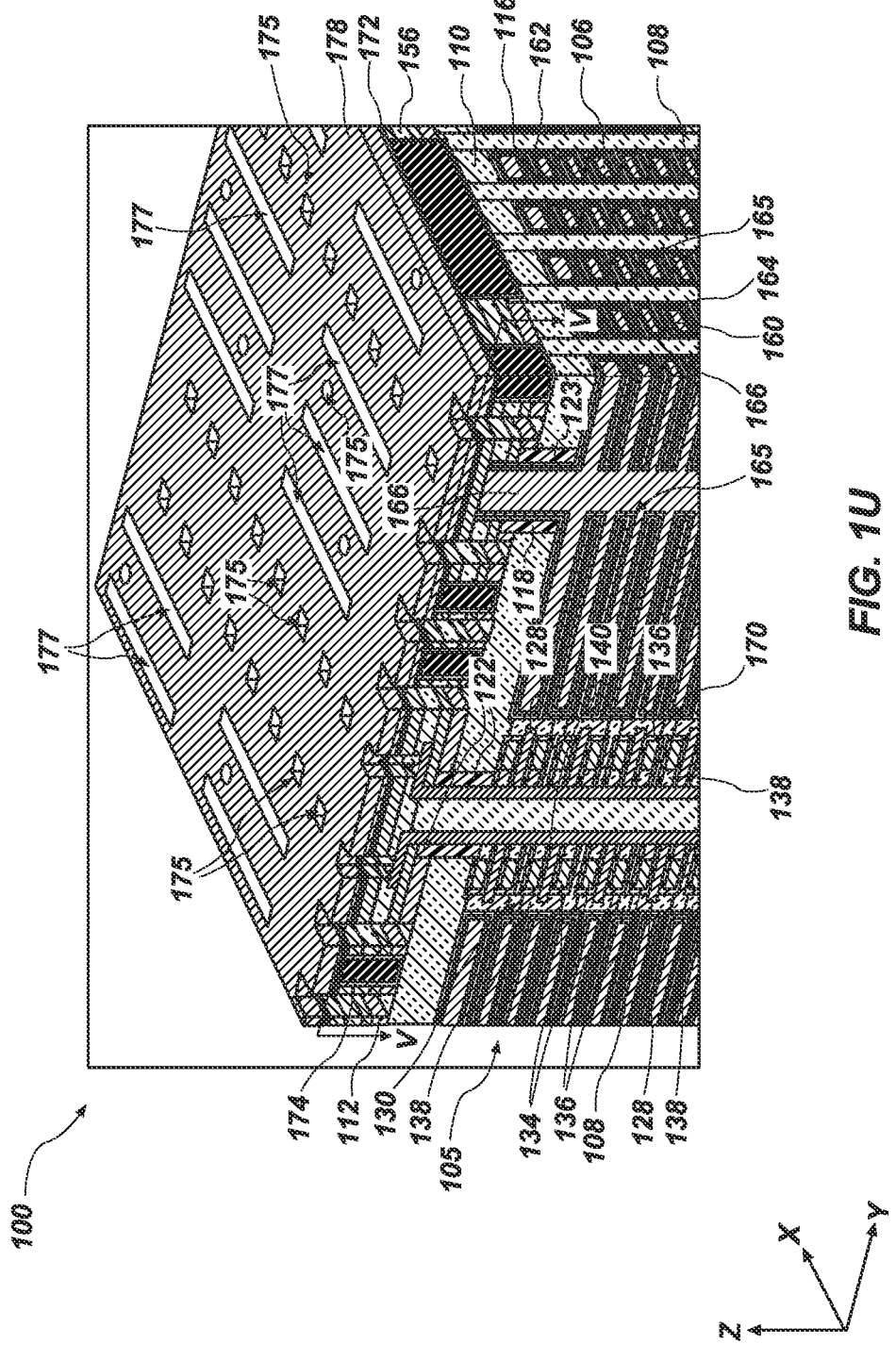
Figure 1V:
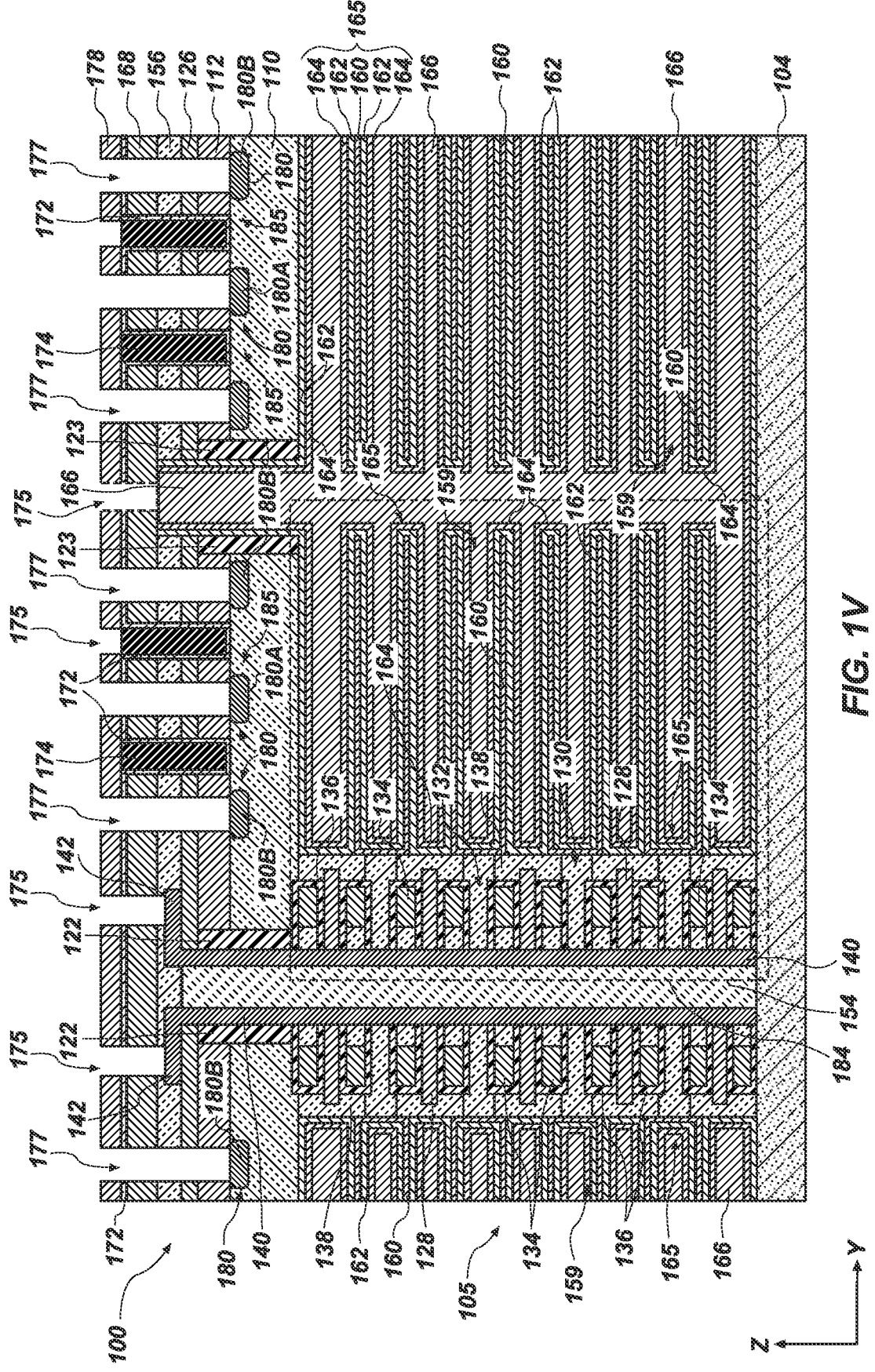
Figure 1W:
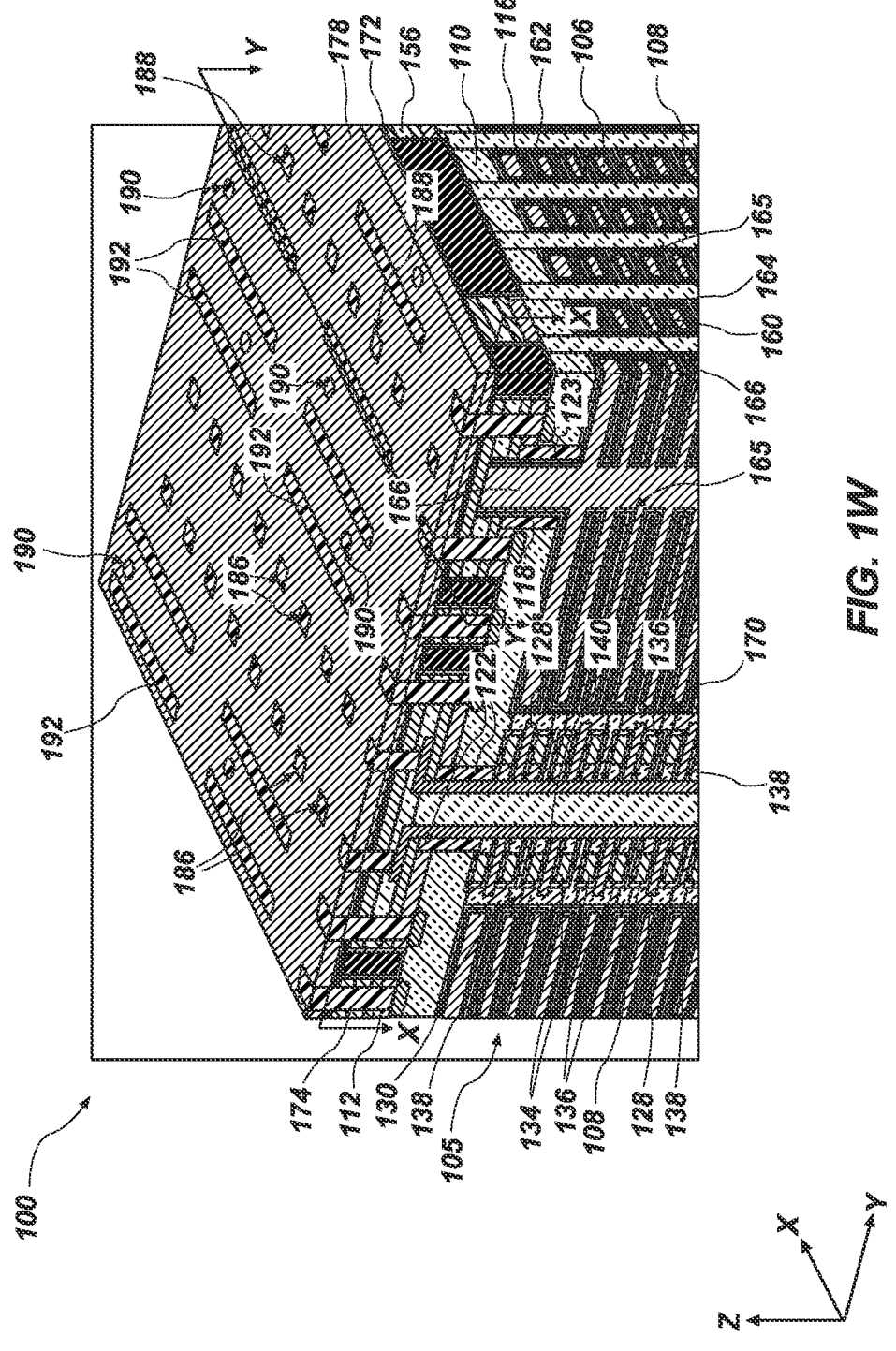
Figure 1X:
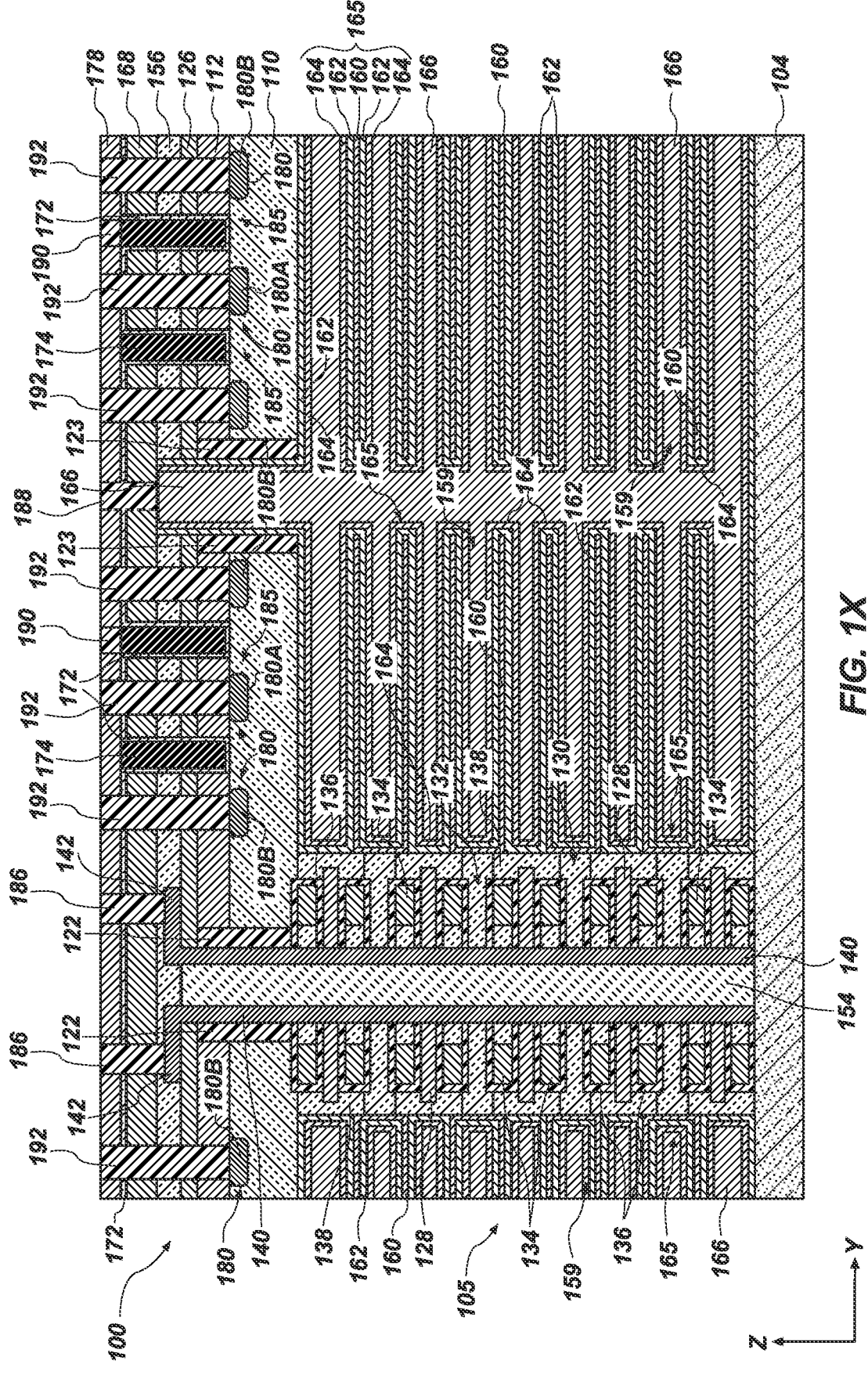
Figure 1Y:
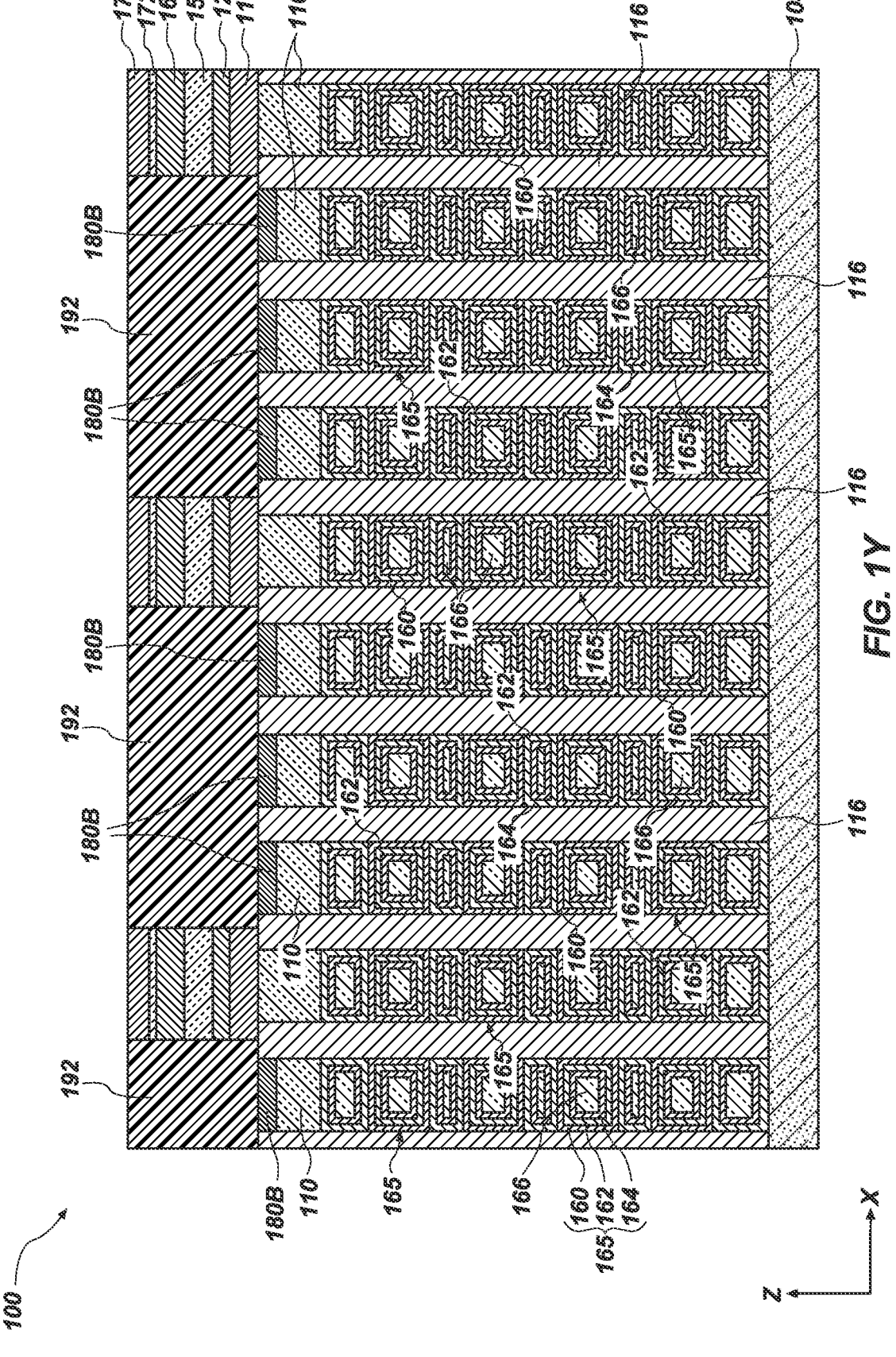

FIG. 1A through FIG. 1Y are simplified partial perspective views (FIG. 1A, FIG. 1B, FIG. 1E, FIG. 1G, FIG. 1J, FIG. 1O, FIG. 1Q, FIG. 1S, FIG. 1U, and FIG. 1W) and simplified partial cross-sectional views (FIG. 1C, FIG. 1D, FIG. 1F, FIG. 1H, FIG. 1I, FIG. 1K through FIG. 1N, FIG. 1P, FIG. 1R, FIG. 1T, FIG. 1V, FIG. 1X, and FIG. 1Y) illustrating a method of forming a microelectronic device structure for a microelectronic device (e.g., 3D memory device, such as a 3D DRAM device), in accordance with embodiments of the disclosure. With the description provided below, it will be readily apparent to one of ordinary skill in the art that the methods and structures described herein with reference to FIG. 1A through FIG. 1Y may be used in various devices and electronic systems. The microelectronic device structure 100 may also be referred to herein as a first die or a first wafer.

FIG. 1A is a simplified partial perspective view of the microelectronic device structure 100. The microelectronic device structure 100 includes a vertical (e.g., in the Z-direction) stack structure 105 from which a vertical stack of memory cells (e.g., vertical stack of memory cells 170 (FIG. 1W, FIG. 1X, FIG. 2A, FIG. 2B)) will be formed over a first insulative material 104 (FIG. 1C). The stack structure 105 includes a vertically alternating (e.g., in the Z-direction) sequence of a first material 106 and a second material 108.

A semiconductive material 110 vertically overlies (e.g., in the Z-direction) the stack structure 105. In some embodiments, the semiconductive material 110 comprises silicon, such as single-crystal silicon. In some embodiments, the semiconductive material 110 comprises epitaxially-grown silicon. As described in further detail herein, the semiconductive material 110 may be used to form one or more control logic devices of the microelectronic device structure 100 to facilitate control operations for memory cells (e.g., memory cells 170 (FIG. 1W, FIG. 1X, FIG. 2A, FIG. 2B)) of the microelectronic device structure 100.

A first mask material 112 vertically overlies (e.g., in the Z-direction) the semiconductive material 110. The first mask material 112 may be formed of and include one or more of a photoresist material, nitride mask (e.g., silicon nitride, titanium nitride, aluminum nitride), silicon carbide, carbon doped hydrogenated silicon oxide (SiOCH), amorphous carbon, and a spin-on mask material. In some embodiments, the first mask material 112 comprises a hardmask material. However, the disclosure is not so limited and the first mask material 112 may include materials other than those described above.

Filled isolation trenches 114 may vertically extend (e.g., in the Z-direction) through the semiconductive material 110 and the stack structure 105 to divide the semiconductive material 110 and the stack structure 105 into different regions from which isolated vertical stacks of memory cells (e.g., vertical stacks of memory cells 170 (FIG. 1W, FIG. 1X, FIG. 2A, FIG. 2B)) may be formed. In some embodiments, the filled isolation trenches 114 may be referred to as "deep trench isolation" (DTI) structures.

The filled isolation trenches 114 may comprise a second insulative material 116. The second insulative material 116 may be formed of and include one or more materials that have etch selectivity with respect to silicon dioxide and silicon nitride. By way of non-limiting example, the second insulative material 116 comprises one or more of silicon boron nitride (SiBN) (also referred to as "silicon boronitride"), silicon oxycarbide (SiOC), and silicon carbonitride (SiCN). In some embodiments, the second insulative material 116 comprises a spin-on dielectric (SOD) material.

The first material 106 may be formed of and include, for example, a semiconductive material (e.g., silicon) or an oxide material (e.g., silicon dioxide). In some embodiments, the first material 106 comprises silicon, such as epitaxially grown silicon. In some embodiments, the first material 106 comprises monocrystalline silicon.

The second material 108 may have a different material composition than the first material 106 and may have etch selectivity with respect to the first material 106. The second material 108 may be formed of and include one or more of silicon germanium, polysilicon, a nitride material (e.g., silicon nitride ($Si_3N_4$)), or an oxynitride material (e.g., silicon oxynitride). In some embodiments, such as where the first material 106 comprises silicon, the second material 108 comprises silicon germanium, such as epitaxially grown silicon germanium. In other embodiments, such as where the first material 106 comprises silicon, the second material 108 comprises polysilicon. In yet other embodiments, such as where the first material 106 comprises silicon dioxide, the second material 108 comprises silicon nitride or silicon oxynitride.

FIG. 1B is a simplified partial perspective view of the microelectronic device structure 100 at a processing stage subsequent to the one illustrated in FIG. 1A. FIG. 1C is a simplified partial cross-sectional view of the microelectronic device structure 100 taken through section line C-C of FIG. 1B; and FIG. 1D is a simplified partial cross-sectional view of the microelectronic device structure 100 taken through section line D-D of FIG. 1B.

With collective reference to FIG. 1B through FIG. 1D, recesses may be formed within the first mask material 112 and the semiconductive material 110 to expose a vertically uppermost (e.g., in the Z-direction) level of the second material 108. The recesses may be formed by, for example, exposing the first mask material 112, the semiconductive material 110, and the second insulative material 116 to one or more dry etch processes. By way of non-limiting example, the recesses may be formed by exposing the first mask material 112, the semiconductive material 110, and the second insulative material 116 to one or more of sulfur hexafluoride ($SF_6$), carbon tetrafluoride ($CF_4$), octafluorocyclobutane ($C_4F_8$), hexafluorocyclobutene ($C_4F_6$), octafluorocyclopentene ($C_5F_8$), trifluoromethane ($CHF_3$), nitrogen trifluoride ($NF_3$), carbon tetrafluoride ($CF_4$), chlorine ($Cl_2$), and fluorine ($F_2$). However, the disclosure is not so limited and the portions of the first mask material 112, the semiconductive material 110, and the second insulative material 116 may be removed with one or more other materials.

The recesses may be filled with a dielectric material 118 (also referred to herein as a "protective dielectric" material). The dielectric material 118 may be formed of and include, for example, one or more materials exhibiting an etch selectivity with respect to silicon and silicon germanium. In some embodiments, the dielectric material 118 exhibits an etch selectivity to silicon dioxide, silicon, and silicon nitride. By way of non-limiting example, the dielectric material 118 may be formed of and include a high-k dielectric material (e.g., one or more of zirconium oxide (e.g., $ZrO_x$, such as zirconium dioxide ($ZrO_2$)), hafnium oxide (e.g., $HfO_x$, such as hafnium dioxide ($HfO_2$)), aluminum oxide (e.g., $Al_2O_3$), titanium dioxide ($TiO_2$), tantalum oxide (e.g., $Ta_2O_5$), magnesium oxide (MgO), niobium oxide (e.g., NbO, $NbO_2$, $Nb_2O_5$), molybdenum oxide (e.g., $MoO_2$, $MoO_3$), strontium oxide (e.g., SrO), barium oxide (e.g., BaO), and yttrium oxide (e.g., $Y_2O_3$)), and aluminum nitride (AlN). In some embodiments, the dielectric material 118 comprises one or more of zirconium oxide, hafnium oxide, and aluminum oxide. In some embodiments, the dielectric material 118 comprises zirconium oxide.

After forming the dielectric material 118 in the recesses, the microelectronic device structure 100 may be exposed to a chemical mechanical planarization (CMP) process to remove any dielectric material 118 from vertically upper (e.g., in the Z-direction) surfaces of the microelectronic device structure 100.

With reference to FIG. 1C and FIG. 1D, the stack structure 105 vertically overlies (e.g., in the Z-direction) the first insulative material 104. The first insulative material 104 may be formed of and include insulative material. In some embodiments, the first insulative material 104 is formed of and includes insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 104 comprises silicon dioxide. The first insulative material 104 may include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the first insulative material 104. In some embodiments, the first insulative material 104 exhibits a substantially homogeneous distribution of insulative material. In additional embodiments, the first insulative material 104 exhibits a substantially heterogeneous distribution of at least one insulative material.

With reference to FIG. 1E and FIG. 1F, in some embodiments, a second mask material 126 is formed over a microelectronic device structure 100. In some embodiments, the second mask material 126 comprises substantially the same material composition as the first mask material 112. Accordingly, the first mask material 112 and the second mask material 126 are illustrated in FIG. 1E as comprising a substantially integral structure. After forming the second mask material 126, trenches 120 may be formed through the second mask material 126, the dielectric material 118, the first mask material 112, the semiconductive material 110, and the stack structure 105. In some embodiments, a trench 120 is formed in every other one of the dielectric materials 118 (e.g., in the Y-direction). FIG. 1E is a simplified partial perspective view of the microelectronic device structure 100; and FIG. 1F is a simplified partial cross-sectional view of the microelectronic device structure 100 of FIG. 1E taken through section line F-F of FIG. 1E.

In some embodiments, the trenches 120 are horizontally aligned (e.g., in the X-direction, in the Y-direction) to the dielectric material 118 such that portions of the dielectric material 118 remain on sidewalls of the semiconductive material 110 on each side (e.g., in the Y-direction) of the trenches 120 to leave spacers 122 comprising the dielectric material 118 on sidewalls of the semiconductive material 110. The spacers 122 may be referred to herein as "protective liner" spacers or a "protective liner material."

As described in further detail herein, the spacers 122 may substantially protect the semiconductive material 110 during fabrication of vertical stacks of memory cells (e.g., vertical stacks of memory cells 170 (FIG. 1W, FIG. 1X, FIG. 2A, FIG. 2B)) such that the semiconductive material 110 may be used to form one or more control logic devices of the microelectronic device structure 100 (e.g., multiplexers of the microelectronic device structure 100).

The second mask material 126 may be formed of and include one or more of the materials described above with reference to the first mask material 112. In some embodiments, the second mask material 126 comprises substantially the same material composition as the first mask material 112.

After forming the trenches 120, portions of the second material 108 may be selectively removed through the trenches 120 to form recesses 124 vertically between (e.g., in the Z-direction) vertically neighboring levels of the first material 106. In some embodiments, the second material 108 is selectively removed by exposing the second material 108 to one or both of a dry etch process (e.g., with one or more of sulfur hexafluoride ($SF_6$), hydrogen ($H_2$), carbon tetrafluoride ($CF_4$), hydrogen bromide (HBr), chlorine ($Cl_2$), and dichlorodifluoromethane ($CF_2Cl_2$)) or a wet etch process (e.g., with one or more quaternary ammonium compounds (e.g., one or more of ammonium hydroxide ($NH_4OH$), hydrogen peroxide ($H_2O_2$), water, acetic acid ($CH_3COOH$), hydrofluoric acid (HF), and nitric acid ($HNO_3$))). However, the disclosure is not so limited and the second material 108 may be selectively removed with materials and methods other than those described above.

FIG. 1G through FIG. 1I illustrate the microelectronic device structure 100 at a processing stage subsequent to that illustrated in FIG. 1E and FIG. 1F. FIG. 1G is a simplified partial perspective view of the microelectronic device structure 100; FIG. 1H is a simplified partial cross-sectional view of the microelectronic device structure 100 taken through section line H-H of FIG. 1G; and FIG. 1I is a simplified partial cross-sectional view of the microelectronic device structure 100 taken through section line I-I of FIG. 1G and section line I-I of FIG. 1H.

With combined reference to FIG. 1G and FIG. 1H, a vertical stack of access devices 130 may be formed vertically extending (e.g., in the Z-direction) through the stack structure 105. The vertical stack of access devices 130 may include vertically spaced (e.g., in the Z-direction) access devices 130, each formed within a level of the first material 106.

The access devices 130 may comprise doped portions of the first material 106 to form channel regions 132 (FIG. 1H). The channel regions 132 may be doped with one or more of at least one N-type dopant, such as one or more of arsenic ions, phosphorous ions, and antimony ions. In other embodiments, the channel regions 132 are doped with at least one P-type dopant, such as one or more of boron ions, aluminum ions, and gallium ions. In some embodiments, the channel regions 132 of the access devices 130 are horizontally between (e.g., in the X-direction, in the Y-direction) a source region and a drain region of the access devices 130. The access devices 130 vertically overlying (e.g., in the Z-direction) one another may form a vertical stack of access devices 130.

In some embodiments, conductive structures 134 vertically overlie (e.g., in the Z-direction) and vertically underlie (e.g., in the Z-direction) each of the access devices 130. By way of non-limiting example, the conductive structures 134 vertically overlie and vertically underlie the channel regions 132 of each of the access devices 130. Stated another way, in some embodiments, the channel regions 132 are vertically surrounded by the conductive structures 134. The conductive structures 134 may individually be referred to herein as "first conductive lines," "access lines," or "word lines." In some embodiments, vertically neighboring (e.g., in the Z-direction) conductive structures 134 between vertically neighboring (e.g., in the Z-direction) access devices 130 are spaced from each other by a third insulative material 128.

The conductive structures 134 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive structures 134 individually comprise tungsten. In other embodiments, the conductive structures 134 individually comprises titanium nitride or a combination of titanium nitride and tungsten. In yet other embodiments, the conductive structures 134 individually comprise copper.

The third insulative material 128 may be formed of and include an insulative material that is different than, and that has an etch selectivity with respect to, the first material 106. In some embodiments, the third insulative material 128 is formed of and includes one or more of the materials described above with reference to the first insulative material 104. In some embodiments, the third insulative material 128 is formed of and include an oxide material (e.g., silicon dioxide).

With continued reference to FIG. 1G and FIG. 1H, each of the access devices 130 is at least partially surrounded by a dielectric material 136, which may also be referred to herein as a "gate dielectric material." In some embodiments, the portion of the conductive structure 134 directly vertically neighboring (e.g., in the Z-direction) and located within horizontal boundaries (e.g., in the X-direction, in the Y-direction) of the dielectric material 136 may be referred to as a "gate electrode." In some embodiments, the conductive structures 134 are separated from the access devices 130 by the dielectric material 136.

The dielectric material 136 may be formed of and include insulative material. By way of non-limiting example, the dielectric material 136 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN))), or a dielectric carboxynitride material (e.g., silicon carboxynitride (SiOCN)). In some embodiments, the dielectric material 136 comprises a different material composition than the dielectric material 118 of the spacers 122.

Vertically neighboring (e.g., in the Z-direction) access devices 130 are spaced from one another by a fourth insulative material 138. In some embodiments, the fourth insulative material 138 surrounds at least a portion of the dielectric material 136 and horizontally intervenes (e.g., in the Y-direction) between the dielectric material 136 and the second material 108.

The fourth insulative material 138 may be formed of and include insulative material having an etch selectivity with respect to the second material 108. In some embodiments, the fourth insulative material 138 comprises a nitride material (e.g., silicon nitride ($Si_3N_4$)) or an oxynitride material (e.g., silicon oxynitride). In some embodiments, the fourth insulative material 138 comprises silicon nitride.

Conductive pillar structures 140 may vertically extend (e.g., in the Z-direction) through the trenches 120 within the microelectronic device structure 100. The conductive pillar structures 140 may also be referred to herein as "digit lines," "second conductive lines," "digit line pillar structures," "local digit lines," or "vertical digit lines." Each conductive pillar structure 140 vertically extends through the microelectronic device structure 100, such as through or horizontally neighboring (e.g., in the Y-direction) the vertical stack of access devices 130. In some embodiments, the conductive pillar structures 140 horizontally neighbor (e.g., in the Y-direction) a source region or a drain region of the access devices 130. In other embodiments, such as where the access devices 130 consist essentially of the channel regions 132 (and do not include, for example, a source region and a drain region), the conductive pillar structures 140 directly contact the channel region 132 of the access devices 130. The conductive pillar structures 140 are individually in contact with (and configured to be in electrical communication with, such as during use and operation) the access devices 130 of the vertical stack of access devices 130.

The conductive pillar structures 140 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 140 comprise tungsten.

As described in further detail herein, the conductive structures 134 may be configured to provide sufficient voltage to a channel region 132 of each of the access devices 130 during use and operation to electrically couple a storage device (e.g., storage device 165 (FIG. 1W, FIG. 1X, FIG. 2A, FIG. 2B)) horizontally neighboring (e.g., in the Y-direction) and associated with the access device 130 to, for example, a conductive pillar structure 140 vertically extending (e.g., in the Z-direction) through the microelectronic device structure 100 and in contact with the vertical stack of access devices 130. Stated another way, each conductive structure 134 may individually comprise a gate structure configured to provide a sufficient voltage to the channel region 132 vertically neighboring (e.g., in the Z-direction) the conductive structure 134 to electrically couple the access device 130 to a horizontally neighboring (e.g., in the Y-direction) storage device.

With continued reference to FIG. 1G and FIG. 1H, the conductive pillar structures 140 may each individually be in contact with conductive material 142 horizontally extending (e.g., in the Y-direction) from the conductive pillar structure 140 and vertically over (e.g., in the Z-direction) the second mask material 126.

The conductive material 142 may be formed of and include one or more of the materials described above with reference to the conductive pillar structures 140. In some embodiments, the conductive material 142 comprises substantially the same material composition as the conductive pillar structures 140. In some embodiments, each conductive pillar structure 140 is integral with one of the conductive materials 142.

In some embodiments, the access devices 130 are formed by selectively removing portions of the second insulative material 116 (FIG. 1E) through the trenches 120. In some embodiments, the second insulative material 116 is selectively removed with respect to, for example, the first material 106 and the second material 108.

The second insulative material 116 may selectively be removed by, for example, exposing the second insulative material 116 to one or more dry etchants, such as one or more of oxygen ($O_2$), carbon tetrafluoride ($CF_4$), and a mixture of $O_2$ and $CF_4$. However, the disclosure is not so limited and the second insulative material 116 may selectively be removed with one or more other materials.

After removing portions of the second insulative material 116, the fourth insulative material 138 may be formed over surfaces of the first material 106 and the vertically extending (e.g., in the Z-direction) surfaces of the second material 108 within the recesses 124. In some embodiments, the fourth insulative material 138 is formed as a liner material (e.g., does not substantially fill the recesses 124 and the trenches 120). The fourth insulative material 138 may be formed by, for example, ALD or CVD.

After forming the fourth insulative material 138, the third insulative material 128 may be formed over surfaces of the fourth insulative material 138 and within remaining portions of the recesses 124 (FIG. 1E, FIG. 1F) and the trenches 120. In some embodiments, the third insulative material 128 is formed by ALD.

After forming the fourth insulative material 138 and the third insulative material 128, portions of the third insulative material 128 may be removed (e.g., in the Y-direction) to expose portions of the fourth insulative material 138. In some embodiments, the exposed portions of the fourth insulative material 138 are selectively removed (e.g., in the Y-direction) to recess the fourth insulative material 138 relative to the third insulative material 128. In some embodiments, recessing the fourth insulative material 138 relative to the third insulative material 128 exposes portions of the first material 106. Exposed portions of the first material 106 may selectively be removed to vertically thin (e.g., in the Z-direction) the exposed portions of the first material 106.

By way of non-limiting example, the portions of the first material 106 may selectively be removed to vertically thin the first material 106 by exposing the first material 106 to one or both of a dry etch process (e.g., with one or more of sulfur hexafluoride ($SF_6$), hydrogen ($H_2$), and carbon tetrafluoride ($CF_4$)) or a wet etch process (e.g., with one or more quaternary ammonium compounds (e.g., one or more of benzyltrimethyl ammonium hydroxide ($C_{10}H_{17}NO$), methyltriethylammonium hydroxide ($C_7H_{19}NO$), ethyltrimethyl ammonium hydroxide (ETMAH) ($C_5H_{15}NO$), 2-hydroxyethyltrimethyl ammonium hydroxide (also referred to as "choline hydroxide") ($C_5H_{15}NO_2$), hexadecyltrimethyl ammonium hydroxide ($C_{19}H_{43}NO$)) and one or more amine compounds (e.g., one or more of N-methylethanolamine (NMEA) ($C_3H_9NO$), monoethanolamine (MEA) ($C_2H_7NO$), diethanolamine (DEA) ($C_4H_{11}NO_2$), triethanolamine (TEA) ($C_6H_{15}NO_3$), triisopropanolamine ($C_9H_{21}NO_3$), 2-(2-aminoethylamino) ethanol ($C_4H_{12}N_2O$), 2-(2-aminoethoxy) ethanol (AEE) ($C_4H_{11}NO_2$), N-ethyl ethanolamine ($C_4H_{11}NO$), N,N-dimethylethanolamine ($C_4H_{11}NO$), N,N-diethyl ethanolamine ($C_6H_{15}NO$), N-methyl diethanolamine (MDEA) ($C_5H_{13}NO_2$), N-ethyl diethanolamine ($C_6H_{15}NO_2$), cyclohexylaminediethanol ($C_{10}H_{21}N$), diisopropanolamine ($C_6H_{15}NO_2$). However, the disclosure is not so limited and the first material 106 may be vertically thinned with materials and methods other than those described above.

After vertically thinning the exposed portions of the first material 106, the dielectric material 136 is formed on surfaces of the first material 106, surfaces of the fourth insulative material 138, and surfaces of the third insulative material 128. In some embodiments, the dielectric material 136 is formed by ALD.

A conductive material may be formed over surfaces of the dielectric material 136 to form the conductive structures 134. In some embodiments, the conductive material is formed by ALD or CVD.

After forming the conductive material, portions of the conductive material may selectively be removed (e.g., in the Y-direction) with respect to, for example, the dielectric material 136, to form the conductive structures 134. In some embodiments, the conductive material is selectively removed by exposing the conductive material to, for example, one or more wet etchants (e.g., one or more of ammonium hydroxide and hydrogen peroxide) or one or more dry etchants (e.g., one or more of chlorine, nitrogen trifluoride, and thionyl chloride ($SOCl_2$)).

With continued reference to FIG. 1G and FIG. 1H, after forming the conductive structures 134, additional portions of the fourth insulative material 138 may be formed horizontally neighboring the conductive structures 134 and on surfaces of the dielectric material 136.

Portions of the fourth insulative material 138, the third insulative material 128, and the dielectric material 136 on upper surfaces of the second mask material 126 may be removed, such as by exposing the microelectronic device structure 100 to a CMP process.

In some embodiments, surfaces of the first material 106 exposed through the trenches 120 are doped to form the access devices 130 comprising the channel regions 132. In some embodiments, the first material 106 is exposed to one or more N-type dopants, such as one or more of arsenic ions, phosphorous ions, and antimony ions or one or more P-type dopants, such as one or more of boron ions, aluminum ions, and gallium ions to form the channel regions 132. In some embodiments, the channel regions 132 are positioned vertically between (e.g., in the Z-direction) vertically neighboring conductive structures 134. In some embodiments, the channel regions 132 are located within horizontal boundaries (e.g., in the X-direction, in the Y-direction) of the conductive structures 134.

Referring to FIG. 1G, in some embodiments, the spacers 122 horizontally extend (e.g., in the X-direction) between multiple conductive pillar structures 140 and vertically overlie (e.g., in the Z-direction) multiple vertical stacks of access devices 130.

Referring now to FIG. 1I, each of the access devices 130 is substantially surrounded by the dielectric material 136 that is, in turn, substantially surrounded by the conductive structure 134. In some such embodiments, the access devices 130 individually comprise so-called "gate all around" access devices (e.g., gate all around transistors) since each of the access devices 130 is individually substantially surrounded by one of the conductive structures 134.

With continued reference to FIG. 1I, in some embodiments, the dielectric material 136 is also located on surfaces of the conductive structures 134 and between the conductive structures 134 and the third insulative material 128. Portions of the dielectric material 136 on surfaces of the third insulative material 128 may not be referred to as a "gate dielectric" material.

Still referring to FIG. 1I, the conductive structures 134 may horizontally extend (e.g., in the X-direction) as lines and may horizontally terminate (e.g., in the X-direction) at steps 145 of staircase structures 144 formed at horizontal ends (e.g., in the X-direction) of the conductive structures 134 and within a fifth insulative material 146. The steps 145 may each individually be at least partially defined by horizontal (e.g., in the X-direction) edges of the conductive structures 134. The staircase structures 144 are not illustrated in the perspective view of FIG. 1G for clarity and ease of understanding the description.

The fifth insulative material 146 may be formed of and include insulative material, such as one or more of the materials described above with reference to the first insulative material 104. In some embodiments, the fifth insulative material 146 comprises silicon dioxide.

Vertically higher (e.g., in the Z-direction) conductive structures 134 may have a smaller horizontal dimension (e.g., in the X-direction) than vertically lower conductive structures 134, such that horizontal edges of the conductive structures 134 at least partially define the steps 145 of the staircase structures 144.

The quantity of the steps 145 of the staircase structures 144 may correspond to the quantity of the levels of memory cells (e.g., memory cells 170 (FIG. 1W, FIG. 1X, FIG. 2A, FIG. 2B)) of vertical stacks of the memory cells to be formed in the microelectronic device structure 100. Although FIG. 1I illustrates that the staircase structures 144 individually comprise a particular number (e.g., four (4)) of steps 145, the disclosure is not so limited. In other embodiments, the staircase structures 144 each individually include a desired quantity of the steps 145, such as within a range from thirty-two (32) of the steps 145 to two hundred fifty-six (256) of the steps 145. In some embodiments, the staircase structures 144 each individually include sixty-four (64) of the steps 145. In other embodiments, the staircase structures 144 each individually include ninety-six (96) or more of the steps 145. In other embodiments, the staircase structures 144 each individually include a different number of the steps 145, such as less than sixty-four (64) of the steps 145; or greater than sixty-four (64) of the steps 145.

In some embodiments, the staircase structures 144 each individually include the same quantity of the steps 145. In some such embodiments, staircase structures 144 formed from the same conductive structures 134 include the same quantity of the steps 145. In some embodiments, each step 145 of each staircase structure 144 may be vertically offset (e.g., in the Z-direction) from a vertically neighboring step 145 of the staircase structure 144 by one level (e.g., one tier) of the vertically alternating conductive structures 134 and the vertically intervening (e.g., in the Z-direction) dielectric material 136 and third insulative material 128. In some such embodiments, every conductive structure 134 of a vertical stack structure 135 of conductive structures 134 may comprise a step 145 at each horizontal end (e.g., in the X-direction) of the staircase structures 144. In other embodiments, vertically neighboring (e.g., in the Z-direction) steps 145 of a staircase structure 144 on a first horizontal size (e.g., in the X-direction) of a vertical stack structure 135 of conductive structures 134 may be vertically offset (e.g., in the Z-direction) by two levels (e.g., two tiers) of the vertically alternating conductive structures 134 and the vertically intervening dielectric material 136 and third insulative material 128. In some such embodiments, the steps 145 of each staircase structure 144 are formed of every other conductive structure 134 of a vertical stack structure 135 of conductive structures 134 and the steps 145 of staircase structures 144 at horizontally opposing ends (e.g., in the X-direction) of the same vertical stack structure 135 of conductive structures 134 may be defined by conductive structures 134 that are vertically spaced (e.g., in the Z-direction) from one another by one level of a conductive structure 134 and the vertically intervening dielectric material 136 and third insulative material 128.

With continued reference to FIG. 1I, first conductive contact structures 148 may be formed to be in contact with (and in electrical communication with, such as during use and operation) individual steps 145 of the staircase structures 144 and pad structures 150 may be formed in contact with the first conductive contact structures 148. The first conductive contact structures 148 may be in contact with individual conductive structures 134 at the steps 145. For example, the first conductive contact structures 148 may individually physically contact (e.g., land on) portions of upper (e.g., in the Z-direction) surfaces of the conductive structures 134 at least partially defining treads of the steps 145. In some embodiments, every other step 145 of each staircase structure 144 may be in contact with a first conductive contact structure 148. In some such embodiments, each vertical stack structure 135 of conductive structures 134 includes one staircase structure 144 at each horizontal (e.g., in the X-direction) end thereof and every other step 145 of each staircase structure 144 is individually in contact with a first conductive contact structure 148. Each conductive structure 134 of a first staircase structure 144 at a first horizontal end of the vertical stack of conductive structures 134 not in contact with a first conductive contact structure 148 may individually be in contact with a first conductive contact structure 148 at steps 145 of a second staircase structure 144 at a second, opposite horizontal end of the vertical stack structure 135 of conductive structures 134. In other embodiments, each step 145 of each staircase structure 144 may be in contact with a first conductive contact structure 148 at the horizontal (e.g., in the X-direction) end of the staircase structure 144.

The first conductive contact structures 148 and the pad structures 150 may individually be formed of and include conductive material, such as one or more of the materials described above with reference to the conductive structures 134. In some embodiments, the first conductive contact structures 148 and the pad structures 150 comprise substantially the same material composition as the conductive structures 134. In other embodiments, the first conductive contact structures 148 and the pad structures 150 comprise a different material composition than the conductive structures 134. In some embodiments, the first conductive contact structures 148 and the pad structures 150 individually comprise tungsten.

Referring now to FIG. 1J and FIG. 1K, a sixth insulative material 154 is formed within remaining portions of the trenches 120 (FIG. 1G, FIG. 1H) to electrically isolate the horizontally spaced (e.g., in the X-direction, in the Y-direction) conductive pillar structures 140. The sixth insulative material 154 may be formed of and include insulative material, such as one or more of the materials described above with reference to the first insulative material 104. In some embodiments, the sixth insulative material 154 comprises silicon dioxide.

A third mask material 156 is formed vertically (e.g., in the Z-direction) over surfaces of the microelectronic device structure 100, such as over surfaces of the second mask material 126. The third mask material 156 may be formed of and include one or more of the materials described above with reference to the first mask material 112. In some embodiments, the third mask material 156 comprises substantially the same material composition as the first mask material 112.

With continued reference to FIG. 1J and FIG. 1K, after forming the third mask material 156, trenches 158 are formed through the third mask material 156, the second mask material 126, the first mask material 112, the semiconductive material 110, and the stack structure 105. The trenches 158 horizontally extend in a first horizontal direction (e.g., in the X-direction) and are horizontally spaced from the access devices 130 in a second horizontal direction (e.g., in the Y-direction). In some embodiments, the trenches 158 are substantially parallel to the trenches 120 (FIG. 1E, FIG. 1F) through which the vertical stacks of access devices 130 are formed. The trenches 158 may be formed through the dielectric material 118 through which the trenches 120 (FIG. 1E, FIG. 1F) and the access devices 130 (FIG. 1G, FIG. 1H) were not formed during previous processing acts.

As described above with reference to the trenches 120 (FIG. 1E, FIG. 1F), the trenches 158 are horizontally aligned (e.g., in the X-direction, in the Y-direction) to the dielectric material 118 such that portions of the dielectric material 118 remain on sidewalls of the semiconductive material 110 on each side (e.g., in the Y-direction) of the trenches 158 to leave additional spacers 123 comprising the dielectric material 118 on sidewalls of the semiconductive material 110. The additional spacers 123 may be referred to herein as "protective liner" spacers or a "protective liner material" and may be substantially similar to the spacers 122 vertically overlying (e.g., in the Z-direction) the vertical stacks of access devices 130.

As described in further detail herein, the additional spacers 123 may substantially protect the semiconductive material 110 during fabrication of vertical stacks of memory cells (e.g., vertical stacks of memory cells 170 (FIG. 1W, FIG. 1X, FIG. 2A, FIG. 2B)) such that the semiconductive material 110 may be used to form one or more control logic devices of the microelectronic device structure 100 (e.g., multiplexer drivers of the microelectronic device structure 100). For example, the additional spacers 123 may substantially protect the semiconductive material 110 during various wet etching and dry etching processes during formation of the vertical stacks of memory cells.

With continued reference to FIG. 1J and FIG. 1K, after forming the trenches 158, exposed portions of the first material 106 may be removed through the trenches 158 to form recesses 159. The first material 106 may selectively be removed relative to the second material 108. In some embodiments, the first material 106 is selectively removed by exposing the first material 106 to one or both of a dry etch process (e.g., with one or more of $SF_6$, $H_2$, and $CF_4$) or a wet etch process (e.g., with one or more quaternary ammonium compounds (e.g., one or more of $C_{10}H_{17}NO$, $CH_{19}NO$, $C_5H_{15}NO$ (ETMAH), $C_5H_{15}NO_2$, $C_{19}H_{43}NO$) and one or more amine compounds (e.g., one or more of $C_3H_9NO$ n(NMEA), $C_2H_7NO$ (MEA), $C_4H_{11}NO_2$ (DEA), $C_6H_{15}NO_3$, $C_9H_{21}NO_3$, $C_4H_{12}N_2O$, $C_4H_{11}NO_2$, $C_4H_{11}NO$, $C_4H_{11}NO$, $C_6H_{15}NO$, $C_5H_{13}NO_2$ (MDEA), $C_6H_{15}NO_2$, $C_{10}H_{21}N$, $C_6H_{15}NO_2$. However, the disclosure is not so limited and the first material 106 may be selectively removed with materials and methods other than those described above. In some embodiments, removal of the first material 106 may remove portions of the second material 108 to form recesses 159 having a larger vertical dimension (e.g., in the Z-direction) than the first material 106.

FIG. 1L is a simplified partial cross-sectional view of the microelectronic device structure 100 at a processing stage subsequent to the one illustrated in FIG. 1J and FIG. 1K. FIG. 1L illustrates the same cross-sectional view of the microelectronic device structure 100 as that illustrated in FIG. 1K at a processing stage subsequent to that illustrated in FIG. 1K. With reference to FIG. 1L, after removal of the portions of the first material 106 and the second material 108 through the trenches 158 to form the recesses 159, a first electrode material 160 may be formed on exposed surfaces within the trenches 158 and the recesses 159, such as on exposed surfaces of the second material 108, the access devices 130 (e.g., exposed surfaces of the first material 106, such as the channel region 132 of the access devices 130), and a portion of the fourth insulative material 138. In some embodiments, the first electrode material 160 is formed by deposition, such as by ALD.

The first electrode material 160 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity.

FIG. 1M is a simplified cross-sectional view of the microelectronic device structure 100 at a processing stage after that illustrated in FIG. 1L. FIG. 1M illustrates the same cross-section as that illustrated in FIG. 1L, but at a processing stage subsequent to that illustrated in FIG. 1L. With reference to FIG. 1L, after forming the first electrode material 160 in the trenches 158 and the recesses 159, portions of the first electrode material 160 may be removed. For example, vertically extending (e.g., in the Z-direction) portions of the first electrode material 160 on surfaces of the additional spacers 123, of the first insulative material 104, and vertically extending (e.g., in the Z-direction) portions of the second material 108 may selectively be removed. In some embodiments, portions of the first electrode material 160 form surfaces of the additional spacers 123.

After removing the portions of the first electrode material 160, a dielectric material 162 may be formed on exposed surfaces within the trenches 158 and the recesses 159, such as on exposed surfaces of the first insulative material 104, the first electrode material 160, the fourth insulative material 138, and the additional spacers 123. In some embodiments, the dielectric material 162 is formed by deposition, such as by ALD.

The dielectric material 162 may be formed of and include one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-k dielectric material.

With reference to FIG. 1N, which illustrates the same cross-section as FIG. 1M at a later processing stage than that illustrated in FIG. 1M, after forming the dielectric material 162 a second electrode material 164 may be formed on surfaces of the dielectric material 162 within the trenches 158 and the recesses 159 to form storage devices 165, each individually comprising the first electrode material 160, the second electrode material 164, and the dielectric material 162 between the first electrode material 160 and the second electrode material 164. Accordingly, each of the storage devices 165 individually comprises a first electrode material 160 (also referred to herein as "a first electrode," "an outer electrode," "a first electrode plate," or a "first node structure"), a second electrode material 164 (also referred to herein as "a second electrode," "an inner electrode," "a second electrode plate," or a "second node structure"), and a dielectric material 162 between the first electrode 160 and the second electrode 164. In some such embodiments, the storage devices 165 individually comprise capacitors. However, the disclosure is not so limited and in other embodiments, the storage devices 165 may each individually comprise other structures, such as, for example, phase change memory (PCM), resistance random-access memory (RRAM), conductive-bridging random-access memory (conductive bridging RAM), or another structure for storing a logic state.

In some embodiments, each access device 130 of the vertical stacks of access devices 130 is horizontally neighbored (e.g., in the Y-direction) by a storage device 165 of a corresponding vertical stack of storage devices 165 to form a vertical stack of memory cells 170. Each memory cell 170 comprises one of the storage devices 165 in contact with a horizontally neighboring access device 130. For example, the first electrode material 160 of the storage device 165 may contact the access device 130. In some embodiments, each memory cell 170 comprises a dynamic random access memory (DRAM) cell. Each memory cell 170 individually comprises a storage device 165 horizontally neighboring an access device 130 of the same level. Accordingly, the vertical stack of memory cells 170 comprises vertically neighboring (e.g., in the Z-direction) levels of memory cells 170, each level of memory cells 170 comprising an access device 130 and a horizontally neighboring storage device 165. In other words, each vertical stack of memory cells 170 comprises vertically spaced (e.g., in the Z-direction) levels of memory cells 170, each vertical level of each vertical stack of memory cells 170 comprising a vertical level of a vertical stack of access devices 130 and a vertical level of a vertical stack of storage devices 165. Stated another way, each vertical stack of memory cells 170 comprises a vertical stack of access devices 130 and a vertical stack of storage devices 165, the storage devices 165 of the vertical stack of storage devices 165 coupled to the access devices 130 of the vertical stack of access devices 130. The vertical stack of access devices 130 may horizontally neighbor (e.g., in the X-direction) the vertical stack of storage devices 165.

In some embodiments, the additional spacers 123 horizontally extend (e.g., in the Y-direction) between and vertically over (e.g., in the Z-direction) multiple vertical stacks of storage devices 165.

The second electrode material 164 may be formed by a material deposition process, such as by ALD. The second electrode material 164 may be formed of and include conductive material, such as one or more of the materials described above with reference to the first electrode material 160. In some embodiments, the second electrode material 164 comprises one or more of the materials described above with reference to the first electrode material 160. In some embodiments, the second electrode material 164 comprises substantially the same material composition as the first electrode material 160.

FIG. 1O and FIG. 1P are respectively simplified partial perspective view and a simplified partial cross-sectional view of the microelectronic device structure 100 at a processing stage subsequent to that illustrated in FIG. 1N. FIG. 1P is a simplified partial cross-sectional view of the microelectronic device structure 100 taken through section line P-P of FIG. 1O.

With collective reference to FIG. 1O and FIG. 1P, after forming the second electrode material 164 and forming the memory cells 170 comprising the storage devices 165 and the access devices 130, a conductive plate structure 166 may be formed within remaining portions of the trenches 158 (FIG. 1N) and on surfaces of the second electrode material 164.

The conductive plate structures 166 may individually be in contact with the second electrode materials 164 of storage devices 165 of horizontally neighboring vertical stacks of storage devices 165 of horizontally neighboring vertical stacks of memory cells 170. Accordingly, each of the storage devices 165 of the vertical stack of storage devices 165 may be in contact with a conductive plate structure 166 vertically extending (e.g., in the Z-direction) through the microelectronic device structure 100.

The second electrode material 164 may be in contact with one of the conductive plate structures 166 of a vertical stack of memory cells 170. In some embodiments, the second electrode materials 164 are substantially integral with the conductive plate structures 166. In some embodiments, the second electrode materials 164 of horizontally neighboring (e.g., in the Y-direction) vertical stacks of storage devices 165 of the vertical stacks of memory cells 170 are in contact with the same conductive plate structure 166. In some embodiments, and with reference to FIG. 2A, the second electrode materials 164 of horizontally neighboring (e.g., in the X-direction) vertical stacks of storage devices 165 that directly horizontally neighbor (e.g., in the X-direction) one another and are not separated by, for example, an access device 130, are in contact with the same conductive plate structure 166.

In some embodiments, the conductive plate structures 166 are individually formed of conductive material, such as one or more of the materials of the second electrode material 164. In some embodiments, the conductive plate structures

166 comprise substantially the same material composition as the second electrode material 164. In some such embodiments, the conductive plate structures 166 are formed substantially concurrently with formation of the second electrode material 164, which may be formed by, for example, CVD. In other embodiments, the conductive plate structures 166 comprise a different material composition than the second electrode material 164.

Figure 2A:
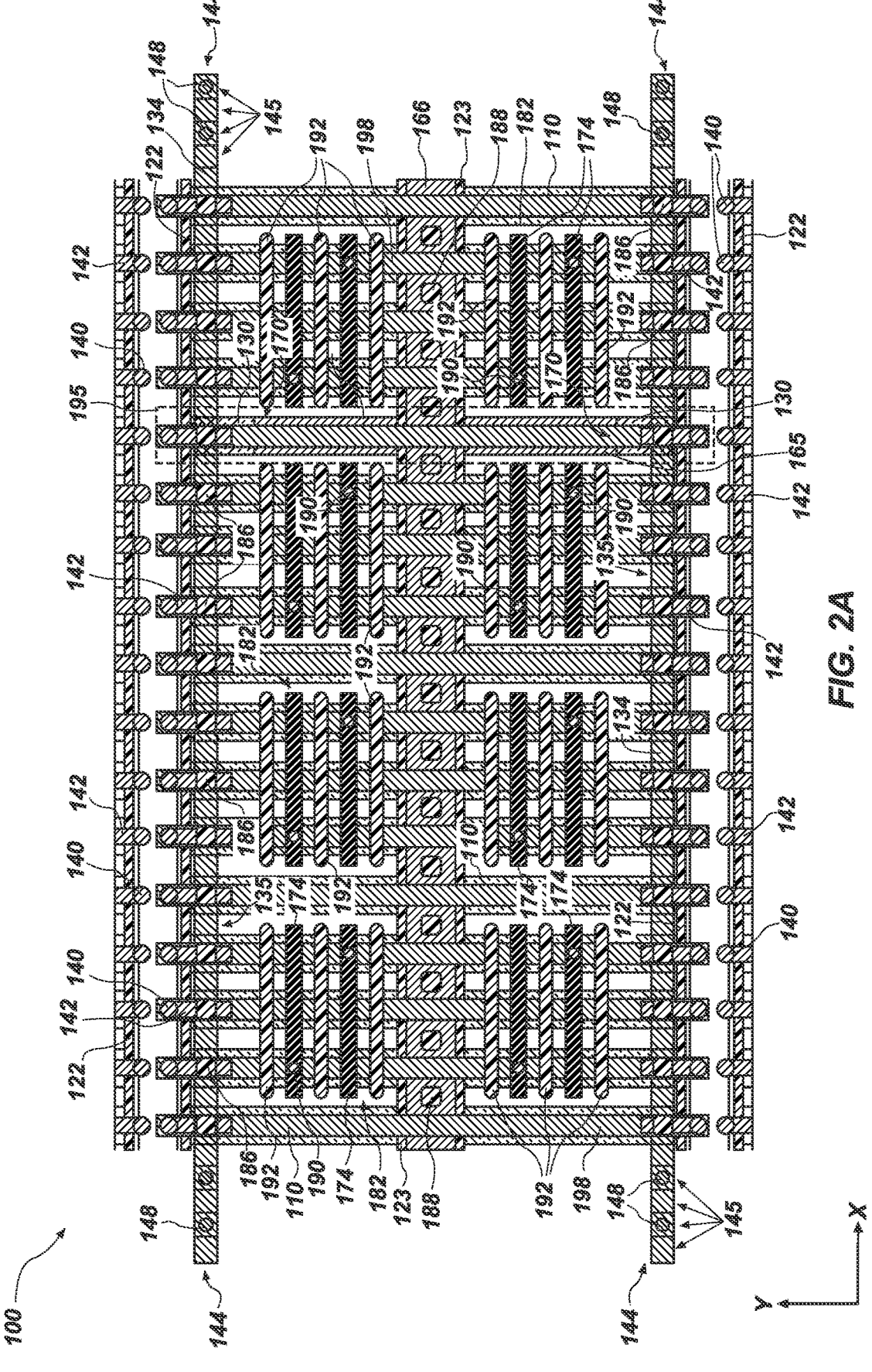
FIG. 2A and FIG. 2B are a simplified partial top-down view (FIG. 2A) and a simplified partial cross-sectional view (FIG. 2B) of the microelectronic device structure at a processing stage subsequent to that of FIG. 1W through FIG. 1Y, in accordance with embodiments of the disclosure.

The conductive plate structures 166 may be referred to herein as "conductive plates" or "ground structures." With reference to FIG. 2A, in some embodiments, the conductive plate structures 166 horizontally extend (e.g., in the X-direction) as conductive plates. In some embodiments, the conductive plate structures 166 horizontally extend in substantially the same direction and are substantially parallel to the conductive structures 134. Referring to FIG. 2A, the conductive plate structures 166 may be horizontally between (e.g., in the Y-direction) vertical stacks of memory cells 170, such as between vertical stacks of storage devices 165.

FIG. 1Q and FIG. 1R are respectively a simplified partial perspective view and a simplified partial cross-sectional view of the microelectronic device structure 100 at a processing stage subsequent to that illustrated in FIG. 1O and FIG. 1P. FIG. 1R is a simplified partial cross-sectional view of the microelectronic device structure 100 taken through section line R-R of FIG. 1Q.

With collective reference to FIG. 1Q and FIG. 1R, a seventh insulative material 168 is formed over surfaces of the microelectronic device structure 100, such as over surfaces of the third mask material 156. Trenches 169 are formed through the seventh insulative material 168, the third mask material 156, the second mask material 126, and the first mask material 112 to expose surfaces of the semiconductive material 110. With reference to FIG. 1Q, in some embodiments, the trenches 169 extend in a horizontal direction (e.g., in the X-direction) substantially parallel to the conductive structures 134.

The seventh insulative material 168 may be formed of and include insulative material, such as one or more of the materials described above with reference to the first insulative material 104. In some embodiments, the seventh insulative material 168 comprises silicon dioxide.

FIG. 1S and FIG. 1T are respectively a simplified partial perspective view and a simplified partial cross-sectional view of the microelectronic device structure 100 at a processing stage subsequent to that illustrated in FIG. 1Q and FIG. 1R. FIG. 1T is a simplified partial cross-sectional view of the microelectronic device structure 100 taken through section line T-T of FIG. 1S.

With collective reference to FIG. 1S and FIG. 1T, a dielectric material 172 may be formed within the trenches 169 (FIG. 1Q, FIG. 1R) and on surfaces of the semiconductive material 110 and vertically extending (e.g., in the Z-direction) surfaces of the first mask material 112, the second mask material 126, the third mask material 156, and the seventh insulative material 168. After forming the dielectric material 172, a conductive material 174 may be formed within remaining portions of the trenches 169 and over surfaces of the dielectric material 172.

The dielectric material 172 may be referred to herein as a "gate dielectric material." The dielectric material 172 may be formed of and include one or more of the materials described above with reference to the dielectric material 136. By way of non-limiting example, the dielectric material 172 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN))), or a dielectric carboxynitride material (e.g., silicon carboxynitride (SiOCN)).

The conductive material 174 may be referred to herein as a "gate electrode" material. The conductive material 174 may be formed of and include conductive material, such as one or more of the materials described above with reference to the conductive structures 134. By way of non-limiting example, the conductive material 174 may be formed of and include one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive material 174 comprises tungsten. In other embodiments, the conductive material 174 comprises titanium nitride or a combination of titanium nitride and tungsten. In yet other embodiments, the conductive material 174 comprises copper.

After forming the dielectric material 172 and the conductive material 174, portions of the conductive material 174 vertically overlying surfaces of the microelectronic device structure 100 may be removed, such as by CMP. In some embodiments, the dielectric material 172 may vertically overlie (e.g., in the Z-direction) the microelectronic device structure 100, such as surfaces of the seventh insulative material 168.

In some embodiments, prior to forming the dielectric material 172 and the conductive material 174, the exposed portions of the semiconductive material 110 are exposed to one or more ion implantation processes to dope at least the exposed portions to the semiconductive material 110. By way of non-limiting example, the exposed portions of the semiconductive material 110 may be doped with one or more N-type dopants (e.g., one or more of arsenic ions, phosphorous ions, and antimony ions) and one or more P-type dopants (e.g., boron ions, aluminum ions, gallium ions).

FIG. 1U is a simplified perspective view of the microelectronic device structure 100 at a processing stage subsequent to that illustrated in FIG. 1S and FIG. 1T. FIG. 1V is a simplified partial cross-sectional view of the microelectronic device structure 100 of FIG. 1U taken through section line V-V of FIG. 1U.

With collective reference to FIG. 1U and FIG. 1V, an eighth insulative material 178 may be formed over the microelectronic device structure 100 and over surfaces of the dielectric material 172 and the conductive material 174. The eighth insulative material 178 may be formed of and include insulative material, such as one or more of the materials described above with reference to the first insulative material 104. In some embodiments, the eighth insulative material 178 comprises silicon dioxide.

In some embodiments, contact openings 175 are formed through portions of the microelectronic device structure 100 to expose one or more components of the microelectronic device structure 100. Some of the contact openings 175 expose the conductive material 142 in contact with the conductive pillar structures 140 and vertically extend (e.g., in the Z-direction) through the eighth insulative material 178, the dielectric material 172, the seventh insulative material 168, and at least a portion of the third mask material 156. Additional ones of the contact openings 175 expose the conductive plate structure 166 and vertically extend (e.g., in the Z-direction) through, for example, the eighth insulative material 178, the dielectric material 172, and the seventh insulative material 168. The contact opening 175 vertically overlying and within horizontal boundaries (e.g., in the Y-direction) of the conductive plate structure 166 is illustrated in broken lines to indicate that it is located in a different plane than at illustrated in FIG. 1V. At least some of the contact openings 175 vertically extend (e.g., in the Z-direction) through the eighth insulative material 178 and expose at least a portion of the conductive material 174.

With continued reference to FIG. 1U and FIG. 1V, trenches 177 may be formed through the eighth insulative material 178, the dielectric material 172, the seventh insulative material 168, the third mask material 156, the second mask material 126, and the first mask material 112 to expose surfaces of the semiconductive material 110 horizontally neighboring (e.g., in the Y-direction) the conductive material 174 and the dielectric material 172. In some embodiments, each of the conductive materials 174 is horizontally neighbored (e.g., in the Y-direction) by one of the trenches 177. In some embodiments, the trenches 177 individually extend in a horizontal direction (e.g., in the X-direction) substantially parallel to the conductive structures 134.

In some embodiments, exposed portions of the semiconductive material 110 are exposed to one or more ion implantation processes to dope at least the exposed portions of the semiconductive material 110 with one or more N-type dopants (e.g., one or more of arsenic ions, phosphorous ions, and antimony ions) and one or more P-type dopants (e.g., boron ions, aluminum ions, gallium ions) and form conductively doped regions 180 of transistor structures 185 (FIG. 1V).

The conductively doped regions 180 may include source regions 180A and drain regions 180B, collectively referred to as the conductively doped regions 180. In some embodiments, the conductively doped regions 180 comprise conductively doped silicon (e.g., silicon doped with one or more N-type dopants or one or more P-type dopants). In some embodiments, the source regions 180A are horizontally between (e.g., in the Y-direction) drain regions 180B. In some embodiments, each of the conductive materials 174 (e.g., the gate electrodes) horizontally intervene (e.g., in the Y-direction) between one of the source regions 180A and one of the drain regions 180B.

Each of the transistor structures 185 may include one of the source regions 180A and one of the drain regions 180B. Channel regions of the transistor structures 185 may be horizontally interposed between the conductively doped regions 180.

In some embodiments, the source region 180A of one of the transistor structures 185 is shared with the horizontally neighboring (e.g., in the Y-direction) transistor structure 185. Stated another way, each transistor structures 185 comprises a source region 180A that is shared with a source region 180A of the horizontally neighboring transistor structure 185. In other words, the source region 180A of a first transistor structures 185 comprises the source region 180A of a horizontally neighboring second transistor structure

185. The horizontally neighboring transistor structures 185 may be referred to as "shared source" transistors.

In some embodiments, the transistor structures 185 comprise multiplexer transistors and individually comprise a gate structure 182 comprising the conductive material 174. In some such embodiments, the gate structures 182 comprise multiplexer gates. The gate structures 182 of horizontally neighboring transistor structures 185 may extend in a horizontal direction (e.g., in the X-direction) and may be substantially parallel to one another. In some embodiments, each of the gate structures 182 is horizontally aligned (e.g., in the Y-direction) with and shared by the channel regions of multiple transistor structures 185 horizontally neighboring (e.g., in the X-direction (FIG. 1A)) one another. In some such embodiments, and as illustrated in FIG. 2A, the gate structures 182 extend in a first horizontal direction (e.g., in the X-direction).

In some embodiments, two transistor structures 185 (e.g., a pair of transistor structures 185) horizontally intervene (e.g., in the Y-direction) between the conductive plate structure 166 and a horizontally neighboring conductive pillar structure 140 and the two transistor structures 185 share a source region 180A. In some such embodiments, horizontally neighboring (e.g., in the Y-direction) conductive pillar structures 140 that are spaced by the conductive plate structure 166 are spaced from each other by four of the transistor structure 185.

Referring still to FIG. 1V, a vertical stack of memory cells 170 is illustrated in box 184 and comprises a vertical stack of the access devices 130, each access device 130 of the vertical stack of access devices 130 in contact with a storage device 165 of a vertical stack of storage devices 165 (e.g., in contact with the first electrode material 160 of the storage devices 165). In some embodiments, two transistor structures 185 (e.g., a pair of transistor structures 185) vertically overlie (e.g., in the Z-direction) each vertical stack of memory cells 170. The two transistor structures 185 may share a source region 180A.

Although each of the transistor structures 185 has been described as comprising a multiplexer, the disclosure is not so limited. In some embodiments, at least some of the transistor structures 185 (e.g., one-half of the transistor structures 185) comprise so-called "bleeder" transistors 185B (also referred to as "leaker" transistors). In some such embodiments, each transistor structure 185 comprising a multiplexer horizontally neighbors (e.g., in the Y-direction) a transistor structure 185 comprising a bleeder transistor.

FIG. 1W through FIG. 1Y illustrate the microelectronic device structure 100 at a processing stage subsequent to that illustrated in FIG. 1U and FIG. 1V. FIG. 1W is a simplified partial perspective view of the microelectronic device structure 100; FIG. 1X is a simplified partial cross-sectional view of the microelectronic device structure 100 of FIG. 1W taken through section line X-X and illustrating the same cross-sectional view illustrated in FIG. 1V but at a processing stage subsequent to that illustrated in FIG. 1V; and FIG. 1Y is a simplified partial cross-sectional view of the microelectronic device structure 100 taken through section line Y-Y of FIG. 1W.

With collective reference to FIG. 1W and FIG. 1X, the contact openings 175 (FIG. 1V, FIG. 1U) may be filled with conductive material to form second conductive contact structures 186 in contact with (and configured to be in electrical communication with) the conductive pillar structures 140, such as by means of the conductive material 142; third conductive contact structures 188 in contact with the conductive plate structures 166; and gate contact structures 190 in contact with the conductive material 174 of the transistor structures 185. With continued reference to FIG. 1W and FIG. 1X, the trenches 177 (FIG. 1V, FIG. 1U) may be filled with conductive material to form fourth conductive contacts 192 in contact with the source regions 180A and the drain regions 180B of the transistor structures 185.

With reference to FIG. 1W and FIG. 1X, in some embodiments, the gate contact structures 190 are horizontally offset (e.g., in the X-direction, in the Y-direction) from each other. In some embodiments, a first gate contact structure 190 on a first horizontal side (e.g., in the Y-direction) of the source region 180A is horizontally offset (e.g., in the X-direction and in the Y-direction) from a second gate contact structure 190 on a second horizontal side (e.g., in the Y-direction) of the source region 180A.

Each of the second conductive contact structures 186, the third conductive contact structures 188, the gate contact structures 190, and the fourth conductive contact structures 192 may individually be formed of and include conductive material, such as one or more of the materials described above with reference to the first conductive contact structures 148. In some embodiments, each of the second conductive contact structures 186, the third conductive contact structures 188, the gate contact structures 190, and the fourth conductive contact structures 192 individually comprise tungsten. In other embodiments, each of the second conductive contact structures 186, the third conductive contact structures 188, the gate contact structures 190, and the fourth conductive contact structures 192 individually comprise copper.

FIG. 1Y is a simplified partial cross-sectional view of the microelectronic device structure 100 taken through section line Y-Y of FIG. 1W. In some embodiments, the fourth conductive contact structures 192 horizontally extend (e.g., in the X-direction) and contact horizontally neighboring (e.g., in the X-direction) drain regions 180B and source regions 180A (not illustrated in the cross-sectional view of FIG. 1Y). In some such embodiments, the fourth conductive contact structures 192 may provide a conductive path between horizontally neighboring (e.g., in the X-direction) drain regions 180B and source regions 180A (not illustrated in the cross-sectional view of FIG. 1Y).

Figure 2B:
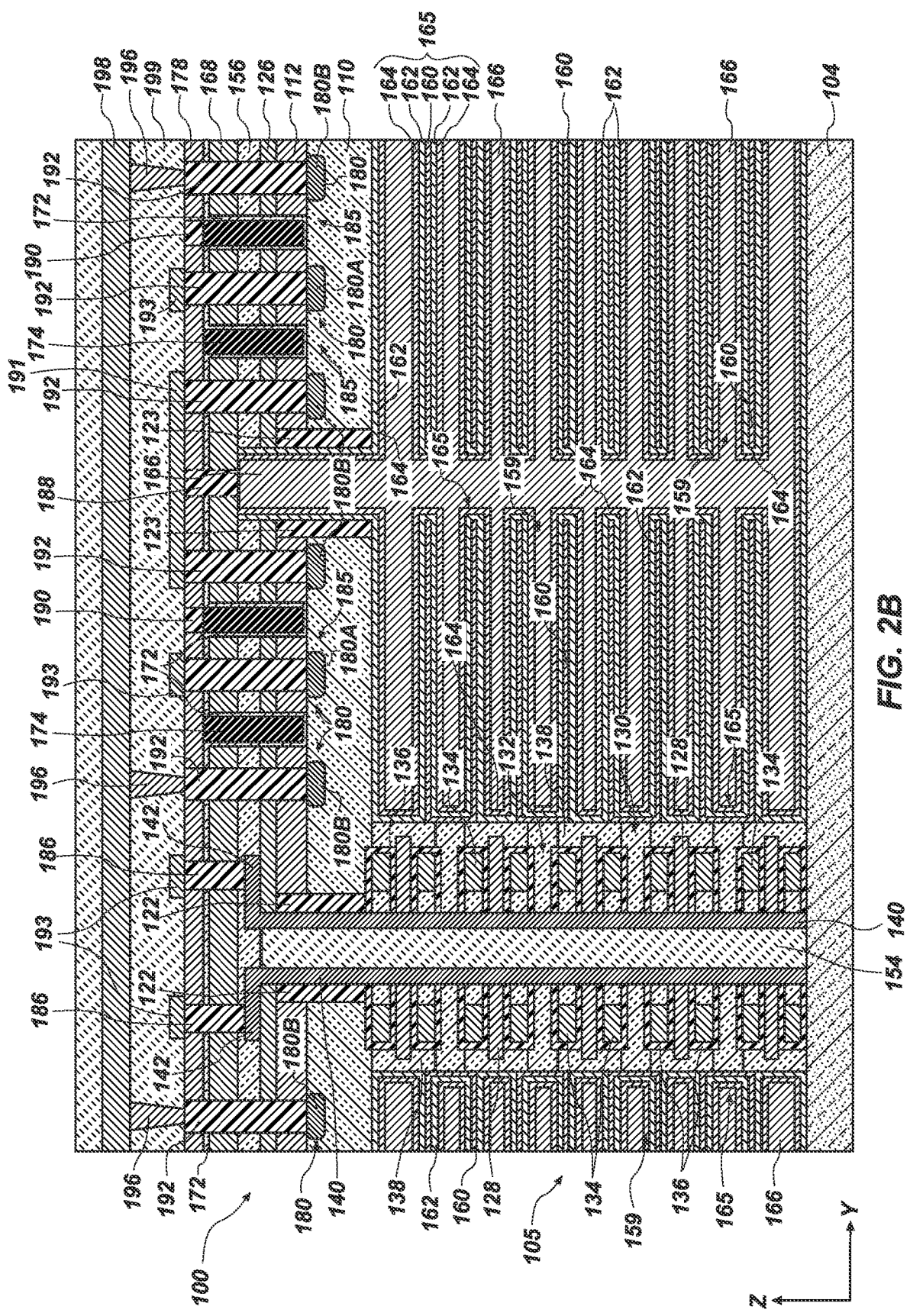

FIG. 2A is a simplified partial top-down view of the microelectronic device structure 100 at a processing stage subsequent to that illustrated in FIG. 1W through 1Y. FIG. 2B is a simplified partial cross-sectional view of the microelectronic device structure 100 illustrating the same cross-sectional view illustrated in FIG. 1X but at a processing stage subsequent to that illustrated in FIG. 1X. FIG. 2A illustrates the relative location of different components of the microelectronic device structure 100 with respect to each other. It will be understood that although one or more materials may vertically overlie (e.g., in the Z-direction) one or more additional materials or structures of the microelectronic device structure 100, at least some portions of the microelectronic device structure 100 vertically underlying (e.g., in the Z-direction) the vertically uppermost surface of the microelectronic device structure 100 are illustrated in FIG. 2A to more clearly illustrate the relative location of different materials of the microelectronic device structure 100. For clarity and ease of understanding the description, some features of the microelectronic device structure 100 are not illustrated in FIG. 2A.

With collective reference to FIG. 2A and FIG. 2B, global digit line contact structures 196 may be formed in contact with some of the fourth conductive contact structures 192 to provide a conductive path between, for example, the drain regions 180B of the transistor structures 185 and global digit lines 198 in contact with the global digit line contact structures 196. In some embodiments, the global digit line contact structures 196 are configured to provide a conductive path between the transistor structures 185 and a global digit line 198 vertically overlying the transistor structures 185 and the vertical stacks of memory cells 170.

The global digit line contact structures 196 may be formed of and include one or more conductive materials, such as one or more of the materials described above with reference to the first conductive contact structures 148. In some embodiments, the global digit line contact structures 196 comprise tungsten. In other embodiments, the global digit line contact structures 196 comprise copper.

The global digit lines 198 may be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 198 comprise tungsten. In other embodiments, the global digit lines 198 comprise copper.

The global digit line contact structures 196 and the global digit lines 198 may be formed within a ninth insulative material 199. The ninth insulative material 199 may be formed of and include insulative material, such as one or more of the materials described above with reference to the first insulative material 104. In some embodiments, the ninth insulative material 199 comprises silicon dioxide.

With reference to FIG. 2A and FIG. 2B, the global digit lines 198 are individually located within horizontal boundaries (e.g., in the X-direction) of individual isolated portions of the semiconductive material 110. In some embodiments, the global digit lines 198 horizontally extend (e.g., in the Y-direction) between multiple isolated portions of the semiconductive material 110, the portions of the semiconductive material 110 isolated by the second insulative material 116 (FIG. 1W) of the filled isolation trenches 114 (FIG. 1B).

With reference to FIG. 2B, first routing structures 191 may be in contact with and provide a conductive path between some of the fourth conductive contact structures 192, the third conductive contact structures 188, and the conductive plate structure 166. In some embodiments, the first routing structures 191, the fourth conductive contact structures 192, and the third conductive contact structures 188 electrically connect the conductive plate structure 166 to the drain regions 180B of the transistor structures 185 horizontally neighboring (e.g., in the Y-direction) the conductive plate structure 166. In some embodiments, the fourth conductive contact structures 192 in contact with the drain regions 180B horizontally nearest (e.g., in the Y-direction) the conductive plate structures 166 are also in contact with the first routing structures 191. The first routing structure 191 is, in turn, in contact with the third conductive contact structure 188. Accordingly, at least some of the drain regions 180B (e.g., the drain regions 180B horizontally nearest (e.g., in the Y-direction) the conductive plate structure 166) are configured to be in electrical communication with the conductive plate structure 166 by means of the fourth conductive contact structures 192, the first routing structures 191, and the third conductive contact structures 188. The first routing structures 191 are illustrated in broken lines in FIG. 2B to indicate that they may be located in a plane different than that illustrated in FIG. 2B.

With continued reference to FIG. 2B, in some embodiments, second routing structures 193 are formed in contact with the fourth conductive contacts 192 that are in contact with the source regions 180A. The second routing structures 193 are in contact with the second conductive contacts 186 in contact with the conductive material 142 that is, in turn, in contact with the conductive pillar structures 140. Accordingly, the second routing structures 193 are configured to provide a conductive path and electrically connect the source regions 180A to the conductive pillar structures 140. The second routing structures 193 configured to be in electrical communication with the source regions 180A (by means of the fourth conductive contacts 192) and the second routing structures 193 in contact with the second conductive contacts 186 may horizontally extend (e.g., in the X-direction) and may be configured to be in electrical communication with each other in a plane different than the one illustrated in FIG. 2B.

The first routing structures 191 and the second routing structures 193 may individually be formed of and include conductive material, such as one or more of the materials described above with reference to the conductive structures 134. In some embodiments, the first routing structures 191 and the second routing structures 193 individually comprise tungsten. In other embodiments, the first routing structures 191 and the second routing structures 193 individually comprise copper.

Referring to FIG. 2A, the conductive structures 134 horizontally extend (e.g., in the X-direction) and vertically underlying (e.g., in the Z-direction) the semiconductive material 110 including the transistor structures 185. The second conductive contacts 186 vertically overlie (e.g., in the Z-direction) and are in contact with the conductive material 142 that are, in turn, in contact with the conductive pillar structures 140.

With continued reference to FIG. 2A, the conductive structures 134 horizontally terminate (e.g., in the X-direction) at the staircase structures 144. In some embodiments, the staircase structures 144 are horizontally aligned in a first direction (e.g., in the X-direction) and horizontally offset in a second direction (e.g., the Y-direction). In some embodiments, each vertical stack structure 135 of conductive structures 134 individually includes a staircase structure 144 at a first horizontal end (e.g., in the X-direction) thereof and an additional staircase structure 144 at a second, opposite horizontal end (e.g., in the X-direction) thereof.

In other embodiments, the staircase structures 144 of horizontally neighboring (e.g., in the Y-direction) vertical stack structure 135 of conductive structures 134 are located at opposing horizontal ends (e.g., in the X-direction) of the microelectronic device structure 100. In some such embodiments, every vertical stack structure 135 of conductive structures 134 (e.g., in the Y-direction) includes a staircase structure 144 at a first horizontal end (e.g., in the X-direction) of the microelectronic device structure 100 while the other vertical stack structures 135 of conductive structures 134 individually includes a staircase structure 144 at a second horizontal end (e.g., in the X-direction) of the microelectronic device structure 100 opposite the first horizontal end. Stated another way, the staircase structures 144 of horizontally neighboring (e.g., in the Y-direction) conductive structures 134 may alternate between a first horizontal end (e.g., in the X-direction) of the microelectronic device structure 100 and a second horizontal end (e.g., in the X-direction) of the microelectronic device structure 100, the second horizontal end opposing the first horizontal end.

Although FIG. 2A illustrates two staircase structures 144 for every vertical stack structure 135 of conductive structures 134 (e.g., a staircase structure 144 at each horizontal end (e.g., in the X-direction) of each vertical stack structure 135 of conductive structures 134), the disclosure is not so limited. In other embodiments, each vertical stack structure 135 of conductive structures 134 may include one staircase structure 144, and each of the staircase structures 144 may be located at a same horizontal end (e.g., in the X-direction) of the vertical stack structure 135 of conductive structures 134.

The quantity of the steps 145 of the staircase structures 144 may correspond to the quantity of the levels of memory cells (e.g., memory cells 170 (FIG. 2A, FIG. 2B)) of the vertical stacks of the memory cells 170. Although FIG. 2A illustrates that the staircase structures 144 individually comprise a particular number (e.g., four (4)) of steps 145, the disclosure is not so limited. In other embodiments, the staircase structures 144 each individually include a desired quantity of the steps 145, such as within a range from thirty-two (32) of the steps 145 to two hundred fifty-six (256) of the steps 145. In some embodiments, the staircase structures 144 each individually include sixty-four (64) of the steps 145. In other embodiments, the staircase structures 144 each individually include ninety-six (96) or more of the steps 145. In other embodiments, the staircase structures 144 each individually include a different number of the steps 145, such as less than sixty-four (64) of the steps 145 (e.g., less than or equal to sixty (60) of the steps 145, less than or equal to fifty (50) of the steps 145, less than about forty (40) of the steps 145, less than or equal to thirty (30) of the steps 145, less than or equal to twenty (20) of the steps 145, less than or equal to ten (10) of the steps 145); or greater than sixty-four (64) of the steps 145 (e.g., greater than or equal to seventy (70) of the steps 145, greater than or equal to one hundred (100) of the steps 145, greater than or equal to about one hundred twenty-eight (128) of the steps 145, greater than two hundred fifty-six (256) of the steps 145).

In some embodiments, the staircase structures 144 each individually include the same quantity of the steps 145. In some such embodiments, staircase structures 144 of the same vertical stack structure 135 include the same quantity of the steps 145. In some embodiments, each step 145 of each staircase structure 144 may be vertically offset (e.g., in the Z-direction) from a vertically neighboring step 145 of the staircase structure 144 by one level (e.g., one tier) of the vertically alternating conductive structures 134 and the vertically intervening (e.g., in the Z-direction) dielectric material 136 (FIG. 1I) and third insulative material 128 (FIG. 1I). In some such embodiments, every conductive structure 134 of the vertical stack structure 135 may comprise a step 145 at each horizontal end (e.g., in the X-direction) of the staircase structures 144 of the vertical stack structure 135. In other embodiments, vertically neighboring (e.g., in the Z-direction) steps 145 of a staircase structure 144 on a first horizontal size (e.g., in the X-direction) of a vertical stack structure 135 may be vertically offset (e.g., in the Z-direction) by two levels (e.g., two tiers) of the vertically alternating conductive structures 134 and the vertically intervening dielectric material 136 and third insulative material 128. In some such embodiments, the steps 145 of each staircase structure 144 are formed of every other conductive structure 134 of the vertical stack structure 135 and the steps 145 of staircase structures 144 at horizontally opposing ends (e.g., in the X-direction) of the same vertical stack structure 135 may be defined by conductive structures 134 that are vertically spaced (e.g., in the Z-direction) from one another by one level of a conductive structure 134 and the vertically intervening dielectric material 136 and third insulative material 128.

In some embodiments, each of the vertical stack structures 135 of conductive structures 134 intersect horizontally neighboring (e.g., in the X-direction) vertical stacks of memory cells 170, such as the access devices 130 of the vertical stacks of access devices 130 of the vertical stacks of memory cells 170.

With continued reference to FIG. 2A, the first conductive contact structures 148 vertically overlie (e.g., in the Z-direction) and are in contact with the conductive structures 134 at the steps 145 of the staircase structures 144.

Still referring to FIG. 2A, the conductive plate structure 166 may horizontally extend (e.g., in the X-direction) substantially parallel to the conductive structures 134 of the vertical stack structures 135. Third conductive contact structures 188 vertically overlie (e.g., in the Z-direction) and are in contact with the conductive plate structure 166.

In some embodiments, the fourth conductive contact structures 192 horizontally extend (e.g., in the X-direction) over horizontally neighboring (e.g., in the X-direction) semiconductive material 110 including the transistor structures 185. The conductive material 174 may be horizontally between (e.g., in the Y-direction) the fourth conductive contact structures 192. In some embodiments, the conductive material 174 is substantially coextensive (e.g., in the X-direction) with the fourth conductive contact structures 192. The gate contact structures 190 vertically overlie (e.g., in the Z-direction) and are in contact with the conductive material 174.

Dashed box 195 of FIG. 2A illustrates portions of two vertical stacks of memory cells 170. FIG. 2A illustrates only the two vertical stacks of memory cells 170 illustrated in dashed box 195 for clarity and ease of understanding the description. It will be understood that in some embodiments, the semiconductive materials 110 illustrated in FIG. 2A each individually comprise a portion of a different vertical stack of memory cells 170 and vertically overlie (e.g., in the Z-direction) vertical stacks of access devices 130 and vertical stacks of storage devices 165 of vertical stacks of memory cells 170. The vertical stacks of storage devices 165 horizontally extend (e.g., in the Y-direction) from the conductive plate structure 166 and the vertical stacks of access devices 130 horizontally extend between (e.g., in the Y-direction) the vertical stacks of storage devices 165 and the conductive pillar structures 140. In other words, each of the storage devices 165 is individually in contact with and extends from the conductive plate structure 166.

The spacers 122 may horizontally extend (e.g., in the X-direction) on sidewalls of the conductive pillar structures 140 and sidewalls of the second insulative material 116 (FIG. 1W) and between multiple conductive pillar structures 140; and the additional spacers 123 may horizontally extend (e.g., in the X-direction) along sidewalls of each of the conductive plate structures 166. With reference to FIG. 2B, the spacers 122 horizontally intervene (e.g., in the Y-direction) between the semiconductive material 110 and the transistor structures 185 and each of the conductive pillar structures 140. The additional spacers 123 horizontally intervene (e.g., in the Y-direction) between the semiconductive material 110 and the transistor structures 185 and each of the conductive plate structures 166.

In some embodiments, the additional spacers 123 horizontally neighboring (e.g., in the Y-direction) the conductive plate structure 166 horizontally extend (e.g., in the X-direction) substantially parallel to the conductive plate structure 166. The additional spacers 123 horizontally neighboring the conductive plate structures 166 may be substantially parallel to the spacers 122 horizontally neighboring the conductive pillar structures 140. In some embodiments, the spacers 122 horizontally extend (e.g., in the X-direction) between multiple conductive pillar structures 140 of multiple vertical stacks of access devices 130 of multiple vertical stacks of memory cells 170. In some embodiments, the additional spacers 123 horizontally extend (e.g., in the X-direction) along the conductive plate structure 166 and between multiple vertical stacks of storage devices 165 of multiple vertical stacks of memory cells 170.

The spacers 122 and the additional spacers 123 may be formulated and configured to substantially protect the semiconductive material 110 that forms the transistor structures 185 during processing of the microelectronic device structure 100. By way of non-limiting example, the spacers 122 and the additional spacers 123 may substantially protect the semiconductive material 110 during removal of the second material 108 (FIG. 1F), during formation of the conductive pillar structures 140 (FIG. 1H), during removal of the first material 106 (FIG. 1K) through the trenches 158 (FIG. 1K), and during formation of the storage devices 165 (FIG. 1N).

With reference to FIG. 2A, in some embodiments, the microelectronic device structure 100 includes more vertical stacks of memory cells 170 than those illustrated. By way of non-limiting example, the additional vertical stacks of access devices 130 may be in communication with the horizontally lowermost (e.g., in the Y-direction in the view of FIG. 2A) conductive pillar structure 140. The additional vertical stacks of access devices 130 are in contact with additional vertical stacks of storage devices 165 that are, in turn, in contact with an additional conductive plate structure 166. Accordingly, the structure illustrated in FIG. 2A may be repeated such that the microelectronic device structure 100 includes more vertical stacks of memory cells 170 than those illustrated.

Figure 2C:
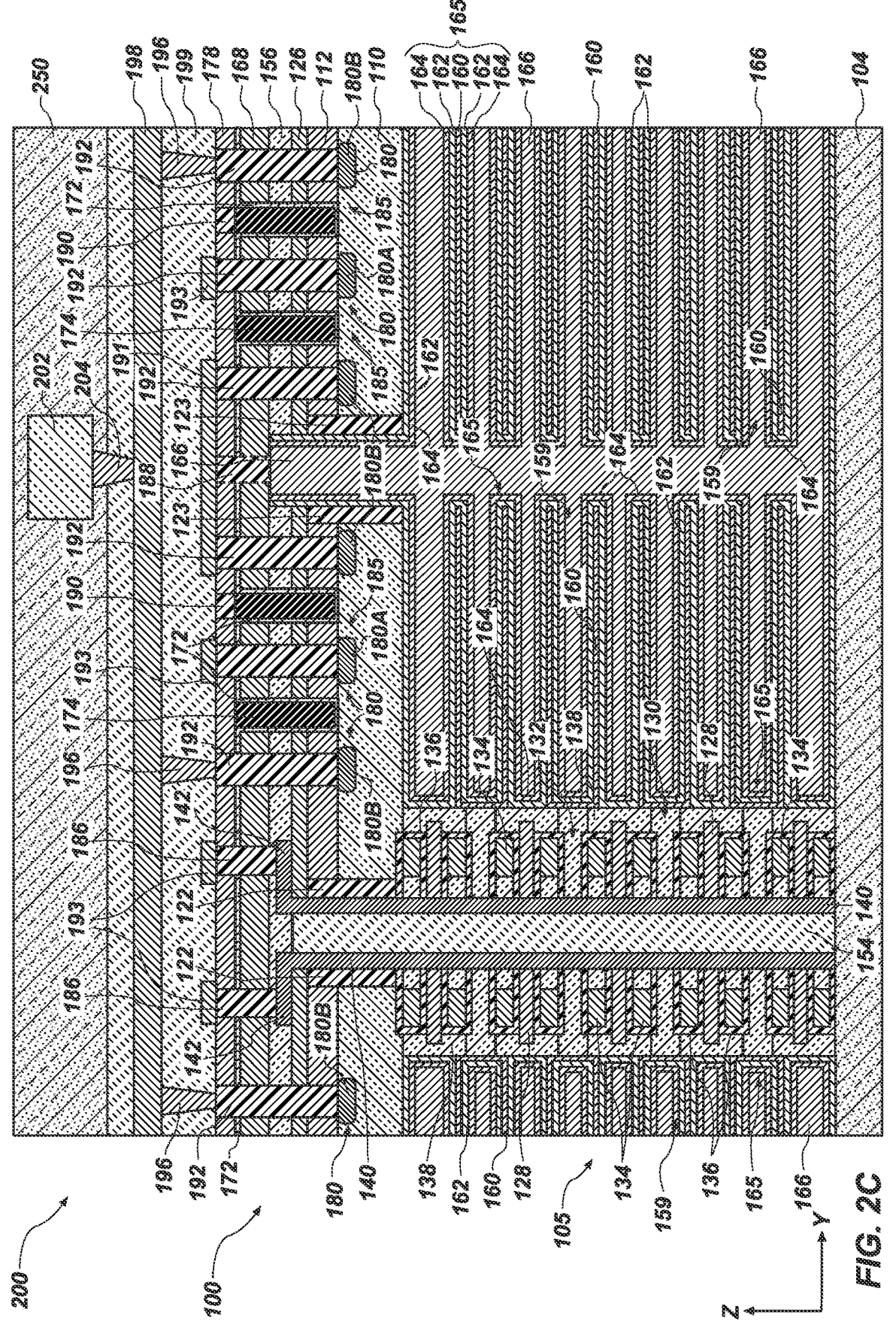
FIG. 2C and FIG. 2D are simplified partial cross-sectional views of a microelectronic device formed from the microelectronic device structure of FIG. 2A and FIG. 2B and a second microelectronic device structure, in accordance with embodiments of the disclosure.
Figure 2D:
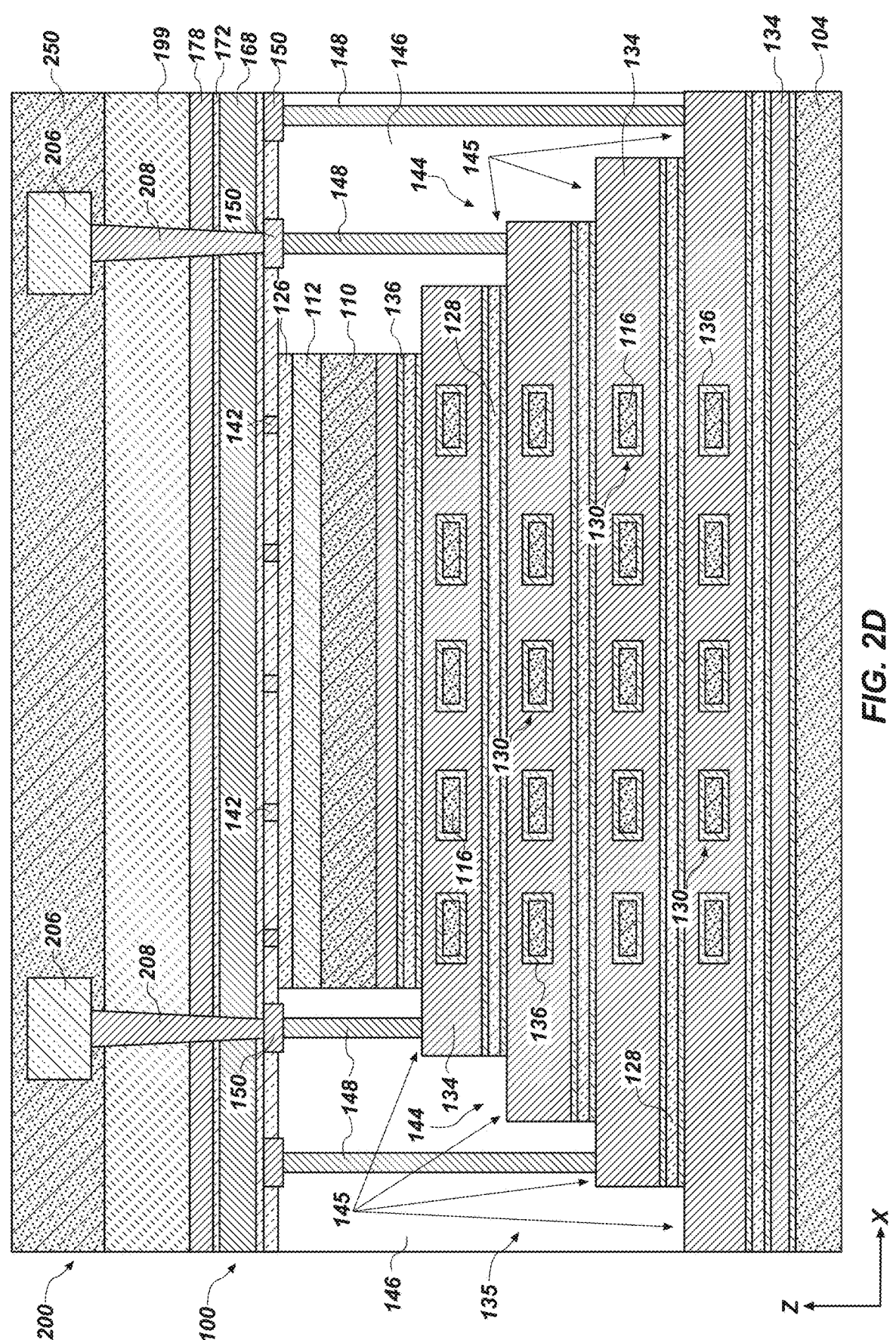

FIG. 2C and FIG. 2D are simplified partial cross-sectional views illustrating a microelectronic device 200 formed from the microelectronic device structure 100 and an additional microelectronic device structure 250 after attaching the additional microelectronic device structure 250 to the microelectronic device structure 100. FIG. 2C is a simplified cross-sectional view of the microelectronic device 200 and illustrates the same cross-sectional view of the microelectronic device structure 100 illustrated in FIG. 2B but at a processing stage subsequent to that illustrated in FIG. 2B. FIG. 2D is a simplified cross-sectional view of the microelectronic device 200 and illustrates the same cross-sectional view of the microelectronic device structure 100 illustrated in FIG. 1I but at a processing stage subsequent to that illustrated in FIG. 1I.

By way of non-limiting example, the additional microelectronic device structure 250 may be attached to the microelectronic device structure 100 by oxide-to-oxide bonding. In some such embodiments, an oxide material of the additional microelectronic device structure 250 is brought into contact with an oxide material of the microelectronic device structure 100 and the microelectronic device structure 100 and the additional microelectronic device structure 250 are exposed to annealing conditions to form bonds (e.g., oxide-to-oxide bonds) between the oxide material of the microelectronic device structure 100 and the oxide material of the additional microelectronic device structure 250.

The additional microelectronic device structure 250 may include control logic devices (e.g., CMOS devices) and circuitry configured for effectuating control operations for the memory cells 170. By way of non-limiting example, the additional microelectronic device structure 250 may include one or more sub word line driver regions, one or more socket regions, and one or more additional CMOS regions including one or more of (e.g., all of) one or more sense amplifier devices (e.g., equalization (EQ) amplifiers, isolation (ISO) amplifiers, NMOS sense amplifiers (NSAs), PMOS sense amplifiers (PSAs)), column decoders, multiplexer control logic devices, sense amplifier drivers, main word line driver devices, row decoder devices, and row select devices.

With reference to FIG. 2C, the additional microelectronic device structure 250 may include one or more sense amplifier device regions 202 vertically overlying (e.g., in the Z-direction) and within horizontal boundaries of the vertical stacks of memory cells 170. The sense amplifier device regions 202 may include transistor structures configured to be in electrical communication with the global digit lines 198 by means of contact with first conductive interconnect structures 204. In some embodiments, the sense amplifier device regions 202 include sense amplifier devices (e.g., equalization (EQ) amplifiers, isolation (ISO) amplifiers, NMOS sense amplifiers (NSAs), PMOS sense amplifiers (PSAs)).

With reference to FIG. 2D, the additional microelectronic device structure 250 may include one or more sub word line driver regions 206 vertically overlying (e.g., in the Z-direction) and within horizontal boundaries of the staircase structures 144, such as vertically overlying the first conductive contact structures 148 and the pad structures 150. The sub word line driver regions 206 may include transistor structures configured to be in electrical communication with the conductive structures 134 by means of contact with the second conductive interconnect structures 208 that are in contact with the pad structures 150.

Each of the first conductive interconnect structures 204 and the second conductive interconnect structures 208 are individually formed of and include conductive material, such as one or more of the conductive materials described above with reference to the first conductive contact structures 148. In some embodiments, the first conductive interconnect structures 204 and the second conductive interconnect structures 208 individually comprise tungsten. In other embodiments, the first conductive interconnect structures 204 and the second conductive interconnect structures 208 individually comprise copper.

Although the dielectric materials 172 (the gate dielectric materials) and the conductive materials 174 (e.g., the gate electrodes) have been described and illustrated as being formed to have a discontinuous structure in FIG. 1Q through FIG. 2B, the disclosure is not so limited. In other embodiments, the dielectric material and the conductive material 174 may be formed as continuous lines horizontally extending (e.g., in the X-direction) along the array across multiple vertical stacks of memory cells 170 and substantially parallel to and coextensive with the conductive plate structure 166.

Figure 3A:
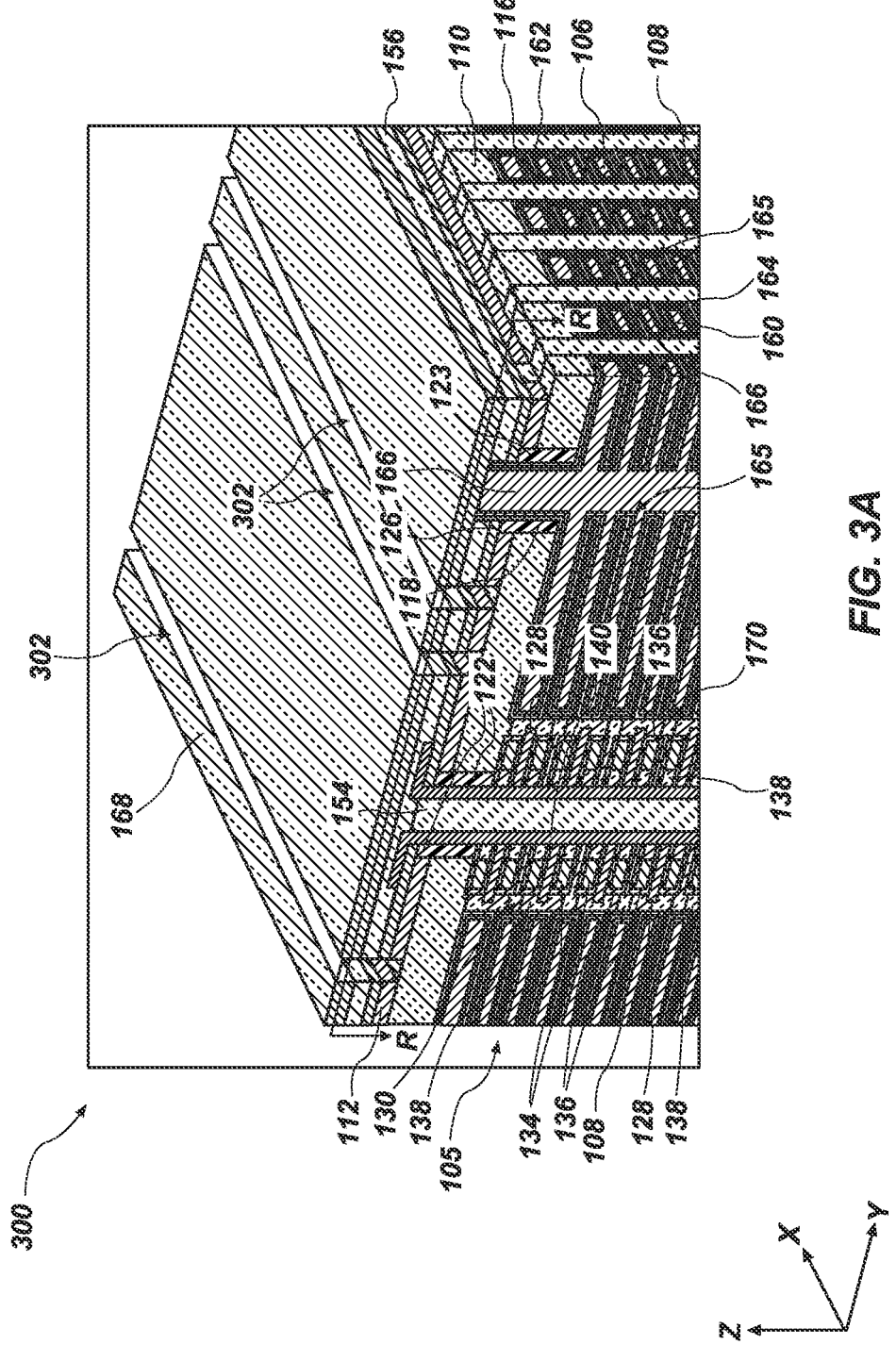
FIG. 3A through FIG. 3G are simplified partial perspective views (FIG. 3A through FIG. 3D), simplified partial cross-sectional views (FIG. 3E, FIG. 3F), and a simplified partial top-down view (FIG. 3G) illustrating a method of forming a microelectronic device structure, in accordance with embodiments of the disclosure.

For example, with reference to FIG. 3A, in some embodiments, a microelectronic device structure 300 includes trenches 302 extending substantially continuously in a horizontal direction (e.g., in the X-direction). The microelectronic device structure 300 may be substantially similar to the microelectronic device structure 100 of FIG. 1Q, except the trenches 302 extend substantially continuously (rather than the discontinuous (e.g., segmented) trenches 169 (FIG. 1Q)). The trenches 302 may be substantially parallel to, and coextensive with, the conductive plate structures 166. A cross-sectional view of the microelectronic device structure 300 taken through section line R-R may be substantially similar to that illustrated in FIG. 1R.

Figure 3B:
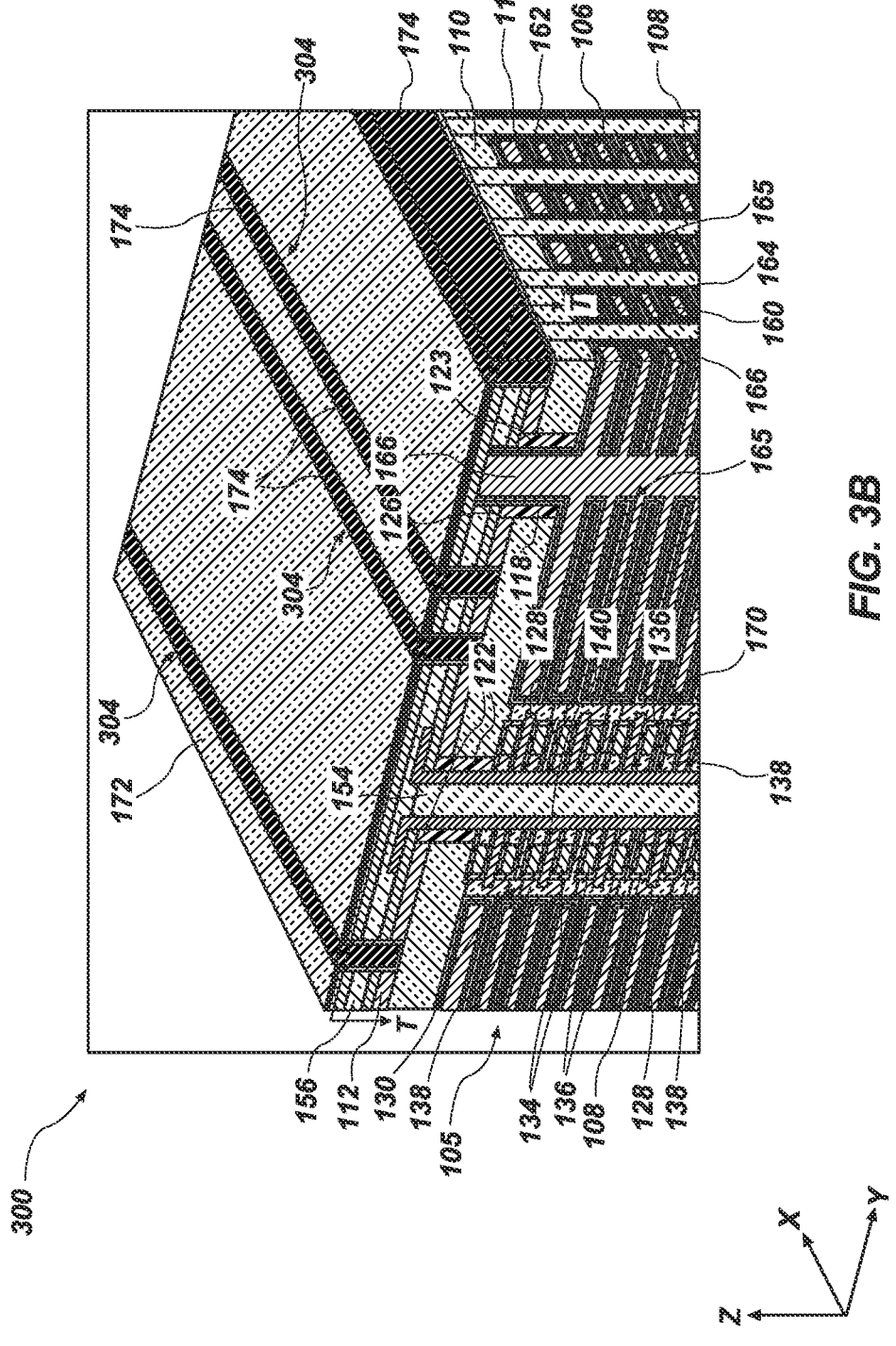

With reference to FIG. 3B, the trenches 302 (FIG. 3A) may be filled with the dielectric material 172 and the conductive material 174, as described above with reference to the trenches 169 (FIG. 1Q, FIG. 1R) and the dielectric material 172 and the conductive material 174 (FIG. 1S, FIG. 1T). Filling the trenches 302 (FIG. 3A) with the dielectric material 172 and the conductive material 174 forms continuous gate structures 304 extending in the horizontal direction (e.g., in the X-direction) substantially parallel to, and coextensive with, the conductive plate structures 166. A cross-section of the microelectronic device structure 100 taken through section line T-T is substantially similar to that illustrated in FIG. 1T.

Figure 3C:
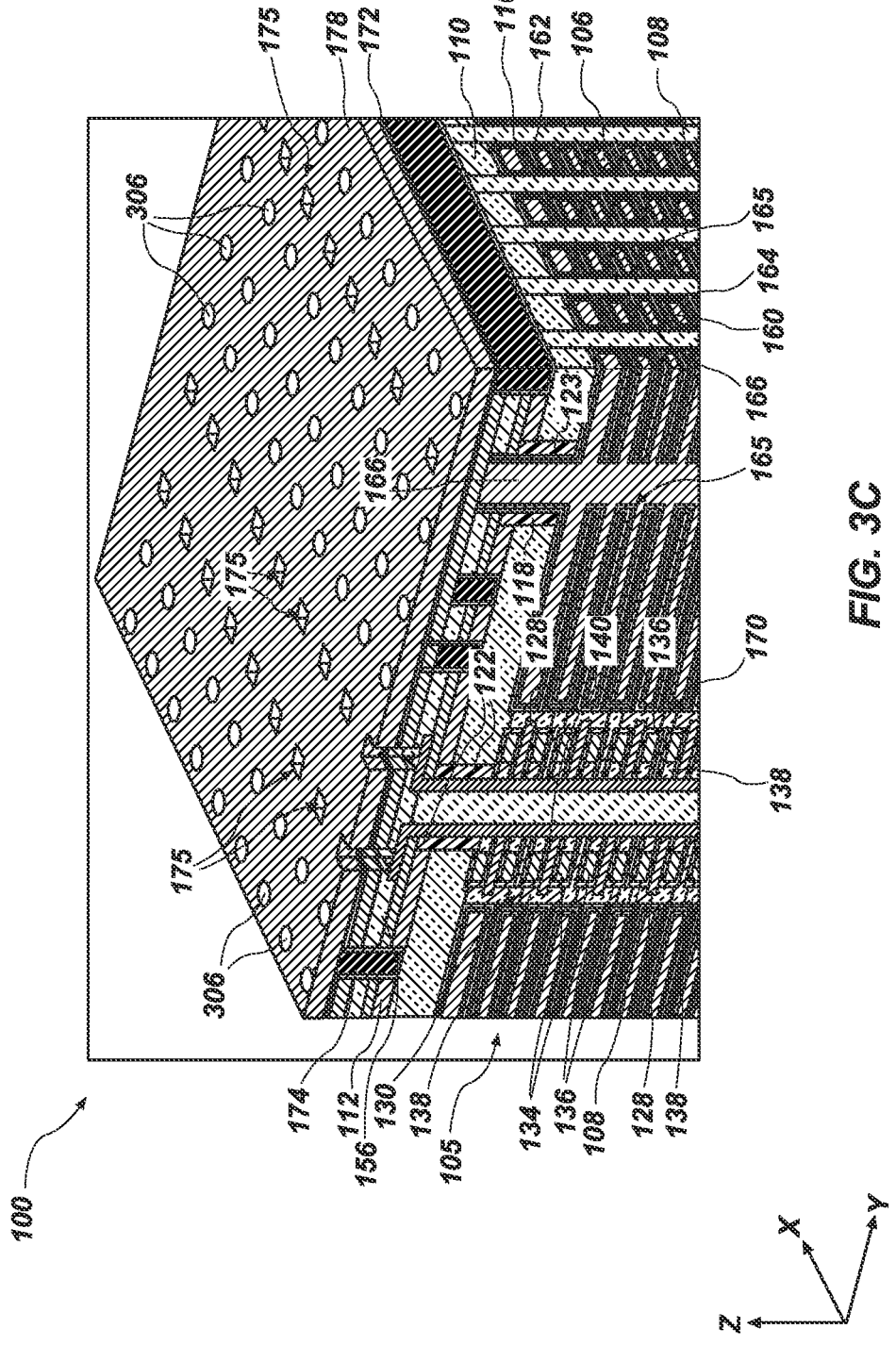

Referring to FIG. 3C, after filling the trenches 302 (FIG. 3A) with the dielectric material 172 and the conductive material 174 to form the continuous gate structures 304 (FIG. 3B), the eighth insulative material 178 may be formed vertically over (e.g., in the Z-direction) the microelectronic device structure 300, as described above with reference to FIG. 1U and the microelectronic device structure 100.

Contact openings 306 may be formed through the eighth insulative material 178, the dielectric material 172, the seventh insulative material 168, the third mask material 156, the second mask material 126, and the first mask material 112 to expose portions of the semiconductive material 110 horizontally neighboring (e.g., in the Y-direction) the conductive material 174 and the dielectric material 172 of the continuous gate structures 304, as described above with reference to FIG. 1U and FIG. 1V and formation of the trenches 177.

Figure 3D:
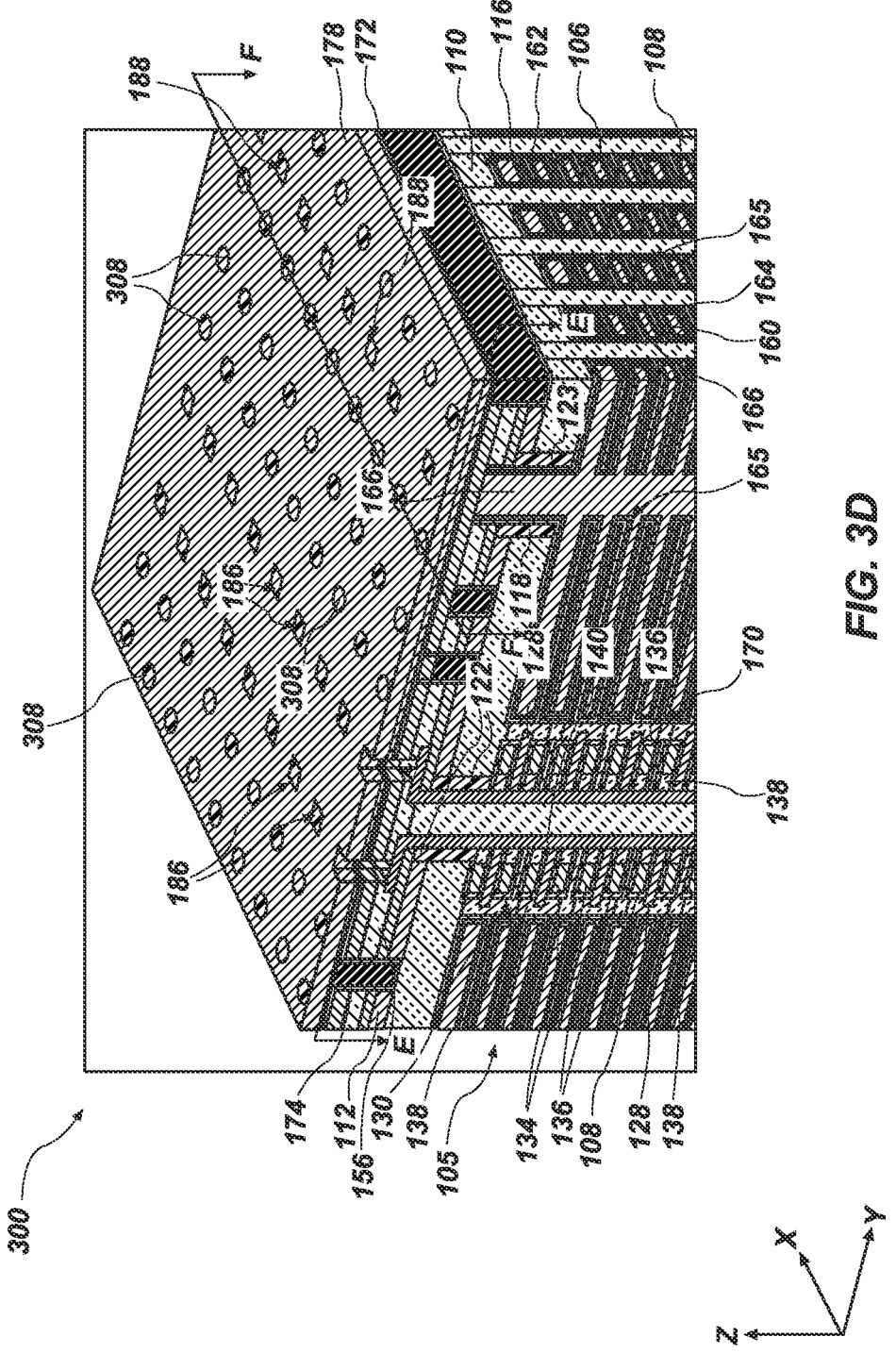
Figure 3E:
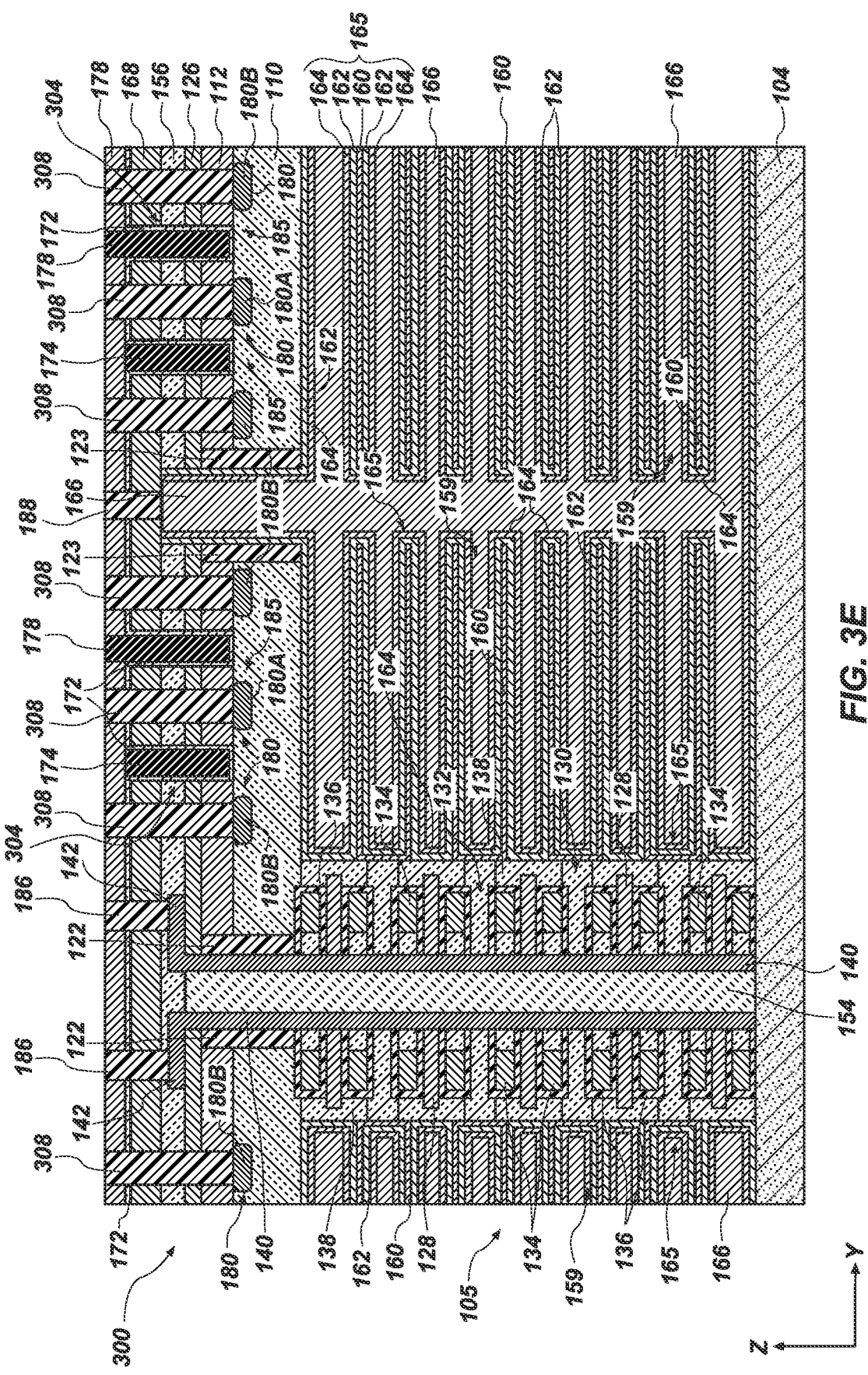
Figure 3F:
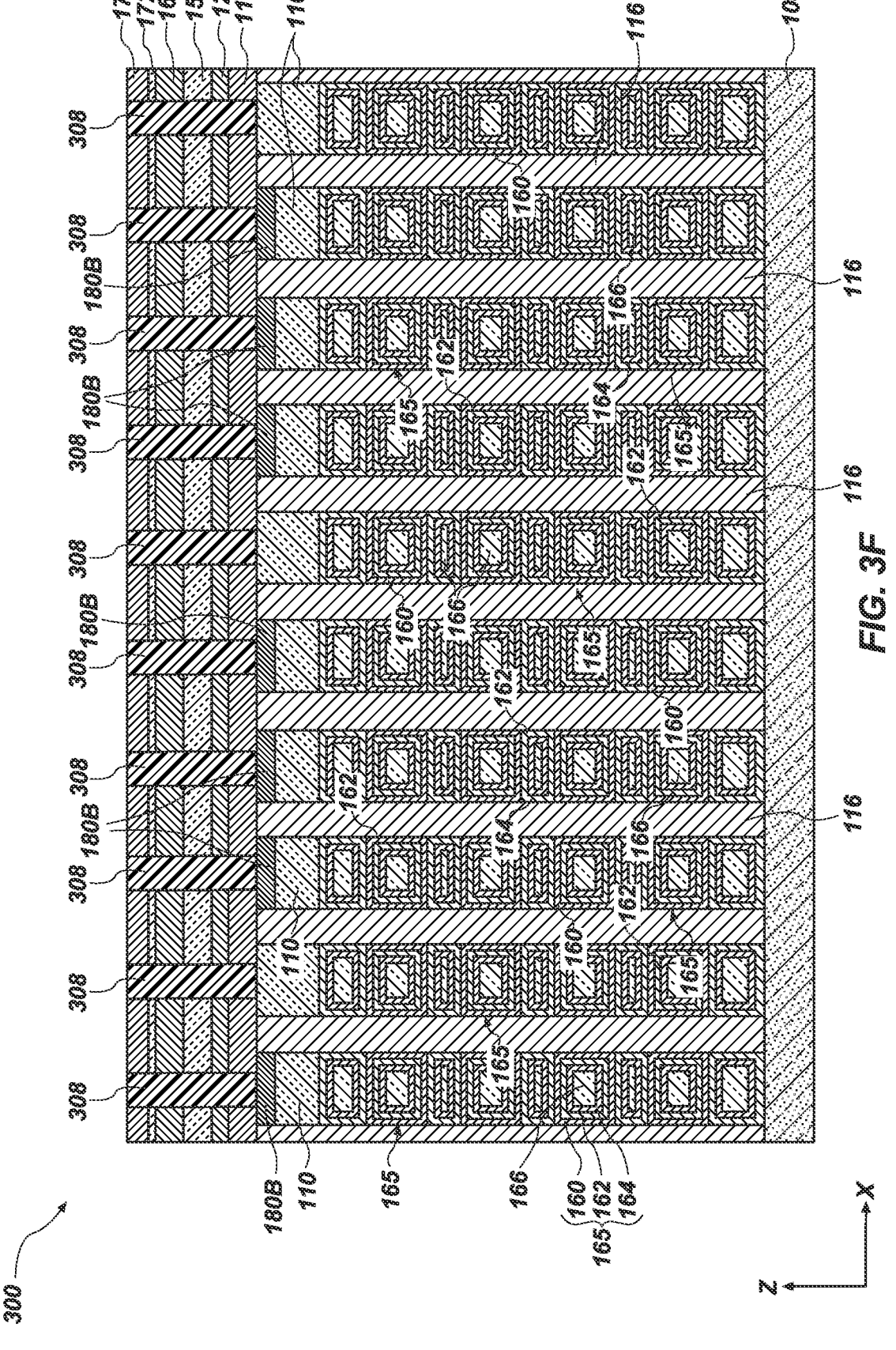

FIG. 3D through FIG. 3F illustrated the microelectronic device structure 300 at a processing stage subsequent to that illustrated in FIG. 3C. FIG. 3D is a simplified partial perspective view of the microelectronic device structure 300; FIG. 3E is a simplified partial cross-sectional view of the microelectronic device structure 300 taken through section line E-E of FIG. 3D; and FIG. 3F is a simplified partial cross-sectional view of the microelectronic device structure 300 taken through section line F-F of FIG. 3D.

With reference to FIG. 3D, the contact openings 306 (FIG. 3C) may be filled with a conductive material to form fifth conductive contacts 308. With reference to FIG. 3E and FIG. 3F, each of the fifth conductive contacts 308 may individually be in contact with one of the source regions 180A or one of the drain regions 180B. The fifth conductive contacts 308 may be formed of and include conductive material, such as one or more of the materials described above such as one or more of the materials described above with reference to the first conductive contact structures 148. In some embodiments, each of the fifth conductive contacts 308 individually comprises tungsten. In other embodiments, each of the fifth conductive contacts 308 individually comprises copper.

After forming the fifth conductive contacts 308, the microelectronic device structure 300 may be further processed, as described above with reference to the microelectronic device structure 100 after formation of the fourth conductive contacts 192 (FIG. 1W, FIG. 1X). For example, after forming the fifth conductive contacts 308, the global digit line contact structures 196 (FIG. 2B) may be formed in contact with some of the fifth conductive contacts 308 to provide a conductive path between the transistor structures 185 and a respective global digit line 198. The microelectronic device structure 300 may be attached to an additional microelectronic device structure (e.g., the additional microelectronic device structure 250), as described above with reference to FIG. 2B through FIG. 2D.

Figure 3G:
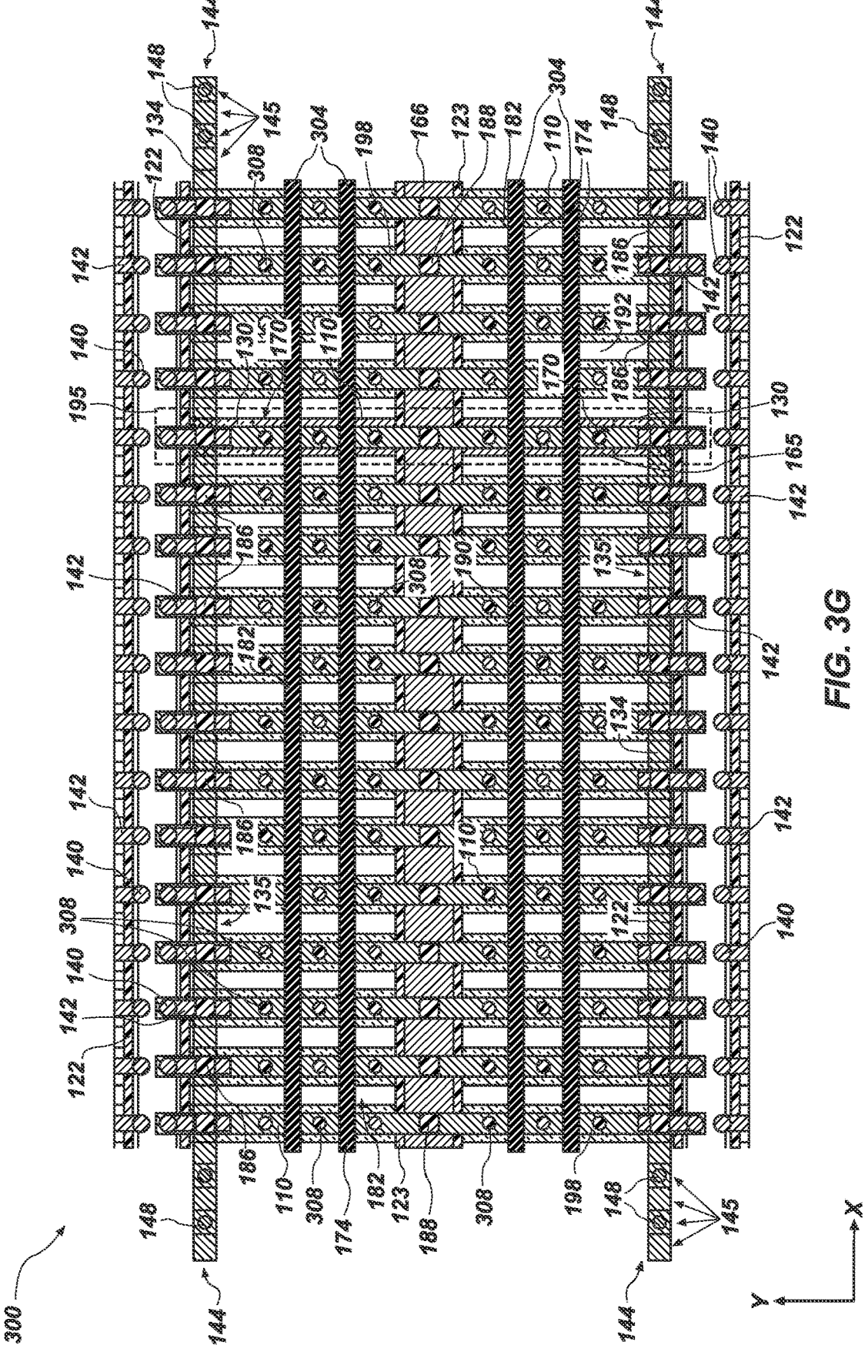

FIG. 3G is a simplified partial top-down view of the microelectronic device structure 300 illustrating portions of the microelectronic device structure 300. With collective reference to FIG. 3D through FIG. 3G, in some embodiments, two of the continuous gate structures 304 vertically overlie each of the vertical stacks of memory cells 170 and three of the fifth conductive contacts 308 overlie each individual vertical stack of memory cells 170 (e.g., two fifth conductive contacts 308 in contact with a drain region 180B and one fifth conductive contact 308 in contact with a source region 180A).

With continued reference to FIG. 3G, in some embodiments, each of the fifth conductive contacts 308 are individually horizontally aligned (e.g., in the X-direction) with horizontally neighboring (e.g., in the Y-direction) fifth conductive contacts 308 and horizontally neighboring (e.g., in the Y-direction) third conductive contact structures 188, second conductive contact structures 186, and conductive pillar structures 140.

Thus, in accordance with some embodiments, a microelectronic device comprises vertical stacks of memory cells, each of the vertical stacks of memory cells comprising a vertical stack of access devices, a vertical stack of capacitors horizontally neighboring the vertical stack of access devices, and a conductive pillar structure in contact with the vertical stack of access devices. The microelectronic device further comprises transistor structures vertically overlying the vertical stacks of memory cells and comprising semiconductive material, and a protective liner material horizontally intervening between the semiconductive material and the conductive pillar structure of each of the vertical stacks of memory cells.

Furthermore, in accordance with additional embodiments of the disclosure, a microelectronic device comprises vertical stacks of dynamic random access memory (DRAM) cells, each of the DRAM cells comprising a storage device horizontally neighboring an access device, at least one multiplexer vertically overlying at least one of the vertical stacks of DRAM cells, a conductive plate structure in contact with the storage devices of the at least one of the vertical stacks of DRAM cells and horizontally extending between two or more of the vertical stacks of DRAM cells, and a protective liner material horizontally intervening between the conductive plate structure and the at least one multiplexer.

Moreover, in accordance with some embodiments of the disclosure, a method of forming a microelectronic device comprises forming a protective dielectric material in trenches within a semiconductive material, forming additional trenches through the protective dielectric material within some of the trenches and portions of a stack structure vertically underlying the semiconductive material and comprising a vertically alternating sequence of first materials and second materials, portions of the protective dielectric material remaining on sidewalls of the semiconductive material defining the some of the trenches to form a protective liner material on the sidewalls of the semiconductive material, forming vertical stacks of access devices within the additional trenches, forming further trenches through the protective dielectric material within some other of the trenches and additional portions of the stack structure underlying the semiconductive material, additional portions of the protective dielectric material remaining on additional sidewalls of the semiconductive material defining the some other of the trenches to form an additional protective liner material on the additional sidewalls of the semiconductive material, and forming vertical stacks of storage devices within the further trenches and in contact with the vertical stacks of access devices.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
vertical stacks of memory cells, each of the vertical stacks of memory cells comprising:
a vertical stack of access devices;
a vertical stack of capacitors horizontally neighboring the vertical stack of access devices;
a conductive pillar structure in contact with the vertical stack of access devices; and
a conductive plate structure in contact with the vertical stack of capacitors;
transistor structures vertically overlying the vertical stacks of memory cells and comprising semiconductive material, the transistor structures partially horizontally intervening between the conductive pillar structure and the conductive plate structure; and
a protective liner material horizontally intervening between the semiconductive material and the conductive pillar structure of each of the vertical stacks of memory cells.

2. The microelectronic device of claim 1, wherein the protective liner material comprises one or more of zirconium oxide, hafnium oxide, and aluminum oxide.

3. The microelectronic device of claim 1, wherein the protective liner material horizontally extends between more than one of the vertical stacks of memory cells and contacts conductive pillar structure of each of the more than one of the vertical stacks of memory cells.

4. The microelectronic device of claim 1, wherein the conductive plate structure horizontally intervenes between pairs of the transistor structures horizontally neighboring one another.

5. The microelectronic device of claim 1, further comprising an additional protective liner material horizontally intervening between the semiconductive material and the conductive plate structure.

6. The microelectronic device of claim 5, wherein the additional protective liner material is coextensive with the conductive plate structure.

7. The microelectronic device of claim 5, wherein the additional protective liner material comprises substantially the same material composition as the protective liner material.

8. The microelectronic device of claim 1, wherein the protective liner material vertically overlies the vertical stack of access devices.

9. The microelectronic device of claim 1, further comprising global digit lines vertically overlying the transistor structures.

10. The microelectronic device of claim 1, wherein a first transistor structure shares a source region with a second transistor structure horizontally neighboring the first transistor structure.

11. The microelectronic device of claim 10, wherein at least some of the transistor structures comprise multiplexer transistors and further at least some of the transistor structures comprise bleeder transistors.

12. A microelectronic device, comprising:

vertical stacks of dynamic random access memory (DRAM) cells, each of the DRAM cells comprising a capacitor horizontally neighboring an access device;

a conductive pillar structure in contact with the access device of respective ones of the DRAM cells of a respective one of the vertical stacks of DRAM cells;

a conductive plate structure in direct contact with the capacitor of the respective ones of the DRAM cells of the respective one of the vertical stacks of DRAM cells and horizontally extending between two or more of the vertical stacks of DRAM cells;

transistor structures vertically overlying the vertical stacks of DRAM cells and comprising semiconductive material, the transistor structures partially horizontally intervening between the conductive pillar structure and the conductive plate structure; and protective liner material horizontally intervening between the semiconductor material and each of the conductive pillar structure and the conductive plate structure.

13. The microelectronic device of claim 12, wherein at least one of the transistor structures shares a source region with at least one other of the transistor structures.

14. The microelectronic device of claim 12, wherein the protective liner material comprises one or more of zirconium oxide, hafnium oxide, and aluminum oxide.

15. The microelectronic device of claim 12, wherein the protective liner material comprises:

a first portion on a first horizontal side of the conductive plate structure; and a second portion on a second horizontal side of the conductive plate structure opposite the first portion.

* * * * *